United States Patent
Bondokov et al.

(10) Patent No.: US 9,771,666 B2
(45) Date of Patent: *Sep. 26, 2017

(54) DEFECT REDUCTION IN SEEDED ALUMINUM NITRIDE CRYSTAL GROWTH

(71) Applicant: Crystal IS, Inc., Green Island, NY (US)

(72) Inventors: Robert T. Bondokov, Watervliet, NY (US); Leo J. Schowalter, Latham, NY (US); Kenneth Morgan, Castleton, NY (US); Glen A. Slack, Scotia, NY (US); Shailaja P. Rao, Albany, NY (US); Shawn Robert Gibb, Clifton Park, NY (US)

(73) Assignee: CRYSTAL IS, INC., Green Island, NY (US)

( * ) Notice: Subject to any disclaimer, the term of this patent is extended or adjusted under 35 U.S.C. 154(b) by 281 days.

This patent is subject to a terminal disclaimer.

(21) Appl. No.: 14/684,754

(22) Filed: Apr. 13, 2015

(65) Prior Publication Data
US 2015/0275393 A1    Oct. 1, 2015

Related U.S. Application Data

(63) Continuation-in-part of application No. 14/458,825, filed on Aug. 13, 2014, now Pat. No. 9,670,591,
(Continued)

(51) Int. Cl.
| C30B 23/00 | (2006.01) |
| C30B 23/02 | (2006.01) |
| C30B 29/40 | (2006.01) |

(52) U.S. Cl.
CPC ............ *C30B 23/025* (2013.01); *C30B 23/00* (2013.01); *C30B 29/403* (2013.01); *Y10T 428/2982* (2015.01)

(58) Field of Classification Search
USPC ...................................................... 117/80–83
See application file for complete search history.

(56) References Cited

U.S. PATENT DOCUMENTS

| 3,531,245 A | 9/1970 | Dietz |
| 3,600,701 A | 8/1971 | Gouldthorpe |
(Continued)

FOREIGN PATENT DOCUMENTS

| CN | 2492947 Y | 5/2002 |
| CN | 201274297 Y | 7/2009 |
(Continued)

OTHER PUBLICATIONS

PCT International Patent Application No. PCT/US2008/000597, International Search Report and Written Opinion mailed May 20, 2008, 9 pages.
(Continued)

*Primary Examiner* — Robert M Kunemund
(74) *Attorney, Agent, or Firm* — Morgan, Lewis & Bockius LLP

(57) ABSTRACT

Bulk single crystal of aluminum nitride (AlN) having an areal planar defect density ≤100 cm$^{-2}$. Methods for growing single crystal aluminum nitride include melting an aluminum foil to uniformly wet a foundation with a layer of aluminum, the foundation forming a portion of an AlN seed holder, for an AlN seed to be used for the AlN growth. The holder may consist essentially of a substantially impervious backing plate.

40 Claims, 14 Drawing Sheets

Related U.S. Application Data which is a continuation of application No. 13/669,630, filed on Nov. 6, 2012, now Pat. No. 8,834,630, which is a continuation of application No. 12/015,957, filed on Jan. 17, 2008, now Pat. No. 8,323,406, application No. 14/684,754, which is a continuation-in-part of application No. 13/173,213, filed on Jun. 30, 2011, now Pat. No. 9,028,612.

(60) Provisional application No. 60/880,869, filed on Jan. 17, 2007, provisional application No. 61/360,142, filed on Jun. 30, 2010.

(56) References Cited

U.S. PATENT DOCUMENTS

| | | | |
|---|---|---|---|
| 3,603,414 | A | 9/1971 | Stebley |
| 3,607,014 | A | 9/1971 | Huml et al. |
| 3,634,149 | A | 1/1972 | Knippenberg et al. |
| 3,768,983 | A | 10/1973 | Elkins et al. |
| 3,903,357 | A | 9/1975 | Woolfson et al. |
| 3,933,573 | A | 1/1976 | Dugger |
| 4,008,851 | A | 2/1977 | Hirsch |
| 4,088,515 | A | 5/1978 | Blakeslee et al. |
| 4,234,554 | A | 11/1980 | Rabenau et al. |
| 4,547,471 | A | 10/1985 | Huseby et al. |
| 5,057,287 | A | 10/1991 | Swiggard |
| 5,070,393 | A | 12/1991 | Nakagawa et al. |
| 5,087,949 | A | 2/1992 | Haitz |
| 5,292,487 | A | 3/1994 | Tatsumi et al. |
| 5,312,698 | A | 5/1994 | Sato et al. |
| 5,494,861 | A | 2/1996 | Yamaga et al. |
| 5,520,785 | A | 5/1996 | Evans et al. |
| 5,525,320 | A | 6/1996 | Pratsinis et al. |
| 5,571,603 | A | 11/1996 | Utumi et al. |
| 5,670,798 | A | 9/1997 | Schetzina |
| 5,679,965 | A | 10/1997 | Schetzina |
| 5,703,397 | A | 12/1997 | Endo et al. |
| 5,728,635 | A | 3/1998 | Kobayashi et al. |
| 5,858,085 | A | 1/1999 | Arai et al. |
| 5,858,086 | A | 1/1999 | Hunter |
| 5,868,837 | A | 2/1999 | DiSalvo et al. |
| 5,909,036 | A | 6/1999 | Tanaka et al. |
| 5,924,874 | A | 7/1999 | Gotoh et al. |
| 5,954,874 | A | 9/1999 | Hunter |
| 5,972,109 | A | 10/1999 | Hunter |
| 5,981,980 | A | 11/1999 | Miyajima et al. |
| 6,000,174 | A | 12/1999 | Yamazaki |
| 6,001,748 | A | 12/1999 | Tanaka et al. |
| 6,006,620 | A | 12/1999 | Lawrie et al. |
| 6,045,612 | A | 4/2000 | Hunter |
| 6,048,813 | A | 4/2000 | Hunter |
| 6,063,185 | A | 5/2000 | Hunter |
| 6,066,205 | A | 5/2000 | Hunter |
| 6,086,672 | A | 7/2000 | Hunter |
| 6,091,085 | A | 7/2000 | Lester |
| 6,187,089 | B1 | 2/2001 | Phillips et al. |
| 6,211,089 | B1 | 4/2001 | Kim et al. |
| 6,270,569 | B1 | 8/2001 | Shibata et al. |
| 6,296,956 | B1 | 10/2001 | Hunter |
| 6,398,867 | B1 | 6/2002 | D'Evelyn et al. |
| 6,404,125 | B1 | 6/2002 | Garbuzov et al. |
| 6,447,604 | B1 | 9/2002 | Flynn et al. |
| 6,468,347 | B1 | 10/2002 | Motoki et al. |
| 6,515,308 | B1 | 2/2003 | Kneissl et al. |
| 6,533,874 | B1 | 3/2003 | Vaudo et al. |
| 6,548,405 | B2 | 4/2003 | Kraus et al. |
| 6,592,663 | B1 | 7/2003 | Sarayama et al. |
| 6,596,079 | B1 | 7/2003 | Vaudo et al. |
| 6,719,843 | B2 | 4/2004 | Schowalter et al. |
| 6,770,135 | B2 | 8/2004 | Schowalter et al. |
| 6,777,717 | B1 | 8/2004 | Karlicek |
| 6,791,119 | B2 | 9/2004 | Slater, Jr. et al. |
| 6,800,876 | B2 | 10/2004 | Edmond et al. |
| 6,831,302 | B2 | 12/2004 | Erchak et al. |
| 6,840,431 | B1 | 1/2005 | Kim |
| 6,861,729 | B2 | 3/2005 | Kozaki et al. |
| 6,891,268 | B2 | 5/2005 | Tomiya et al. |
| 6,921,929 | B2 | 7/2005 | LeBoeuf et al. |
| 6,936,357 | B2 | 8/2005 | Melnik et al. |
| 6,940,075 | B2 | 9/2005 | Schulz |
| 6,995,402 | B2 | 2/2006 | Ludowise et al. |
| 7,026,659 | B2 | 4/2006 | Slater, Jr. et al. |
| 7,037,738 | B2 | 5/2006 | Sugiyama et al. |
| 7,037,838 | B2 | 5/2006 | Schowalter et al. |
| 7,056,383 | B2 | 6/2006 | Helava et al. |
| 7,063,741 | B2 | 6/2006 | D'Evelyn et al. |
| 7,087,112 | B1 | 8/2006 | Rojo et al. |
| 7,095,054 | B2 | 8/2006 | Fjelstad |
| 7,125,734 | B2 | 10/2006 | Sackrison et al. |
| 7,186,580 | B2 | 3/2007 | Tran et al. |
| 7,211,146 | B2 | 5/2007 | Schowalter et al. |
| 7,211,831 | B2 | 5/2007 | Erchak et al. |
| 7,244,520 | B2 | 7/2007 | Kumakura et al. |
| 7,250,637 | B2 | 7/2007 | Shimizu et al. |
| 7,274,043 | B2 | 9/2007 | Erchak et al. |
| 7,276,779 | B2 | 10/2007 | Shibata |
| 7,288,152 | B2 | 10/2007 | Kitaoka et al. |
| 7,420,218 | B2 | 9/2008 | Nagai |
| 7,420,222 | B2 | 9/2008 | Slater, Jr. et al. |
| 7,439,552 | B2 | 10/2008 | Takigawa et al. |
| 7,476,910 | B2 | 1/2009 | Fujimoto et al. |
| 7,518,158 | B2 | 4/2009 | Keller et al. |
| 7,524,376 | B2 | 4/2009 | Wang |
| 7,554,128 | B2 | 6/2009 | Okamoto et al. |
| 7,631,986 | B2 | 12/2009 | Harrah |
| 7,638,346 | B2 | 12/2009 | Schowalter et al. |
| 7,641,735 | B2 | 1/2010 | Slack et al. |
| 7,674,699 | B2 | 3/2010 | Shibata |
| 7,678,195 | B2 | 3/2010 | Schlesser et al. |
| 7,713,844 | B2 | 5/2010 | Nishiura et al. |
| 7,750,355 | B2 | 7/2010 | Dwilinski et al. |
| 7,755,103 | B2 | 7/2010 | Ueno |
| 7,776,153 | B2 | 8/2010 | Schowalter et al. |
| 7,803,733 | B2 | 9/2010 | Teratani et al. |
| 7,902,566 | B2 | 3/2011 | Paolini et al. |
| 7,943,952 | B2 | 5/2011 | Loh et al. |
| 7,956,372 | B2 | 6/2011 | Kamada et al. |
| 7,976,186 | B2 | 7/2011 | Loh |
| 8,012,257 | B2 | 9/2011 | Morgan et al. |
| 8,080,833 | B2 | 12/2011 | Grandusky et al. |
| 8,088,220 | B2 | 1/2012 | Slack et al. |
| 8,123,859 | B2 | 2/2012 | Schowalter et al. |
| 8,222,650 | B2 | 7/2012 | Schowalter et al. |
| 8,323,406 | B2 * | 12/2012 | Bondokov .............. C30B 23/00 117/80 |
| 8,349,077 | B2 | 1/2013 | Bondokov et al. |
| 8,545,629 | B2 | 10/2013 | Schowalter et al. |
| 8,580,035 | B2 | 11/2013 | Bondokov et al. |
| 8,747,552 | B2 | 6/2014 | Slack et al. |
| 8,834,630 | B2 * | 9/2014 | Bondokov .............. C30B 23/00 117/80 |
| 8,896,020 | B2 | 11/2014 | Schowalter et al. |
| 8,962,359 | B2 | 2/2015 | Schowalter et al. |
| 2001/0000209 | A1 | 4/2001 | Krames et al. |
| 2001/0005023 | A1 | 6/2001 | Itoh et al. |
| 2001/0024871 | A1 | 9/2001 | Yagi |
| 2001/0051433 | A1 | 12/2001 | Francis et al. |
| 2002/0030194 | A1 | 3/2002 | Camras et al. |
| 2002/0170490 | A1 | 11/2002 | Vodakov et al. |
| 2003/0047816 | A1 | 3/2003 | Dutta |
| 2003/0160254 | A1 | 8/2003 | Henrichs |
| 2003/0168003 | A1 | 9/2003 | Schowalter et al. |
| 2003/0213964 | A1 | 11/2003 | Flynn et al. |
| 2003/0216011 | A1 | 11/2003 | Nakamura et al. |
| 2004/0033690 | A1 | 2/2004 | Schowalter et al. |
| 2004/0104442 | A1 | 6/2004 | Feudel et al. |
| 2004/0130002 | A1 | 7/2004 | Weeks et al. |
| 2004/0187766 | A1 | 9/2004 | Letertre |
| 2004/0206978 | A1 | 10/2004 | Saxler |
| 2004/0213309 | A9 | 10/2004 | Amano et al. |
| 2004/0224484 | A1 | 11/2004 | Fareed et al. |
| 2004/0226917 | A1 | 11/2004 | Laconto et al. |
| 2004/0245535 | A1 | 12/2004 | D'Evelyn et al. |

(56) References Cited

U.S. PATENT DOCUMENTS

| | | |
|---|---|---|
| 2004/0251471 A1 | 12/2004 | Dwilinski et al. |
| 2005/0062392 A1 | 3/2005 | Sakai et al. |
| 2005/0072986 A1 | 4/2005 | Sasaoka |
| 2005/0103257 A1 | 5/2005 | Xu et al. |
| 2005/0142391 A1 | 6/2005 | Dmitriev et al. |
| 2005/0161697 A1 | 7/2005 | Nakahata et al. |
| 2005/0164044 A1 | 7/2005 | Melnik et al. |
| 2005/0214992 A1 | 9/2005 | Chakraborty et al. |
| 2005/0269577 A1 | 12/2005 | Ueda et al. |
| 2005/0277214 A1 | 12/2005 | Uematsu et al. |
| 2005/0285141 A1 | 12/2005 | Piner et al. |
| 2006/0005763 A1 | 1/2006 | Schowalter et al. |
| 2006/0029832 A1 | 2/2006 | Xu et al. |
| 2006/0054075 A1 | 3/2006 | Dwilinski et al. |
| 2006/0118820 A1 | 6/2006 | Gaska et al. |
| 2006/0181695 A1 | 8/2006 | Sage |
| 2006/0244011 A1 | 11/2006 | Saxler |
| 2006/0255341 A1 | 11/2006 | Pinnington et al. |
| 2006/0281205 A1 | 12/2006 | Park |
| 2006/0288929 A1 | 12/2006 | Slack et al. |
| 2007/0018184 A1 | 1/2007 | Beeson et al. |
| 2007/0082019 A1 | 4/2007 | Huang et al. |
| 2007/0101932 A1 | 5/2007 | Schowalter et al. |
| 2007/0102721 A1 | 5/2007 | DenBaars et al. |
| 2007/0131160 A1 | 6/2007 | Slack et al. |
| 2007/0134827 A1 | 6/2007 | Bondokov et al. |
| 2007/0151905 A1 | 7/2007 | Wang et al. |
| 2007/0224714 A1 | 9/2007 | Ikeda et al. |
| 2007/0243653 A1 | 10/2007 | Morgan et al. |
| 2007/0257333 A1 | 11/2007 | Schlesser et al. |
| 2008/0006200 A1 | 1/2008 | Schowalter et al. |
| 2008/0012034 A1 | 1/2008 | Thielen et al. |
| 2008/0023719 A1 | 1/2008 | Camras et al. |
| 2008/0036038 A1 | 2/2008 | Hersee et al. |
| 2008/0054280 A1 | 3/2008 | Reginelli et al. |
| 2008/0087984 A1 | 4/2008 | Melas |
| 2008/0121910 A1 | 5/2008 | Bergmann et al. |
| 2008/0123711 A1 | 5/2008 | Chua et al. |
| 2008/0135861 A1 | 6/2008 | Pokrovskiy et al. |
| 2008/0142817 A1 | 6/2008 | Ibbetson et al. |
| 2008/0144688 A1 | 6/2008 | Chua et al. |
| 2008/0149945 A1 | 6/2008 | Nagai |
| 2008/0149960 A1 | 6/2008 | Amo et al. |
| 2008/0157111 A1 | 7/2008 | Erchak et al. |
| 2008/0173887 A1 | 7/2008 | Baba et al. |
| 2008/0182092 A1 | 7/2008 | Bondokov et al. |
| 2008/0187016 A1 | 8/2008 | Schowalter et al. |
| 2008/0191225 A1 | 8/2008 | Medendorp |
| 2008/0246047 A1 | 10/2008 | Hsu et al. |
| 2008/0251808 A1 | 10/2008 | Kususe et al. |
| 2008/0258165 A1 | 10/2008 | Zimmerman et al. |
| 2009/0008654 A1 | 1/2009 | Nagai |
| 2009/0014742 A1 | 1/2009 | Erchak |
| 2009/0039373 A1 | 2/2009 | Saito et al. |
| 2009/0050050 A1 | 2/2009 | Slack et al. |
| 2009/0065791 A1 | 3/2009 | Yen et al. |
| 2009/0065792 A1 | 3/2009 | Thompson et al. |
| 2009/0078957 A1 | 3/2009 | Hoshina |
| 2009/0090932 A1 | 4/2009 | Bour et al. |
| 2009/0121246 A1 | 5/2009 | Denbaars et al. |
| 2009/0121250 A1 | 5/2009 | DenBaars et al. |
| 2009/0140279 A1 | 6/2009 | Zimmerman et al. |
| 2009/0141502 A1 | 6/2009 | Sonoda et al. |
| 2009/0155969 A1 | 6/2009 | Chakravarti et al. |
| 2009/0155989 A1 | 6/2009 | Uematsu et al. |
| 2009/0159910 A1 | 6/2009 | Lin et al. |
| 2009/0166657 A1 | 7/2009 | Yamada et al. |
| 2009/0173958 A1 | 7/2009 | Chakraborty et al. |
| 2009/0233394 A1 | 9/2009 | Batres et al. |
| 2009/0239357 A1 | 9/2009 | Amano et al. |
| 2009/0256163 A1 | 10/2009 | Chakraborty |
| 2009/0261372 A1 | 10/2009 | Ueda |
| 2009/0267098 A1 | 10/2009 | Choi |
| 2009/0278148 A1 | 11/2009 | Nabekura et al. |
| 2009/0283028 A1 | 11/2009 | Schowalter et al. |
| 2009/0315054 A1 | 12/2009 | Kim et al. |
| 2009/0321758 A1 | 12/2009 | Liu et al. |
| 2009/0321771 A1 | 12/2009 | Hattori et al. |
| 2010/0006870 A1 | 1/2010 | Lee et al. |
| 2010/0012956 A1 | 1/2010 | Yoo |
| 2010/0025717 A1 | 2/2010 | Fujii et al. |
| 2010/0025719 A1 | 2/2010 | Li |
| 2010/0135349 A1 | 6/2010 | Schowalter et al. |
| 2010/0187541 A1 | 7/2010 | Slack et al. |
| 2010/0264460 A1 | 10/2010 | Grandusky et al. |
| 2010/0314551 A1 | 12/2010 | Bettles et al. |
| 2011/0008621 A1 | 1/2011 | Schujman et al. |
| 2011/0008923 A1 | 1/2011 | Lin et al. |
| 2011/0011332 A1 | 1/2011 | Schowalter et al. |
| 2012/0000414 A1 | 1/2012 | Bondokov et al. |
| 2012/0021175 A1 | 1/2012 | Moody et al. |
| 2012/0104355 A1 | 5/2012 | Grandusky et al. |
| 2012/0146047 A1 | 6/2012 | Kneissl et al. |
| 2013/0026525 A1 | 1/2013 | Chen et al. |
| 2013/0082237 A1 | 4/2013 | Northrup et al. |
| 2013/0099141 A1 | 4/2013 | Chua |
| 2013/0152852 A1 | 6/2013 | Bondokov et al. |
| 2013/0157442 A1 | 6/2013 | Bondokov et al. |
| 2014/0061666 A1 | 3/2014 | Schowalter et al. |
| 2014/0093671 A1 | 4/2014 | Bondokov et al. |
| 2014/0203311 A1 | 7/2014 | Schowalter et al. |
| 2014/0231725 A1 | 8/2014 | Slack et al. |
| 2014/0264263 A1 | 9/2014 | Grandusky et al. |
| 2015/0013592 A1 | 1/2015 | Bondokov et al. |
| 2015/0020731 A1 | 1/2015 | Bondokov et al. |
| 2015/0079329 A1 | 3/2015 | Schowalter et al. |

FOREIGN PATENT DOCUMENTS

| | | |
|---|---|---|
| CN | 101680115 A | 3/2010 |
| CN | 103038400 A | 4/2013 |
| DE | 10248964 A1 | 4/2004 |
| EP | 0609799 A2 | 8/1994 |
| EP | 0811708 A2 | 12/1997 |
| EP | 0979883 A1 | 2/2000 |
| EP | 1211715 A2 | 6/2002 |
| EP | 1544925 A2 | 6/2005 |
| EP | 1732145 A2 | 12/2006 |
| EP | 1754810 A1 | 2/2007 |
| EP | 1852528 A1 | 11/2007 |
| EP | 2099068 A1 | 9/2009 |
| EP | 2287367 A1 | 2/2011 |
| EP | 2588651 A1 | 5/2013 |
| JP | 61-236686 A | 10/1986 |
| JP | 2-18379 A | 1/1990 |
| JP | 3-285075 A | 12/1991 |
| JP | 9-83016 A | 3/1997 |
| JP | 2000-31059 A | 1/2000 |
| JP | 2000-154090 A | 6/2000 |
| JP | 2001-192647 A | 7/2001 |
| JP | 2002-274996 A | 9/2002 |
| JP | 2003-197541 A | 7/2003 |
| JP | 2004-355920 A | 12/2004 |
| JP | 2005-167275 A | 6/2005 |
| JP | 2005-210084 A | 8/2005 |
| JP | 2005-536873 A | 12/2005 |
| JP | 2006-511432 A | 4/2006 |
| JP | 2006-169173 A | 6/2006 |
| JP | 2006-319107 A | 11/2006 |
| JP | 2006-335608 A | 12/2006 |
| JP | 2011-60986 A | 3/2011 |
| JP | 2013-32287 A | 2/2013 |
| JP | 2013-155112 A | 8/2013 |
| JP | 2013-542155 A | 11/2013 |
| WO | 99/34037 A1 | 7/1999 |
| WO | 00/22203 A2 | 4/2000 |
| WO | 01/11116 A1 | 2/2001 |
| WO | 03/007383 A2 | 1/2003 |
| WO | 03/081730 A2 | 10/2003 |
| WO | 2004/061896 A2 | 7/2004 |
| WO | 2005/012602 A1 | 2/2005 |
| WO | 2006/110512 A1 | 10/2006 |
| WO | 2007/062250 A2 | 5/2007 |
| WO | 2007/113537 A1 | 10/2007 |

(56) References Cited

FOREIGN PATENT DOCUMENTS

| WO | 2008/042020 A2 | 4/2008 |
|----|----------------|--------|
| WO | 2008/088838 A1 | 7/2008 |
| WO | 2012/003304 A1 | 1/2012 |
| WO | 2012/012010 A2 | 1/2012 |
| WO | 2014/151264 A1 | 9/2014 |

OTHER PUBLICATIONS

PCT International Patent Application No. PCT/US2008/000597, International Preliminary Report on Patentability mailed Jul. 30, 2009, 7 pages.
PCT International Patent Application No. PCT/US2008/001003, International Search Report and Written Opinion mailed Aug. 5, 2008, 9 pages.
PCT International Patent Application No. PCT/US2008/001003, International Preliminary Report on Patentability mailed Aug. 6, 2009, 7 pages.
Yano et al., "Growth of Nitride Crystals, BN, AlN and GaN by Using a Na Flux", Diamond and Related Materials, vol. 9, 2000, pp. 512-515.
PCT International Patent Application No. PCT/US2011/042571, International Search Report and Written Opinion mailed Sep. 19, 2011, 14 pages.
PCT International Patent Application No. PCT/U52014/025317, International Search Report and Written Opinion mailed Aug. 27, 2014, 13 pages.
Pernot et al., "Improved Efficiency of 255-280nm AlGaN-Based Light-Emitting Diodes", Applied Physics Express, vol. 3, 2010, p. 061004 (3 pages).
Perry et al., "The Optical Absorption Edge of Single-Crystal AlN Prepared by a Close-Spaced Vapor Process", Applied Physics Letter, vol. 33, No. 4, Aug. 15, 1978, pp. 319-321.
Raghothamachar et al., "Synchrotron White Beam Topography Characterization of Physical Vapor Transport Grown AlN and Ammonothermal GaN", Journal of Crystal Growth, vol. 246, 2002, pp. 271-280.
Raghothamachar et al., "X-ray Characterization of Bulk AlN Single Crystals Grown by the Sublimation Technique", Journal of Crystal Growth, vol. 250, 2003, pp. 244-250.
Rojo et al., "Growth and Characterization of Epitaxial Layers on Aluminum Nitride Substrates Prepared from Bulk, Single Crystals", Journal of Crystal Growth, vol. 240, 2002, pp. 508-512.
Rojo et al., "Progress in the Preparation of Aluminum Nitride Substrates from Bulk Cystals", Mat. Res. Soc. Symp. Pro., vol. 722, 2002, pp. K1.1.1-K1.1.9.
Rojo et al., "Report on the Growth of Bulk Aluminum Nitrideand Subsequent Substrate Preperation", Journal of Crystal Growth, vol. 231, 2001, pp. 317-321.
Salzman et al., "Reduction of Oxygen Contamination in AlN", Physica Status Solidi (c), vol. 0, No. 7, 2003, pp. 2541-2544.
Sarua et al., "Effect of Impurities on Raman and Photoluminescence Spectra of AlN Bulk Crystals", Materials Research Society Symposium Proceedings, vol. 798, 2004, pp. Y5.17.1-Y5.17.6.
Schlesser et al., "Crucible Materials for Growth of Aluminium Nitride Crystals", Journal of Crystal Growth, vol. 281, 2005, pp. 75-80.
Schlesser et al., "Growth of AlN Bulk Crystals from the Vapor Phase", Material Research Society Symp. Proc., vol. 693, 2002, pp. I9.4.1-I9.4.6.
Schlesser et al., "Seeded Growth of AlN Bulk Single Crystals by Sublimation", Journal of Crystal Growth, vol. 241, 2002, pp. 416-420.
Schowalter et al., "Fabrication of Native, Single-Crystal AlN Substrates", Physica Status Solidi (c), vol. 0, No. 7, 2003, pp. 1-4.
Schujman et al., "Very Low Dislocation Density AlN Substrates for Device Applications", Proc. of SPIE, 2006, vol. 6121, 2006, pp. 61210K-1-61210K-7.

Schweizer et al., "Investigation of Oxygen-Related Luminescence Centres in AlN Ceramics", Physica Status Solidi (b), vol. 219, No. 1, 2000, pp. 171-180.
Sedhain et al., "Photoluminescence Properties of AlN Homoepilayers with Different Orientations", Applied Physics Letters, vol. 93, 2008, pp. 041905-1-041905-3.
Segal et al., "On Mechanisms of Sublimation Growth of AlN bulk Crystals", Journal of Crystal Growth, vol. 211, 2000, pp. 68-72.
Seo et al., "Enhanced Light Output Power of Near UV Light Emitting Diodes with Graphene / Indium Tin Oxide Nanodot Nodes for Transparent and Current Spreading Electrode", Optics Express, vol. 19, No. 23, Nov. 7, 2011, pp. 23111-23117.
Shakya et al., "III-Nitride Blue and UV Photonic Crystal Light-Emitting Diodes", Fourth International Conference on Solid State Lighting, Proc. of SPIE, vol. 5530, pp. 241-250.
Shatalov et al., "AlGaN Deep-Ultraviolet Light-Emitting Diodes with External Quantum Efficiency above 10%", Applied Physics Express, vol. 5, 2012, pp. 082101(3 pages).
Shi et al., "Luminescence Properties of Wurtzite AlN Nanotips", Applied Physics Letters, vol. 89, 2006, pp. 163127-1-163127-3.
Shih et al., "High-Quality and Crack-Free $Al_xGa1-xN$ (x~0.2) Grown on Sapphire by a Two-Step Growth Method", Journal of Crystal Growth, vol. 277, 2005, pp. 44-50.
Silveira et al., "Excitonic Structure of Bulk AlN from Optical Reflectivity and Cathodoluminescense Measurements", Physical Review B, vol. 71, 2005, pp. 041201-1-041201-4.
Singh et al., "Physical Vapor Transport Growth of Large AlN Crystals", Journal of Crystal Growth, vol. 250, 2003, pp. 107-112.
Slack et al., "AlN Single Crystals", Journal of Crystal Growth, vol. 42, 1977, pp. 560-563.
Slack et al., "Growth of High Purity AlN Crystals", Journal of Crystal Growth, vol. 34, 1976, pp. 263-279.
Slack et al., "Properties of Crucible Materials for Bulk Growth of AlN", Materials Research Society Symposium Proceedings, vol. 798, 2004, pp. Y10.74.1-Y10.74.4.
Slack et al., "Some Effects of Oxygen Impurities on AlN and GaN", Journal of Crystal Growth, vol. 246, 2002, pp. 287-298.
Smart et al., "AlGaN9/GaN Heterostructures on Insulating AlGaN Nucleation Layers", Applied Physics Letters, vol. 75, No. 3, Jul. 10, 1999, pp. 388-390.
Song, T. L., "Strain Relaxation Due to V-Pit Formation in $In_xGa1-xN$/GaN Epilayers Grown on Sapphire", Journal of Applied Physics, vol. 98, 2005, pp. 084906-1-084906-9.
Stampfl et al., "Theoretical Investigation of Native Defects, Impurities and Complexes in Aluminum Nitride", Physical Review B, vol. 65, 2002, pp. 155212-1-155212-10.
Strassburg et al., "The Growth and Optical Properties of Large, High-Quality AlN Single Crystals", Journal of Applied Physics, vol. 96, No. 10, Nov. 15, 2004, pp. 5870-5876.
Sun et al., "Phase Relationships in the System Y—Al—O—N", Materials Letters, vol. 11, No. 3,4, May 1991, pp. 67-69.
Takehara et al., "Indium-Tin Oxide/Al Reflective Electrodes for Ultraviolet Light-Emitting Diodes", Japanese Journal of Applied Physics, vol. 51, 2012, p. 042101 (4 pages).
Takeuchi et al., "Optical Properties of Strained AlGaN and GaInN on GaN", Japanese Journal of Applied Physics, vol. 36, Part 2, No. 2B, Feb. 15, 1997, pp. L177-L179.
Takeya et al., "Degradation in AlGaInN Lasers", Physica Status Solidi (c), vol. 0, No. 7, 2003, pp. 2292-2295.
Taniyasu et al., "An Aluminum Nitride Light-Emitting Diode with a Wavelength of 210 Nanometres", Nature, vol. 441, May 18, 2006, pp. 325-328.
Taniyasu et al., "Intentional Control of N-Type Conduction for Si-Doped AlN and $Al_xGa1-xN$ ($0.42 \leq x < 1$)", Applied Physics Letters, vol. 81, No. 7, Aug. 12, 2002, pp. 1255-1257.
Tavernier et al., "Chemical Mechanical Polishing of Gallium Nitride", Electrochemical and Solid State Letters, vol. 5, No. 8, 2002, pp. G61-G64.
Thomas et al., "Determination of the Concentration of Oxygen Dissolved in the AlN Lattice by Hot Gas Extraction from AlN Ceramics", Journal of European Society, vol. 8, 1991, pp. 11-19.

(56) References Cited

OTHER PUBLICATIONS

Tomiya et al., "Dislocations in GaN-Based Laser Diodes on Epitaxial Lateral Overgrown GaN Layers", Physica Status Solidi (a), vol. 188, No. 1, 2001, pp. 69-72.
Trinkler et al., "Radiation Induced Recombination Processes in AlN Ceramics", Journal of Physics: Condensed Matter, vol. 13, 2001, pp. 8931-8938.
Trinkler et al., "Spectral Properties of AlN Ceramics", SPIE, vol. 2967, 1997, pp. 85-88.
PCT International Patent Application No. PCT/US2007/011075, International Preliminary Report on Patentability issued Nov. 11, 2008.
Allerman et al., "Growth and Design of Deep-UV (240-290 nm) Light Emitting Diodes Using AlGaN Alloys", J. Crystal Growth, vol. 272, No. 1-4, Dec. 10, 2004, pp. 227-241.
PCT International Patent Application No. PCT/US2011/042571, International Preliminary Report on Patentability mailed Jan. 17, 2013, 10 pages.
Chitnis et al., "Milliwatt Power AlGaN Quantum Well Deep Ultraviolet Light Emitting Diodes", Phys. Stat. Sol. (a), vol. 200, No. 1, 2003, pp. 99-101.
Chiu et al., "Efficiency Enhancement of UV/blue Light Emitting Diodes via Nanoscaled Epitaxial Lateral Overgrowth of GaN on a SiO2 Nanorod-Array Patterned Sapphire Substrate", Journal of Crystal Growth, vol. 310, 2008, pp. 5170-5174.
Examination Report received for Chinese Patent Application No. 200880005464.4, mailed on Sep. 09, 2013, 10 pages (7 pages of English Translation and 3 pages of Official Copy).
Examination Report Received for Chinese Patent Application No. 200880005464.4, mailed on Mar. 31, 2014, 7 pages. (4 pages of English Translation & 3 pages of Official copy).
Examination Report Received for Chinese Patent Application No. 200880005464.4, mailed on Jul. 3, 2014, 7 pages. (3 pages of English Translation & 4 pages of Official copy).
Collins et al., "Lattice Vibration Spectra of Aluminum Nitride", Physical Review, vol. 158, No. 3, Jun. 15, 1967, pp. 833-838.
Constantin et al., "Mixing Rocksalt and Wurtzite Structure Binary Nitrides to Form Novel Ternary Alloys: ScGaN and MnGaN", Mat. Res. Soc. Symp. Proc., vol. 799, 2004, Z9.5.1-Z9.5.6.
Cox et al., "On the Preparation, Optical Properties and Electrical Behaviour of Aluminum Nitride", J. Phys. Chem. Solids, vol. 28, 1967, pp. 543-548.
Dalmau et al., "Crucible Selection in AlN Bulk Crystal Growth", Mat. Res. Soc. Symp. Proc., vol. 798, 2004, pp. Y2.9.1-Y2.9.5.
Devries et al., "Phase Equilibria Pertinent to the Growth of Cubic Boron Nitride", Journal of Crystal Growth, vol. 13/14, 1972, pp. 88-92.
Dong et al., "Ultraviolet Electroluminescence from Ordered ZnO Nanorod Array/p-GaN Light Emitting Diodes", Applied Physics Letters, vol. 100, 2012, pp. 171109-1-171109-4.
Dryburgh, P. M., "The Estimation of Maximum Growth Rate for Aluminum Nitride Crystals Grown by Direct Sublimation", Journal of Crystal Growth, vol. 125, 1992, pp. 65-68.
Dugger, Cortland O., "The Single Crystal Synthesis and Some Properties of Aluminum Nitride", Physical Science Research Papers, No. 656, Aug. 1, 1975, 67 pages.
Dugger, Cortland O., "The Synthesis of Aluminum Nitride Single Crystals", Mat. Res. Bull., vol. 9, 1974, pp. 331-336.
Edgar et al., "Native Oxide and Hydroxides and Their Implications for Bulk AlN Crystal Growth", 2008, pp. 1-15.
Examination Report Received for European Patent Application No. 07774299.7, mailed on Jul. 25, 2014, 6 pages.
Epelbaum et al., "Natural Growth Habit of Bulk AlN Crystals", Journal of Crystal Growth, vol. 265, No. 3-4, 2004, pp. 577-581.
Epelbaum et al., "Sublimation Growth of Bulk AlN Crystals: Materials Compatibility and Crystal Quality", Materials Science Forum, vol. 389-393, 2002, pp. 1445-1448.
Evans et al., "Electron Paramagnetic Resonance of a Donor in Aluminum Nitride Crystals", Applied Physics Letter, vol. 88, 2006, pp. 062112-1-062112-3.

Freitas et al., "Properties of Bulk AlN Grown by Thermodecomposition of AlCl3.NH3", Applied Physics Letters, vol. 83, No. 13, Sep. 29, 2003, pp. 2584-2586.
Freitas et al., "Shallow Donors in GaN", Physica Status Solidi (B), vol. 240, No. 2, 2003, pp. 330-336.
Freitas, James A., "Optical Studies of Bulk and Homoepitaxial films of III-V Nitride Semiconductors", Journal of Crystal Growth, vol. 281, 2005, pp. 168-182.
Zhuang et al., "Seeded Growth of AlN Single Crystals by Physical Vapor Transport", Journal of Crystal Growth, vol. 287, 2006, pp. 372-375.
Gauckler et al., "Representation of Multicomponent Silicon Nitride Based Systems", Proceedings of NATO Advanced Study Institute on Nitrogen Ceramics, 1977, 4 pages.
Gorbatov et al., "Electrical Conductivity of Materials from Mixed Aluminum and Silicon Nitrides", Soviet Powder Metallurgy and Metal Ceramics, vol. 9, 1970, pp. 917-920.
Gutierrez et al., "The Formation of Nanopipes Caused by Donor Impurities in GaN: A Theoretical Study for the Case of Oxygen", Philosophical Magazine Letters, vol. 79, No. 3, 1999, pp. 147-152.
Gutt et al., "AlGaN-Based 355 nm UV Light-Emitting Diodes with High Power Efficiency", Applied Physics Express, vol. 5, 2012, p. 032101 (3 pages).
Hacke et al., "Photoluminescence Intensity and Spectral Distribution of GaN Films on SiC Substrates—The Dependence on Dislocation Density and Structure", Phys. Stat. Sol. (b), vol. 216, 1999, pp. 639-644.
Hermann et al., "Highly Si-doped AlN Grown by Plasma-Assisted Molecular-Beam Epitaxy", Applied Physics Letters, vol. 86, 2005, pp. 192108-1-192108-3.
Honda et al., "Electron Paramagnetic Center in Neutron-Irradiated AlN", Japanese Journal of Applied Physics, vol. 29, No. 4, Apr. 1990, pp. L652-L654.
Hong et al., "Enhanced Light Output of GaN-Based Near-UV Light Emitting Diodes by Using Nanopatterned Indium Tin Oxide electrodes", Semiconductor Science and Technology, vol. 21, 2006, pp. 594-597.
Hong et al., "Fabrication of Moth-Eye Structure on p-GaN-Based LEDs for Improvement of Light Extraction", Materials Science and Engineering B, vol. 163, 2009, pp. 170-173.
Honig, Richard E., "Vapor Pressure Data for the Solid and Liquid Elements", RCA Review, vol. 23, 1962, 4 pages.
Hossain et al., "Study of Cathodoluminescence Spectroscopy of Aluminum Nitride", SPIE, vol. 2877, 1996, pp. 42-45.
Hsu et al., "Optimizing Textured Structures Possessing Both Optical Gradient and Diffraction Properties to Increase the Extraction Efficiency of Light-Emitting Diodes", Photonics and Nanostructures—Fundamentals and Applications, 2012, pp. 1-11.
Inazu et al., "Improvement of Light Extraction Efficiency for AlGaN-Based Deep Ultraviolet Light-Emitting Diodes", Japanese Journal of Applied Physics, vol. 50, 2011, p. 122101 (3 pages).
Iwaya et al., "Improvement of Light Extraction Efficiency of UV-LED Grown on Low-Dislocation-Density AlGaN", Phys. Stat. Sol. (a), vol. 200, No. 1, 2003, pp. 110-113.
Jahnen et al., "Pinholes, Dislocations and Strain Relaxation in InGaN", MRS Internet Journal Nitride Semiconductor Research, vol. 3, No. 39, 1998, pp. 1-10.
Jeong et al., "InGaN/AlGaN Ultraviolet Light-Emitting Diode with a Ti3O5/Al2O3 Distributed Bragg Reflector", Japanese Journal of Applied Physics, vol. 47, No. 12, 2008, pp. 8811-8814.
Jones et al., "Optical Properties of AlN Determined by Vacuum Ultraviolet Spectroscopy and Spectroscopic Ellipsometry Data", Journal of Materials Research, vol. 14, No. 11, 1999, pp. 4337-4344.
Examination Report Received for Japanese Patent Application No. 2008-543389, mailed on Aug. 20, 2013, 13 pages. (6 pages of English Translation and 7 pages of Official Copy).
Examination Report received for Japanese Patent Application No. 2009-547307, mailed on Apr. 8, 2014, 7 pages (3 pages of English Translation and 4 page of Official copy).
Examination Report Received for Japanese Patent Application No. 2013-518701, mailed on Sep. 24, 2014, 5 pages. (2 pages of English Translation and 3 pages of Official Copy).

(56) References Cited

OTHER PUBLICATIONS

Kanechika et al., "n-type AlN Layer by Si Ion Implantation", Applied Physics Letters, vol. 88, 2006, pp. 202106-1-202106-2.

Karel et al., "The Luminescence Properties of AlN with Manganese and Rare Earth Activators Under Ultraviolet and Cathode-Ray Excitation", Czechoslovak Journal of Physics B., vol. 20, 1970, pp. 46-55.

Karpinski et al., "Equilibrium pressure of N2 over GaN and High Pressure Solution Growth of GaN", Journal of Crystal Growth, vol. 66, 1984, pp. 1-10.

Karpov et al., "Sublimation Growth of AlN in Vacuum and in a Gas Atmosphere", Phys. Stat. Sol. (a), vol. 176, 1999, pp. 435-438.

Kasu et al., "Formation of Solid Solution of Al1—xSixN ($0<x\leq12\%$) Ternary Alloy", Jap. J. Appl. Phys., vol. 40, Part 2, No. 10A, 2001, pp. L1048-L1050.

Kasugai et al., "High-Efficiency Nitride-Based Light-Emitting Diodes with Moth-Eye Structure", Japanese Journal of Applied Physics, vol. 44, No. 10, 2005, pp. 7414-7417.

Katayama-Yoshida et al., "Codoping method for the Fabrication of Low-Resistivity Wide Band-Gap Semiconductors in p-type GaN, p-type AlN and n-type Diamond: Prediction versus Experiment", Journal of Physics: Condensed Matter, vol. 13, 2001, pp. 8901-8914.

Trinkler et al., "Stimulated Luminescence of AlN Ceramics Induced by Ultraviolet Radiation", Radiation Measurements, vol. 33, 2001, pp. 731-735.

Tsao, Jeff Y., "Solid-State Lighting: Lamps, Chips and Materials for Tomorrow", Circuits and Devices Magazine, IEEE, May/Jun. 2004, pp. 28-37.

Tuomisto et al., "Characterization of Bulk AlN Crystals with Positron Annihilation Spectroscopy", Journal of Crystal Growth, 2008, pp. 1-4.

Vail et al., "The Nitrogen Vacancy in Aluminum Nitride", Journal of Physics: Condensed Matter, vol. 18, 2006, pp. 2125-2135.

Van De Walle et al., "Doping of AlGaN Alloys", MRS Internet Journal Nitride Semiconductor Research, 4S1, G10.4, 1999, pp. 1-12.

Van De Walle et al., "First-principles Calculations for Defects and Impurities: Applications to III-Nitrides", Journal of Applied Physics, vol. 95, No. 8, Apr. 15, 2004, pp. 3851-3879.

Van De Walle, "DX-Center Formation in Wurtzite and Zinc-Blende AlxGa1—xN", Physics Review B, vol. 57, No. 4, Jan. 15, 1998, pp. R2033-R2036.

Vendl et al., "The Melting Points of Some Rare-Earth Metal Nitrides as a Function of Nitrogen Pressure", High Temperatures-High Pressures, vol. 9, 1977, pp. 313-318.

Venugopal et al., "Comparison of Various Buffer Schemes to Grow GaN on Large-Area Si(111) Substrates Using Metal-Organic Chemical-Vapor Deposition", Journal of Electronic Materials, vol. 32, No. 5, 2003, pp. 371-374.

Vinogradov et al., "Determination of the Melting Parameters of Aluminum Nitride", High Temperatures-High Pressures, vol. 23, 1991, pp. 685-688.

Watanabe et al., "Changes in Optical Transmittance and Surface Morphology of AlN Thin Films Exposed to Atmosphere", Journal of Materials Research, vol. 13, No. 10, Oct. 1998, pp. 2956-2961.

Wentorf, R H., "Synthesis of the Cubic Form of Boron Nitride", Journal of Chemical Physics, vol. 34, No. 3, Mar. 1961, pp. 809-812.

Wierer, Jr., Jonathan J., "Light Extraction Methods in Light-Emitting Diodes", Optical Society of America/CLEO, 2011, 2 pages.

Wongchotigul et al., "Low Resistivity Aluminum Nitride:Carbon (AlN:C) Films Grown by Metal Organic Chemical Vapor Deposition", Materials Letters, vol. 26, Mar. 1996, pp. 223-226.

Yamane et al., "Preparation of GaN Single Crystals Using a Na Flux", Chemical Materials, vol. 9, No. 2, 1997, pp. 413-416.

Gaska et al., "Deep-Ultraviolet Emission of AlGaN/AlN Quantum Wells on Bulk AlN", Applied Physics Letters, vol. 81, No. 24, Dec. 9, 2002, pp. 4658-4660.

"Multi-Year Program Plan FY'08-FY'13: Solid State Lighting Research and Development", Lighting Research and Development Building Technologies Program, U.S. Department of Energy, Mar. 2007, 144 pages.

Examination Report Received for European Application No. 02803675.4 mailed on May 2, 2007, 4 pages.

Examination Report Received for European Application No. 02806723.9 mailed on Jan. 17, 2008, 4 pages.

Examination Report Received for European Application No. 02806723.9 mailed on Feb. 7, 2007, 4 pages.

Examination Report Received for European Application No. 02806723.9 mailed on Feb. 16, 2010, 2 pages.

Examination Report Received for European Application No. 02806723.9 mailed on Aug. 8, 2008, 3 pages.

Examination Report Received for European Application No. 03808366.3 mailed on Sep. 28, 2006, 4 pages.

Summons to Attend Oral Proceedings in European Patent Application No. 03808366.3, mailed on Dec. 17, 2007, 5 pages.

Notification to Pay Further Search Fee for European Patent Application No. 06844590.7 mailed on Jun. 19, 2014, 9 pages.

Examination Report Received for European Patent Application No. 06844804.2 mailed on Jan. 30, 2015, 5 pages.

Examination Report Received for European Patent Application No. 06844804.2 mailed on Mar. 4, 2009, 3 pages.

Examination Report received for Canadian Patent Application No. 2467806 mailed on Feb. 23, 2010, 2 pages.

Examination Report received for Canadian Patent Application No. 2467806 mailed on Aug. 13, 2009, 4 pages.

Examination Report received for Australian Patent Application No. 2003303485 mailed on Oct. 9, 2008, 2 pages.

Examination Report Received for Japanese Application No. 2003-545445 mailed on Sep. 30, 2008, 3 pages. (English Translation only).

Examination Report Received for Japanese Application No. 2003-545445 mailed on Nov. 10, 2009, 3 pages. (English Translation only).

Examination Report Received for Japanese Application No. 2003-579324 mailed on May 27, 2008, 2 pages.

Examination Report Received for Japanese Application No. 2003-579324 mailed on Sep. 8, 2009, 1 page.

Examination Report Received for Japanese Application No. 2004-564648 mailed on Feb. 3, 2010, 2 pages.

Examination Report Received for Japanese Application No. 2004-564648 mailed on Jun. 24, 2009, 2 pages.

Cheong et al., "Structural and Optical Properties of Near-UV LEDs Grown on V-Grooved Sapphire Substrates Fabricated by Wet Etching", Journal of Crystal Growth, vol. 298, 2007, pp. 699-702.

Cheng et al., "Light Output Enhancement of UV Light-Emitting Diodes with Embedded Distributed Bragg Reflector", IEEE Photonics Technology Letters, vol. 23, No. 10, May 15, 2011, pp. 642-644.

Examination Report Received for Chinese Application No. 200680045153.1 mailed on Jun. 4, 2012, 7 pages.

Examination Report Received for Chinese Application No. 200680045153.1 mailed on Oct. 13, 2010, 6 pages. (English Translation only).

Examination Report Received for Chinese Application No. 200780018103.9 mailed on Apr. 6, 2011, 11 pages (6 pages of English Translation and 5 pages of Official Copy).

Examination Report Received for Japanese Patent Application No. 2008-543389 mailed on May 22, 2012, 13 pages (6 pages of English Translation & 7 pages of Official copy).

Examination Report Received for Japanese Patent Application No. 2008-543541 mailed on May 15, 2012, 8 pages (4 pages of English Translation & 4 pages of Official copy).

Examination Report Received for Chinese Patent Application No. 2011800323553 mailed on Jan. 4, 2015, 12 pages. (8 pages of English Translation & 4 pages of Official copy).

Examination Report Received for Taiwan Patent Application No. 91137050 mailed on Apr. 6, 2004, 1 page.

(56) References Cited

OTHER PUBLICATIONS

Akiba et al., "Growth of Flat p-GaN Contact Layer by Pulse Flow Method for High Light-Extraction AlGaN Deep-UV LEDs with Al-Based Electrode", Phys. Status Solidi (C), vol. 9, No. 3-4, 2012, pp. 806-809.
Ali et al., "Enhancement of Near-UV GaN LED Light Extraction Efficiency by GaN/Sapphire Template Patterning", Semiconductor Science and Technology, vol. 27, 2012, pp. 1-5.
Arulkumaran et al., "Improved dc Characteristics of AlGaN/GaN High-Electron-Mobility Transistors on AlN/Sapphire Templates", Applied Physics Letters, vol. 81, No. 6, Aug. 5, 2002, pp. 1131-1133.
Atobe et al., "F-Type Centers in Neutron-Irradiated AlN", Japanese Journal of Applied Physics, vol. 29, No. 1, Jan. 1990, pp. 150-152.
Balkas et al., "Sublimation Growth and Characterizations of Bulk Aluminum Nitride Single Crystals", Journal of Crystal Growth, vol. 179, 1997, pp. 363-370.
Ban et al., "Ir/Ag Reflector for High-Performance GaN-Based Near UV Light Emitting Diodes", Materials Science and Engineering B, vol. 133, 2006, pp. 26-29.
Barin, Ihsan, "Thermochemical Data of Pure Substances", Second Edition, VCH, 1993, 13 pages.
Bennett et al., "High Quality InGaAs/InP and InAlAs/InP Heterostructures Beyond the Matthews-Blakeslee Critical Layer Thickness", 4th Annual conference on InP and Related Materials, Newport, RI, 1992, pp. 650-653.
Berzina et al., "Luminescence Mechanisms of Oxygen-Related Defects in AlN", Radiation Effects & Defects in Solids, vol. 157, 2002, pp. 1089-1092.
Bickerman et al., "Polarization Dependent Below Band-Gap Optical Absorption of Aluminium Nitride Bulk Crystals", Journal of Applied Physics, vol. 103, 2008, pp. 073522-1-073522-3.
Bickerman et al., "PVT Growth of Bulk AlN Crystals with Low Oxygen Contamination", Physica Status Solidi (C), No. 7, Dec. 2003, pp. 1993-1996.
Bickermann et al., "Characterization of Bulk AlN with Low Oxygen Content", Journal of Crystal Growth, vol. 269, 2004, pp. 432-442.
Bickermann et al., "Point Defect Content and Optical Transitions in Bulk Aluminum Nitride Crystals", Physica Status Solidi (B), vol. 246, No. 6, 2009, pp. 1181-1183.
Bockowski et al., "Combustion Synthesis of Aluminum Nitride Under High Pressure of Nitrogen and Nitrogen-Argon Mixtures", Journal of Material Synthesis & Processing, vol. 5, No. 6, 1997, pp. 449-458.
Bolgar et al., "Vaporization of the Nitirides of B, Al, and Ga", Khim Fiz. Nitrodov Chem. Abstr. 71, 34003j, 1968, pp. 151-156 (English Abstract Included).
Bradley et al., "Deep Level Defects and Doping in High Al mole Fraction AlGaN", Journal of Vacuum Science & Technology B, vol. 21, No. 6, 2003, pp. 2558-2563.
Brunner et al., "Optical Constants of Epitaxial AlGaN Films and Their Temperature Dependence", Journal of Applied Physics, vol. 82, No. 10, Nov. 15,1997, pp. 5090-5096.
Chase et al., "JANAF Thermochemical Tables, Third Edition, Part I, Al—Co", J. Phys. Chem. Ref. Data, vol. 14, Suppl. No. 1, 1985, 2 pages.
Chase, Jr., Malcolm W., "NIST-JANAF Thermochemical Tables, Fourth Edition, Part I, Al—Co", J. Phys. Chem., Ref. Data, Monograph No. 9, 1998, 8 pages.
Kawabe et al., "Electrical and Optical Properties of AlN—a Thermostable Semiconductor", Elec. Engin. in Japan, vol. 87, 1967, pp. 62-70.
Kazan et al., "Oxygen Behavior in Aluminum Nitride", Journal of Applied Physics, vol. 98, 2005, pp. 103529-1-103529-4.
Kazan et al., "Phonon Dynamics in AlN Lattice Contaminated by Oxygen", Diamond & Related Materials, vol. 15, 2006, pp. 1525-1534.

Khan, Asif, "AlGaN Based deep Ultraviolet Light Emitting Diodes with Emission from 250-280 nm", Abstract and presentation at the International Workshop on Nitride Semiconductors in Pittsburg, Jul. 19, 2004, 1 page.
Kim et al., "Enhancement of Light Extraction Efficiency of Ultraviolet Light Emitting Diodes by Patterning of Sio2 Nanosphere Arrays", Thin Solid Films, vol. 517, 2009, pp. 2742-2744.
Klemens, P G., "Effect of Point Defects on the Decay of the Longitudinal Optical Mode", Physica B, vol. 316-317, 2002, pp. 413-416.
Kordis, J., "The BeO—MgO System", Journal of Nuclear Materials, vol. 14, 1964, pp. 322-325.
Kovalenkov et al., "Thick AlN Layers Grown by HVPE", Journal of Crystal Growth, vol. 281, 2005, pp. 87-92.
Lawson et al., "Preparation of Single Crystals", Semi-Conductor Monographs, 1958, pp. 18-21.
Lee et al., "Light Extraction Analysis of GaN-Based Light-Emitting Diodes with Surface Texture and/or Patterned Substrate", Optics Express, vol. 15, No. 11, 2007, pp. 6670-6676.
Liu et al., "A Global Growth Rate Model for Aluminum Nitride Sublimation", Journal of the Electrochemical Society, vol. 149, No. 1, 2002, p. G12-G15.
Liu et al., "Characterization of Aluminum Nitride Crystals Grown by Sublimation", Phys. Stat. Sol. (a), vol. 188, No. 2, 2001, pp. 769-774.
Liu et al., "Misfit Dislocation Generation in InGaN Epilayers on Free-Standing GaN", Japanese Journal of Applied Physics, vol. 46, No. 22, 2006, pp. L549-L551.
Lobo et al., "Enhancement of Light Extraction in Ultraviolet Light-Emitting Diodes using Nanopixel Contact Design with Al Reflector", Applied Physics Letters, vol. 96, 2010, pp. 081109-1-081109-3.
Ludwig et al., "Dimers [Al2N4]", Zeitsch. f. Naturtorsch., B54, 1999, pp. 461-465.
Maier et al., "Enhancement of (AlGaIn)N near-UV LED Efficiency Using Freestanding GaN Substrate", Physica Status Solidi (c), vol. 5, No. 6, 2008, pp. 2133-2135.
Mason et al., "Optically Detected Electron Paramagnetic Resonance of AlN Single Crystals", Physical Review B, vol. 59, No. 3, Jan. 15, 1999, pp. 1937-1947.
Matthews et al., "Defects in Epitaxial Multilayers", Journal of Crystal Growth, vol. 27, 1974, p. 118-125.
McCluskey et al., "Metastability of Oxygen Donors in AlGaN", Physical Review Letters, vol. 80, No. 18, May 4, 1998, pp. 4008-4011.
Meyer et al., "Defects and Defect Identification in Group III-Nitrides", Material Science Engineering, vol. B71, 2000, pp. 69-76.
Mokhov et al., "Sublimation Growth of AlN Bulk Crystals in Ta Crucibles", Journal of Crystal Growth, vol. 281, 2005, pp. 93-100.
Morita et al., "Optical Absorption and Cathodoluminescence of Epitaxial Aluminum Nitride Films", Japanese Journal of Applied Physics, vol. 21, No. 7, 1982, pp. 1102-1103.
Naidu, et al., "Phase Diagrams of Binary Tungsten Alloys", Monograph Series on Alloy Diagrams, Indian Institute of Metals, Calcutta, 1991, 11 pages.
Nakahata et al., "Electron Spin Resonance Analysis of Lattice Defects in Polycrystalline Aluminum Nitride", Journal of the American Ceramic Society, vol. 80, No. 6, Jun. 1997, pp. 1612-1614.
Nakanishi et al., "Effects of Al Composition on Luminescence Properties of Europim Implanted AlxGa1—xN (0≤x≤1)", Physica Status Solidi (c), vol. 0, No. 7, 2003, pp. 2623-2626.
Nakarmi et al., "Photoluminescence Studies of Impurity Transitions Mg-Doped AlGaN Alloys", Applied Physics Letters, vol. 94, 2009, pp. 091903-1-091903-3.
Nam et al., "Deep Impurity Transitions Involving Cation Vacancies and Complexes in AlGaN Alloys", Applied Physics Letters, vol. 86, 2005, pp. 222108-1-222108-3.
Nassau, Kurt, "The Physics and Chemistry of Color: The Fifteen Causes of Color", Wiley-Interscience Publication, 1983, 3 pages.
Nepal et al., "Optical Properties of the Nitrogen Vacancy in AlN Epilayers", Applied Physics Letters, vol. 84, No. 7, Feb. 16, 2004, pp. 1090-1092.

(56) References Cited

OTHER PUBLICATIONS

Nepal et al., "Photoluminescence Studies of Impurity Transitions in AlGaN Alloys", Applied Physics Letters, vol. 89, 2006, pp. 092107-1-092107-3.

Niewa et al., "Li3[ScN2]: The First Nitridoscandate (III)-Tetrahedral Sc Coordination and Unusual MX2 Framework", Chemistry—A European Journal, vol. 9, 2003, pp. 4255-4259.

Niewa et al., "Recent Developments in Nitride Chemistry", Chemical of Materials, vol. 10, No. 10, Oct. 2, 1998, pp. 2733-2752.

Nishida et al., "340-350 nm GaN-free UV-LEDs", Physica Status Solidi (a), vol. 200, No. 1, 2003, pp. 106-109.

Nishida et al., "AlGaN-Based Ultraviolet Light-Emitting Diodes Grown on Bulk AlN Substrates", Applied Physics Letters, vol. 84, No. 6, Feb. 9, 2004, pp. 1002-1003.

Noveski et al., "Growth of AlN Crystals on AlN/SiC Seeds by AlN Powder Sublimation in Nitrogen Atmosphere", MRS Internet Journal Nitride Semiconductor Research, vol. 9, No. 2, 2004, pp. 1-6.

Noveski et al., "Mass Transfer in AlN Crystal Growth at High Temperatures", Journal of Crystal Growth, vol. 264, 2004, pp. 369-378.

Pantha et al., "Correlation between Biaxial Stress and Free Exciton Transition in AlN Epilayers", Applied Physics Letters, vol. 91, 2007, pp. 121117-1-201117-3.

Park et al., "Study on Photoluminescence of Gan-Based UV-Leds with Refractive Index Gradient Polymeric Nanopatterns", Journal of Crystal Growth, vol. 326, 2011, pp. 28-32.

Parker et al., "Determination of the Critical Layer Thickness in the InGaN/GaN Heterostructures", Applied Physics Letters, vol. 75, No. 18, Nov. 1, 1999, pp. 2776-2778.

PCT International Patent Application No. PCT/US2006/022329, International Preliminary Report on Patentability issued Dec. 11, 2007, 7 pages.

PCT International Patent Application No. PCT/US2006/022329, International Search Report and Written Opinion mailed Dec. 12, 2006, 10 pages.

PCT International Patent Application No. PCT/US2006/045540, International Preliminary Report on Patentability issued Jun. 3, 2008, 12 pages.

PCT International Patent Application No. PCT/US2006/045540, International Search Report and Written Opinion mailed Jul. 6, 2007, 18 pages.

PCT International Patent Application No. PCT/US2006/046300, International Preliminary Report on Patentability issued Jun. 4, 2008, 7 pages.

PCT International Patent Application No. PCT/US2006/046300, International Search Report and Written Opinion mailed May 30, 2007, 10 pages.

Zhmakin, A. I., "Enhancement of Light Extraction from Light Emitting Diodes", Physics Reports, vol. 498, 2011, pp. 189-241.

PCT International Patent Application No. PCT/US2007/011075, International Search Report and Written Opinion mailed Jul. 11, 2008, 15 pages.

Zeisel et al., "DX-Behavior of Si in AlN", Physical Review B, Condensed Matter and Materials Physics, Third Series, vol. 61, No. 24, 2000, pp. R16283-R16286.

PCT International Patent Application No. PCT/US2007/07980, International Search Report and Written Opinion mailed Oct. 12, 2007, 14 pages.

PCT International Patent Application No. PCT/US2007/011075, Partial International Search Report mailed May 7, 2008, 2 pages.

* cited by examiner

| 1300 | Evacuate chamber |
|------|------------------|
| 1305 | Refill chamber with nitrogen gas |
| 1310 | Repeat steps 1300 and 1305 |
| 1315 | Pressurize chamber to 1 bar with a gas including, e.g., 95-100% $N_2$ and 0-5% $H_2$ |
| 1320 | Place source material in proximal end of crucible |
| 1325 | Place crucible in susceptor with its distal end in the high-temperature region |
| 1330 | Increase temperature of the crucible to about 1800 °C |
| 1335 | Maintain gas at a predetermined super-atmospheric pressure |
| 1340 | Ramp temperature to growth temperature |
| 1345 | During step 1340, continuously adjust pressure to maintain it at the pressure of step 1335 |
| 1350 | Once growth temperature is reached, drive mechanism is actuated to move crucible relative to the heated zone |
| 1355 | Maintain constant pressure during step 1350 |
| 1360 | Stop movement of the crucible |
| 1365 | Cool crucible to room temperature |

FIG. 13

DEFECT REDUCTION IN SEEDED ALUMINUM NITRIDE CRYSTAL GROWTH

RELATED APPLICATIONS

This application is a continuation-in-part of U.S. patent application Ser. No. 14/458,825, filed on Aug. 13, 2014 now pending, which is a continuation of U.S. patent application Ser. No. 13/669,630, filed on Nov. 6, 2012, now issued as U.S. Pat. No. 8,834,630, which is a continuation of U.S. patent application Ser. No. 12/015,957, filed on Jan. 17, 2008, now issued as U.S. Pat. No. 8,323,406, which claims the benefit of and priority to U.S. Provisional Application Ser. No. 60/880,869 filed Jan. 17, 2007. This application is also a continuation-in-part of U.S. patent application Ser. No. 13/173,213, filed on Jun. 30, 2011 now U.S. Pat. No. 9,028,612, which claims the benefit of and priority to U.S. Provisional Patent Application No. 61/360,142, filed Jun. 30, 2010. The disclosure of each of these applications is hereby incorporated by reference in its entirety.

GOVERNMENT SUPPORT

This invention was made with United States Government support under contract number DE-FC26-08-NT01578 awarded by the Department of Energy (DOE) and contract number 70NANB4H3051 awarded by the National Institute of Standards and Technology (NIST). The United States Government has certain rights in the invention.

FIELD OF THE INVENTION

The present invention relates to the fabrication of single crystal AlN, and, more specifically, to the fabrication of single crystal AlN having low planar defect densities.

BACKGROUND

Aluminum nitride (AlN) holds great promise as a semiconductor material for numerous applications, e.g., opto-electronic devices such as short-wavelength light-emitting diodes (LEDs) and lasers, dielectric layers in optical storage media, electronic substrates, and chip carriers where high thermal conductivity is essential, among many others. In principle, the properties of AlN may allow light emission down to around 200 nanometers (nm) wavelength to be achieved. The use of AlN substrates is also expected to improve high-power radio-frequency (RF) devices, made with nitride semiconductors, due to the high thermal conductivity with low electrical conductivity. Addressing various challenges can help increase the commercial practicability of such devices.

For example, large-diameter bulk AlN crystals (grown, for example, using the techniques described in U.S. application Ser. No. 11/503,660, incorporated herein in its entirety, referred to hereinafter as the "'660 application"), may in some circumstances grow with hexagonal-prism shaped cavities defects that are roughly 0.5 millimeter (mm) in diameter and 0.1 mm thick. Area concentrations as high as 100 cm$^{-2}$ have been observed in AlN slices that are cut to be 0.5 mm thick from these large diameter boules. Similar kinds of defects have been observed in the growth of other hexagonal crystals, such as SiC, and are commonly referred to as planar defects. These defects may be problematic for the further development of nitride-based electronics. In particular, they typically cause the surface of a substrate to roughen when they intersect the surface plane. They may also scatter light, which may be problematic for many opto-electronic applications that benefit from the transparency of AlN substrates at optical wavelengths between 210 and 4500 nm. Planar defects may also reduce the thermal conductivity around the defect, an effect that is generally undesirable for high-power devices in which the high intrinsic thermal conductivity of the AlN is useful. They may also introduce small angle grain boundaries into the AlN crystal and, thus, degrade the quality of the crystal by increasing the effective concentration of dislocations that thread through from one side of the wafer to the other (so-called threading dislocations) and that degrade the quality of surface preparation. Thus, the application of AlN substrates to the fabrication of high-performance, high-power opto-electronic and electronic devices may be enhanced if planar defects are reduced or eliminated.

Generally, planar defect formation in crystals grown by physical vapor transport (PVT) is caused by voids that get trapped in the growing crystal and that move and are shaped by the thermal gradients to which the crystal is exposed. A common cause identified in SiC crystal growth is poor seed attachment, where any kind of a microscopic void will commonly result in the formation of a planar defect (see, e.g., T. A. Kuhr, E. K. Sanchez, M. Skowronski, W. M. Vetter and M. Dudley, J. Appl. Phys. 89, 4625 (2001) (2001); and Y. I. Khlebnikov, R. V. Drachev, C. A. Rhodes, D. I. Cherednichenko, I. I. Khlebnikov and T. S. Sudarshan, Mat. Res. Soc. Proc. Vol. 640, p. H5.1.1 (MRS 2001), both articles being incorporated herein by reference in their entireties). In particular, poor seed attachment may cause voiding to occur between the seed and seed holder or may leave the back surface of the seed inadequately protected, allowing AlN material to sublime from that surface. For AlN crystal growth, crucible abnormalities, such as wall porosity or a seed mounting platform in which voids are present or can form, may also be a cause of voiding.

A typical planar defect 10 is shown schematically in FIG. 1. In some cases the shape of the planar defects is not perfectly hexagonal but modified or distorted and even triangular depending on the tilt between the planar void and the c-plane {0001} of AlN. In addition, there is typically a small-angle grain boundary 20 in the trail of the planar defect as shown in the schematic diagram, the origin of which is discussed below. The planar defect has a height $h_1$, and leaves a planar defect trail of length $h_2$ that extends back to the origin of the planar defect, typically the back of the seed crystal.

FIGS. 2A and 2B show optical microscopy images of a 2-inch diameter, c-face (i.e., c-axis oriented parallel to the surface normal of the wafer) AlN substrate taken after fine mechanical polishing. The right-side image (FIG. 2B) represents the same location as in the left-side image (FIG. 2A) taken in cross-sectioned analyzer-polarizer (AP) mode. The planar defect dimensions vary from 0.1 to 2 mm in width and up to 0.5 mm in depth, although they generally tend to be thinner (~0.1 mm) However, the base of the planar defect is typically misoriented with respect to the overall crystal (typically a small rotation about the c-axis), and thus there is a boundary between the original crystal and the slightly misoriented material that is below the planar defect. This boundary is defined by dislocations that account for the misorientation of the material below the planar defect.

Causes of Planar Defects

If the AlN seed is poorly attached in a way that allows material in the back of the seed to move under the temperature gradient, then this material movement may cause voids to "enter" the seed. This effect is due to the fact that every void has a small but defined axial gradient that drives material to be evaporated and then re-condensed within the void. The voids entering the AlN bulk material form well-defined hexagonal-prism shapes, probably because of the anisotropy in surface energy formation.

Migration of the Planar Defect in a Thermal Gradient and Resulting Degradation of Crystal Referring to FIGS. 3A and 3B, growth inside planar defects has been documented. The growth facet in FIG. 3B is pronounced, indicating faceted growth mode within the planar defect. Faceted growth mode usually results in a high-quality crystal. It can be expected, therefore, that the material quality within the planar defect is high and may be dislocation-free.

As the crystal grows, the planar defects effectively migrate toward the growth interface due to the axial temperature gradient within the void. Planar defects travel from the seed toward the growth interface because of the axial gradient across the planar height. As a result of this movement, the planar defects may leave "trails" (or imprints) of grain boundaries with very small misorientation angles. These small-angle grain boundaries are pronounced and shaped according to the planar defect symmetry. An example of this is shown in FIG. 4 and discussed below.

According to the traditional Read's model of low-angle grain boundaries, a boundary typically contains pure edge dislocations lying in the plane of the boundary. Therefore, after etching, the boundary is expected to exhibit a number of separated etch pits. The greater the distance between the pits, the smaller will be the misorientation angle. The grain boundary angle may be found using Frank's formula:

$$\frac{b}{D} = 2\sin\left(\frac{\theta}{2}\right), \quad (1)$$

where D is the distance between dislocations (etch pits), b is the Burgers vector of dislocation, and θ is the misorientation angle. In FIG. 4, the closest distance between the etch pits is ~12 micrometers (μm), and the Burgers vector for pure edge dislocation perpendicular to the [0001] planes is equal to the "a" lattice constant, i.e. 0.3111 nm Therefore, the azimuthal misorientation angle of the planar defect walls is expected to be about 0.0004° (or 1.44 arcsec).

Thus, in addition to the problems caused by the physical presence of planar defects, the formation and motion of planar defects in the crystal during growth may also degrade the overall crystal quality. This degradation results because of the slight misorientation between the planar defect body and the AlN bulk material. As the planar defect moves through the crystal, it leaves behind a grain boundary, as shown in FIG. 1. These grain boundaries typically show misorientation of about 2 arcseconds for individual planar defects. However, if the density of the planar defects is high, each of these randomly misoriented grain boundaries can add up and result in much higher "effective" misorientation and, as a result, much lower crystal quality. An alternative way to look at the degradation of crystal quality is to consider the increase in threading dislocation density due to the planar defects. As one may calculate from the micrograph shown in FIG. 4, each planar defect may create over $10^4$ dislocations/cm$^2$ in its wake.

Problems with Surface Preparation Due to Planar Defects

Planar defects may affect preparation and polishing of AlN wafers. The sharp edges of planar defects intersecting the AlN sample surface may chip off and cause scratching. In addition, planar defects—being related to the small-angle grain boundaries (SAGB)—may result in surface roughening (topography) during chemical-mechanical polishing (CMP) treatment.

FIGS. 5A and 5B respectively show the surface and the bulk depth of AlN containing planar defects and LAGB, where the images are obtained at the same location. It is clear that the planar defects and the SAGB cause surface roughening which, in turn, affects the epitaxial growth.

Problems with Optical Transparency and Thermal Conductivity

Planar defects may have a negative impact on the optical-transmission properties of AlN wafers because they scatter light due to the introduction of additional interfaces within the crystal, which separate regions with different refractive indices. In addition, while AlN substrates are attractive because of their high thermal conductivity (which can exceed 280 W/m-K at room temperature), planar defects may cause the thermal conductivity to diminish in a location directly above the planar defect because of the extra interfaces that are inserted at the planar defect boundaries as well as the thermal resistance of the volume of the planar defect itself. This local increase of the thermal resistance of the AlN substrate may reduce the usefulness of the AlN substrates for applications that require high power dissipation, e.g., high-power RF amplifiers and high-power, high-brightness LEDs and laser diodes.

Limitations of Existing Methods

As described in the '660 application, the production of large-diameter (i.e., greater than 20 mm) AlN crystals typically requires seeded growth. However, as discussed below, the seed holder and seed mounting technique on the holder are primary sources of planar defects in the AlN boules that are produced. The '660 application discloses a method for AlN seed attachment and subsequent crystal growth. Referring to FIG. 6, an AlN ceramic-based, high-temperature adhesive bonds the AlN seed to the holder plate and at the same time protects the back of the AlN seed from sublimation. In particular, an AlN seed 100 is mounted onto a holder plate 130 using an AlN-based adhesive 140. The AlN ceramic adhesive may contain at least 75% AlN ceramic and silicate solution that provides adhesive properties. One suitable example of such an adhesive is Ceramabond-865 available from Aremco Products, Inc.

In a particular version, the AlN seed is mounted using the following procedure:

(1) AlN adhesive is mixed and applied to the holder plate using a brush to a thickness not exceeding about 0.2 mm;

(2) The AlN seed is placed on the adhesive; and then (3) The holder plate along with the seed is placed in a vacuum chamber for about 12 hours and then heated up to 95° C. for about 2 hours.

This approach has proven successful in providing high-quality, large-diameter AlN crystal boules. However, planar defects as shown in FIGS. 2A and 2B will form. This problem is caused by the voids left behind as the silicate solution is either evaporated or absorbed by the AlN seed crystal or by Al escaping through the seed holder.

An alternative method for AlN seed attachment and subsequent crystal growth described in the '660 application involves mounting the AlN seed on a thin foil of Al on the holder plate. The Al is melted as the temperature of the furnace is raised above 660° C. (the melting point of Al), thereby wetting the back of the seed and the holder plate. As the temperature is raised further, the Al reacts with $N_2$ in the furnace to form AlN, which secures the seed to the holder plate. This technique may require that the AlN seed be held in place (either by gravity or mechanically) until a sufficient amount of the Al has reacted to form AlN, after which no further mechanical support is needed.

This technique, too, results in planar defects. The Al foil may melt and ball up, leaving empty spaces between agglomerations of liquid Al. The agglomerated liquid-Al metal may then react to form a nitride, leaving empty spaces between the seed and the seed holder. These empty spaces, in turn, can lead to planar defects once crystal growth is initiated on the seed crystal. The interaction between the AlN seed and the seed holder may also contribute to defects. Typically some amount of diffusion of either Al or N (or both) into the seed holder occurs at the temperatures used for crystal growth. For instance, a tungsten (W) seed holder may absorb both Al and N at the growth temperature, which can result in planar defects forming in the seed crystal and in the resulting boule grown from the seed crystal. In addition, the seed holder may have a thermal expansion coefficient different from that of the AlN crystal, which may cause defects in the seeded crystal or may induce voids to open up at the seed crystal/seed holder interface, resulting in planar defects during subsequent boule growth.

Another way to attach the seed crystal to the seed holder is to run a heat cycle under conditions whereby the seed is held onto the seed backing (e.g., by placing the seed crystal under an appropriate mass that holds the crystal down during this process), and heating the crystal up to a temperature above 1800° C. (and preferably above 2000° C.) to allow the seed to thermally, chemically and/or mechanically bond to the seed holder material. This approach is referred to herein as sinter bonding. The sintering process may, however, be difficult to control such that good bonding occurs without damaging the seed. In addition, it may be difficult to avoid leaving some space between the seed crystal and the seed holder. This space may be filled during processing with AlN that mostly comes from the seed crystal (even when vapors of Al and $N_2$ are supplied by having an AlN ceramic present in the crucible during the sintering process), and this AlN may induce planar defects to form in the seed crystal that may propagate into the single-crystal boule grown on the seed crystal.

To make large-diameter AlN substrates more readily available and cost-effective, and to make the devices built thereon commercially feasible, it is also desirable to grow large-diameter (>25 mm) AlN bulk crystals at a high growth rate (>0.5 mm/hr) while preserving crystal quality. As mentioned above, the most effective method of growing AlN bulk single crystals is the "sublimation-recondensation" method that involves sublimation of lower-quality (typically polycrystalline) AlN source material and recondensation of the resulting vapor to form the single-crystal AlN. U.S. Pat. No. 6,770,135 (the '135 patent), U.S. Pat. No. 7,638,346 (the '346 patent), and U.S. Pat. No. 7,776,153 (the '153 patent), the entire disclosures of which are incorporated by reference herein, describe various aspects of sublimation-recondensation growth of AlN, both seeded and unseeded. While these references recognize the benefits of a large axial (i.e., parallel to the primary growth direction) thermal gradient for optimizing material quality and growth rate of the growing AlN crystal, they utilize a growth apparatus designed to minimize the radial (i.e., perpendicular to the primary growth direction) thermal gradient. For example, axial thermal gradients may range from approximately 5° C./cm to approximately 100° C./cm, while radial thermal gradients are maintained as at negligible a level as possible. Likewise, other prior-art growth apparatuses utilize heavy insulation in order to minimize or eliminate the radial thermal gradient, as a minimized radial thermal gradient is expected to produce flat, high-quality crystals, particularly when efforts are made to grow crystals having large diameters. The radial gradient is typically minimized during conventional crystal growth in order to prevent formation of defects such as dislocations and low-angle grain boundaries. It is also minimized to make the surface of the growing crystal more flat, thus increasing the amount of useable material in the crystal (i.e., increasing the number of substrates that can be cut from the crystal for a given length of crystal).

FIG. 7 depicts an apparatus 700 utilized for the growth of AlN in accordance with the above-described prior art. As shown, a crucible 705 is positioned on top of a crucible stand 710 within a cylindrical susceptor 715. During the growth process, the susceptor 715 is translated within a heated zone created by surrounding heating coils (not shown), polycrystalline AlN source material 720 at the base 725 of the crucible sublimes at the elevated temperature, and the resulting vapor recondenses at the cooler tip 730 of the crucible due to the large axial thermal gradient between the base 725 and the tip 730, thus forming an AlN crystal 735. The apparatus 700 also features top axial shields 740 and bottom axial shields 745 designed and positioned to minimize the radial thermal gradient perpendicular to the growth direction 750 of AlN crystal 735. As shown, the tip 730 of the crucible 705 is cooler than the base 725 at least in part because apparatus 700 has fewer top axial shields 740 than bottom axial shields 745, allowing more heat to escape in the region of tip 730 and generating the desired axial thermal gradient. The top axial shields 740 may have centered holes therewithin to facilitate measurement of the temperature at tip 730 by a pyrometer 755. The centered hole diameter is minimized to reduce the heat flow but sufficient to form a practical optical path for the temperature sampling by the pyrometer 755. Additional pyrometers 760, 765 may also be utilized to measure temperatures at other regions of apparatus 700.

The ability to grow AlN single crystals at high growth rates would spur additional commercial adoption of the technology. While increasing the growth rate of AlN crystals is theoretically possible by increasing the Al supersaturation using larger axial thermal gradients, increases in the Al supersaturation may result in deterioration of the material quality of the crystal, or even in polycrystalline, rather than single-crystal, growth. Furthermore, the minimization or elimination of radial thermal gradients during AlN crystal growth unexpectedly tends to deleteriously impact the quality of the AlN crystal, particularly when attempts are made to grow large (e.g., >25 mm diameter) crystals at reasonable growth rates (e.g., >0.5 mm/hr). Thus, a need exists for systems and techniques enabling growth of such large AlN crystals at high growth rates while still preserving high material quality of the AlN crystal.

SUMMARY

Embodiments of the invention allow the reduction or elimination of planar defects during the growth of bulk aluminum nitride (AlN) crystals, i.e., boules. In particular, in some embodiments, the areal planar defect density is reduced to less than 100/cm$^2$ and, preferably, to less than 1/cm$^2$. As a result, the fabrication of crystalline AlN wafers larger than 20 mm in diameter with a thickness ranging from 0.1-1 mm and having planar defect density of less than 1 cm$^{-2}$ is enabled.

Key factors that enable growing seeded, large diameter, high quality AlN crystals include:

1.) The seed crystal itself is free of planar defects, as well as free from other kinds of defects that may form voids (that generally evolve into planar defects at the crystal growth temperature). A defect to be considered is subsurface damage that may be introduced into the seed crystal by the cutting and polishing process.

2.) The seed is attached to a seed holder (with seed holder being defined in the '660 application and described in detail above with reference to FIG. 6) in such a way as to prevent the formation of voids between the seed and the seed holder This may be accomplished by properly preparing the back surface of the seed (also referred to as the mounting surface of the seed, as opposed to the front surface of the seed that is used to seed the bulk crystal growth) as well as the surface of the seed holder. A film is then applied to the back of the seed, conforming microscopically with both the back surface of the seed as well as the seed holder. This film is preferably completely dense (i.e., no microscopic voids).

3.) The seed holder is relatively impervious to aluminum transport so as not to form voids in growing AlN crystal. In some examples, the film used to attach the seed to the seed holder is, itself, impervious to aluminum transport. In some of the implementations described below, the seed holder is only impervious to aluminum transport for a certain period of time. This time limitation generally limits the length of the AlN boule that can be grown.

Since a principal way the AlN crystal compensates for the diffusion of Al out of the crystal is by the formation of planar defects, the maximum allowable rate for transport through the seed holder assembly may be estimated for a given planar defect density. For instance, to keep the density of planar defects below $100/cm^2$, the maximum allowable number of atoms of Al that may be allowed to diffuse through the seed holder assembly is generally $<10^{20}/cm^2$ over the period of time that the AlN crystal is being grown. To keep the planar defect density below $1/cm^2$, the Al diffusion is preferably kept below $10^{18}$ atoms of Al per $cm^2$.

4.) Stress between the seed holder assembly and the seed is reduced. This may be achieved by (i) either the thermal expansion of the seed holder assembly nearly matching the thermal expansion of the AlN seed in the temperature range from room temperature up to the growth temperature (2200° C.), or (ii) the seed holder assembly being sufficiently mechanically flexible to absorb the thermal expansion mismatch through deformation while reducing the strain on the seed crystal and the resulting AlN boule. This factor does not typically allow the achievement of the third factor above by simply making the seed holder thicker.

5.) Generally, it is also desirable for the seed holder assembly to have enough mechanical strength to be able to support the growing AlN boule while, at the same time, providing a sealing surface to the crucible used to contain the AlN material and Al vapor (as described in the '660 application). However, the mechanical strength needed typically depends on the crystal growth geometry used. Less mechanical strength may be needed if the seed crystal is placed at the bottom of the crystal growth crucible; this geometry, however, may need tighter control of the AlN source material to prevent particles falling from the source material nucleating defects in the growing crystal.

Moreover, conditions for high quality AlN crystal growth are preferably followed, as described in the '660 application. In particular, super-atmospheric pressures may be successfully utilized to produce single crystals of AlN at relatively high growth rates and crystal quality. To achieve this, one or more of the following may be controlled: (i) temperature difference between an AlN source material and growing crystal surface, (ii) distance between the source material and the growing crystal surface, and (iii) ratio of $N_2$ to Al partial vapor pressures. Increasing the $N_2$ pressure beyond the stoichiometric pressure may force the crystal to grow at a relatively high rate due to the increased reaction rate at the interface between the growing crystal and the vapor. This increase in the growth rate has been shown to continue with increasing $N_2$ partial pressure until diffusion of Al from the source to the growing crystal (i.e., the negative effects of requiring the Al species to diffuse through the $N_2$ gas) becomes the rate-limiting step. Employing higher-pressure nitrogen may have the added benefit of reducing the partial pressure of aluminum inside the growth crucible, which may decrease corrosion within the furnace often caused by Al vapor inadvertently escaping the crucible. To grow high-quality AlN crystals, very high temperatures, for example exceeding 2100° C., are generally desirable. At the same time, high thermal gradients are needed to provide sufficient mass transport from the source material to the seed crystal. If not chosen properly, these growth conditions may result in evaporation of seed material or its total destruction and loss. The AlN seeded bulk crystal growth may be carried out in a tungsten crucible using a high-purity AlN source. The tungsten crucible is placed into an inductively heated furnace so that the temperature gradient between the source and the seed material drives vapor species to move from hotter high purity AlN ceramic source to the cooler seed crystal. The temperature at the seed interface and the temperature gradients are monitored and carefully adjusted, if necessary, in order to nucleate high-quality mono-crystalline material on the seed and not destroy the AlN seed.

Hereinafter, several ways to implement these concepts are described in detail, and specific examples of implementation are provided.

Embodiments of the current invention also achieve high growth rates (e.g., greater than approximately 0.5 mm/hr) of large, high-quality single-crystal semiconductors (e.g., AlN) by forming and maintaining non-zero axial and radial thermal gradients in the growth apparatus such that the ratio of the axial thermal gradient to the radial thermal gradient (the "thermal gradient ratio") is greater than zero and less than 10. (As utilized herein, a thermal gradient being maintained does not necessarily imply that it is held constant as a function of time, only that it is non-zero (and constant or fluctuating) over a period of time.) The size and the quality of growing crystals are generally influenced by the thermal field within the growth cell. The axial thermal gradient is the magnitude of the thermal field projected on the longitudinal symmetry axis in a cylindrical coordinate system. The radial thermal gradient is the projection of the thermal field magnitude on the azimuthal direction. Therefore, the thermal gradient in any other direction may be described as a superposition of the axial and radial thermal gradients (and thus may also be controlled as the axial and/or radial thermal gradients are controlled). The deliberate formation and control of the radial thermal gradient large enough to result in a thermal gradient ratio less than 10 contradicts the above-described conventional wisdom in which radial thermal gradients (which may depend at least in part on the dimensions and shape of the growth chamber), even if formed at all (e.g., unintentionally) are eliminated or minimized to small magnitudes.

In some embodiments, the radial thermal gradient and the axial thermal gradient are substantially balanced and, preferably, the thermal gradient ratio ranges from approximately 1.2 to approximately 5.5. In order to facilitate formation and control of the radial thermal gradients, crystal-growth apparatuses in accordance with various embodiments of the invention utilize different types, thicknesses, and/or arrangements of thermal shields, particularly in the area "behind" the growing crystal (i.e., corresponding to the location of the top axial shields 740 in FIG. 7). Thus, for embodiments featuring seeded growth of AlN single crystals, one or more shields are typically located opposite the growth surface of the seed. The one or more shields utilized in preferred embodiments of the invention include or consist essentially of one or more refractory materials, e.g., tungsten, and may be substantially thin, i.e., have thicknesses less than 0.5 mm, e.g., ranging from 0.125 mm to 0.5 mm.

In an aspect, embodiments of the invention may include a bulk single crystal of AlN having a diameter greater than 20 mm, a thickness greater than 0.1 mm, and an areal planar defect density may be less than or equal to 100 $cm^{-2}$.

One or more of the following features may be included. The areal planar defect density may be measured by counting all planar defects in the bulk single crystal and dividing by a cross-sectional area of the bulk single crystal disposed in a plane perpendicular to a growth direction thereof. The bulk single crystal may be in the form of a boule having a thickness greater than 5 mm. The areal planar defect density may be less than or equal to 1 $cm^{-2}$.

The single crystal AlN may be in the form of a wafer. The areal planar defect density may be less than or equal to 10 $cm^{-2}$. An areal planar defect density of planar defects intersecting each of a top and a bottom surface of the wafer may be less than or equal to 1 $cm^{-2}$.

In another aspect, embodiments of the invention may include a boule including a bulk single crystal of AlN having a diameter greater than 20 mm, a thickness greater than 5 mm, and an areal density of threading dislocations of less than or equal to $10^6$ $cm^{-2}$ in each cross-section of the bulk single crystal disposed in a plane perpendicular to a growth direction of the crystal. In some embodiments, the areal density of threading dislocations may be less than or equal to $10^4$ $cm^{-2}$.

In yet another aspect, embodiments of the invention feature a boule includes a bulk single crystal of AlN having a sufficient thickness to enable the formation of at least five wafers therefrom, each wafer having a thickness of at least 0.1 mm, a diameter of at least 20 mm, and a threading dislocation density of less than or equal to $10^6$ $cm^{-2}$. In some embodiments, each wafer may have a threading dislocation density less than or equal to $10^4$ $cm^{-2}$.

In still another aspect, embodiments of the invention include a boule including a substantially cylindrical bulk single crystal of MN having a diameter of at least 20 mm and having a sufficient thickness to enable the formation of at least five wafers therefrom, each wafer having a thickness of at least 0.1 mm, a diameter of at least 20 mm, and a triple-crystal X-ray rocking curve of less than 50 arcsec full width at half maximum (FWHM) for a (0002) reflection. Each wafer has substantially the same diameter as each of the other wafers.

In another aspect, embodiments of the invention include a method for growing single-crystal aluminum nitride (AlN). The method includes providing a holder including a backing plate, the holder (i) being sized and shaped to receive an AlN seed therein and (ii) including an AlN foundation bonded to the backing plate. An Al foil is interposed between the seed and the AlN foundation. The Al foil is melted to uniformly wet the foundation with a layer of Al. An AlN seed is disposed within the holder. Aluminum and nitrogen are deposited onto the seed under conditions suitable for growing single-crystal AlN originating at the seed.

One or more of the following features may be included. The back plate may be conditioned to reduce permeability of the back plate to Al. The seed crystal may be a wafer having a diameter of at least 20 mm. The grown single-crystal AlN may define a boule having a diameter approximately the same as a diameter of the seed crystal.

In another aspect, embodiments of the invention feature a method for growing single-crystal aluminum nitride (AlN). The method includes providing a holder sized and shaped to receive an AlN seed therein, the holder consisting essentially of a substantially impervious backing plate. An AlN seed is disposed within the holder. An Al foil is interposed between the seed and the backing plate. The Al foil is melted to uniformly wet the backing plate and the back of the AlN seed with a layer of Al. Aluminum and nitrogen are deposited onto the seed under conditions suitable for growing single-crystal AlN originating at the seed.

In another aspect, embodiments of the invention feature a method of forming single-crystal aluminum nitride (AlN). Vapor comprising or consisting essentially of aluminum and nitrogen is condensed within a growth chamber, thereby forming an AlN single crystal that increases in size along a growth direction. During the formation, a first (e.g., axial) non-zero thermal gradient is formed and maintained within the growth chamber in a direction substantially parallel to the growth direction, and a second (e.g., radial) non-zero thermal gradient is formed and maintained within the growth chamber in a direction substantially perpendicular to the growth direction. The ratio of the first thermal gradient to the second thermal gradient is less than 10.

Embodiments of the invention may include one or more of the following in any of a variety of combinations. Solid source material (which may include or consist essentially of, e.g., polycrystalline AlN) may be sublimed within the growth chamber to form the vapor. The second thermal gradient may be larger than 4° C./cm and/or smaller than 85° C./cm. The ratio of the first thermal gradient to the second thermal gradient may be greater than 1.2. The first thermal gradient may be larger than 5° C./cm and/or smaller than 100° C./cm. The ratio of the first thermal gradient to the second thermal gradient may be less than 5.5, or even less than 3.

Forming the second thermal gradient may include or consist essentially of arranging a plurality of thermal shields outside the growth chamber. Each of the thermal shields may include or consist essentially of a refractory material, e.g., tungsten. Each thermal shield may define an opening therethrough. The openings of the thermal shields may be substantially equal in size to each other. The opening of each thermal shield may range from approximately 10 mm to approximately 2 mm less than the dimension of the growth chamber substantially perpendicular to the growth direction. The openings of at least two of the thermal shields may be different in size. A first thermal shield having a first opening may be disposed between the growth chamber and a second thermal shield, the second thermal shield having a second opening larger than the first opening. At least two of the thermal shields may have different thicknesses. The thickness of each of the thermal shields may range from approximately 0.125 mm to approximately 0.5 mm.

The growth chamber may include a lid disposed between the AlN single crystal and at least one (or even all) of the thermal shields. The thickness of the lid may be less than approximately 0.5 mm. The lid may include or consist essentially of tungsten. A seed may be disposed within the growth chamber before forming the AlN single crystal, and the AlN single crystal may form on the seed and extend therefrom in the growth direction. The diameter of the seed may be greater than approximately 25 mm. The growth rate of the AlN single crystal may be greater than approximately 0.5 mm/hr. The AlN single crystal may form on a seed disposed within the growth chamber.

In another aspect, embodiments of the invention feature a crystal-growth system including or consisting essentially of a growth chamber for the formation of a single-crystal semiconductor material via sublimation-recondensation therewithin along a growth direction, a heating apparatus for heating the growth chamber, and a plurality of thermal shields arranged to form, within the growth chamber, (i) a first non-zero thermal gradient in a direction substantially parallel to the growth direction and (ii) a second non-zero thermal gradient in a direction substantially perpendicular to the growth direction. The ratio of the first thermal gradient to the second thermal gradient is less than 10.

Embodiments of the invention may include one or more of the following in any of a variety of combinations. Each thermal shield may define an opening therethrough. The openings of at least two of the thermal shields may be different in size. A first thermal shield having a first opening may be disposed between the growth chamber and a second thermal shield, the second thermal shield having a second opening larger than the first opening. At least two of the thermal shields may have different thicknesses. The thickness of each of the thermal shields may range from approximately 0.125 mm to approximately 0.5 mm Each of the thermal shields may include or consist essentially of a refractory material, e.g., tungsten. The thermal shields may be arranged with substantially equal spacings therebetween. A seed for nucleating the single-crystal semiconductor material thereon may be disposed within the growth chamber. The diameter of the seed may be greater than approximately 25 mm, and/or the seed may include or consist essentially of aluminum nitride. The ratio of the first thermal gradient to the second thermal gradient may be less than 5.5, or even less than 3. The ratio of the first thermal gradient to the second thermal gradient may be greater than 1.2.

In yet another aspect, embodiments of the invention feature a method for growing single-crystal aluminum nitride (AlN). An AlN seed (i.e., a seed crystal including, consisting essentially of, or consisting of AlN) is mounted on a seed holder, thereby forming a seed-seed holder assembly. The seed-seed holder assembly is disposed within a crystal-growth crucible. The crystal-growth crucible is heated to apply thereto (i) a radial thermal gradient of less than 50° C./cm and (ii) a vertical thermal gradient greater than 1° C./cm and less than 50° C./cm. Aluminum and nitrogen are deposited onto the AlN seed under conditions suitable for growing single-crystal AlN originating at the AlN seed.

Embodiments of the invention may include one or more of the following in any of a variety of combinations. AlN source material may be disposed within the crystal-growth crucible. The deposited aluminum and nitrogen may evolve from the AlN source material during heating of the crystal-growth crucible. The AlN source material may be at least partially polycrystalline. The seed-seed holder assembly may be affixed to a lid of the crystal-growth crucible. Mounting the AlN seed on the seed holder may include or consist essentially of disposing a foil between the AlN seed and the seed holder. The foil may be substantially impervious to aluminum transport and/or substantially impervious to nitrogen. The foil may include, consist essentially of, or consist of tungsten. The foil may include, consist essentially of, or consist of single-crystalline tungsten. The foil may include, consist essentially of, or consist of aluminum. The seed holder may be substantially impervious to aluminum transport and/or substantially impervious to nitrogen. A barrier layer may be disposed over at least a portion of a surface of the AlN seed. The barrier layer may include, consist essentially of, or consist of tungsten, Hf, HfN, HfC, W—Re, W—Mo, BN, Ta, TaC, TaN, Ta$_2$N, and/or carbon. The barrier layer may include, consist essentially of, or consist of tungsten. The AlN seed may include, consist essentially of, or consist of a wafer having a diameter or width of at least 20 mm. The grown single-crystal AlN may have a diameter (or width) greater than 20 mm, a thickness greater than 0.1 mm, and/or an areal planar defect density $\leq 100$ cm$^{-2}$. The areal planar defect density may be $\leq 1$ cm$^{-2}$. Any gap between the AlN seed and the seed holder may be minimized or substantially eliminated by positioning a weight on the seed-seed holder assembly. The weight may be positioned on the AlN seed. The weight may include, consist essentially of, or consist of tungsten. The weight may be removed from the seed-seed holder assembly prior to depositing aluminum and nitrogen onto the AlN seed.

The ratio of the vertical thermal gradient to the radial thermal gradient may be less than 10. The ratio of the vertical thermal gradient to the radial thermal gradient may be less than 5.5. The ratio of the vertical thermal gradient to the radial thermal gradient may be less than 3. The ratio of the vertical thermal gradient to the radial thermal gradient may be greater than 1.2. The radial thermal gradient may be larger than 4° C./cm. The vertical thermal gradient may be larger than 5° C./cm. Applying the radial thermal gradient may include, consist essentially of, or consist of arranging a plurality of thermal shields outside the crystal-growth crucible. One or more (even all) of the thermal shields may include, consist essentially of, or consist of a refractory material. One or more (even all) of the thermal shields may include, consist essentially of, or consist of tungsten. One or more (even all) of the thermal shields may define an opening therethrough. The openings of the thermal shields may be substantially equal in size to each other. The openings of one or more (even all) of the thermal shields may range from approximately 10 mm to approximately 2 mm less than a dimension of the growth chamber substantially perpendicular to a growth direction along which the single-crystal AlN grows. The openings of at least two (even all) of the thermal shields may be different in size. A first thermal shield having a first opening may be disposed between the crucible and a second thermal shield, the second thermal shield having a second opening larger than the first opening. At least two (even all) of the thermal shields may have different thicknesses. The thickness of each of the thermal shields may range from approximately 0.125 mm to approximately 0.5 mm.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. Unless otherwise indicated, "radial" generally refers to a direction substantially perpendicular to the primary crystal growth direction and/or the long axis of the crystal and/or the crystal-growth apparatus. Refractory materials are generally materials that are physically and chemically stable at temperatures above approximately 500° C. As used herein, the term "substantially" means±10%, and, in some embodiments, ±5%. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 13 is a table listing various steps of a process for growth of semiconductor crystals such as AlN in accordance with various embodiments of the invention.

DETAILED DESCRIPTION

In accordance with some embodiments of the invention, one or more of the measures described below may be taken to reduce defect generation during seeded AlN growth of, e.g., boules.

As used herein, boule means an as-grown crystal of AlN that has predominately (more than 50%) a single orientation. To be technologically useful, the boule is preferably at least 20 mm in diameter and more than 5 mm in length, and the orientation preferably varies by no more than 1.5° across the width of the boule.

As used herein, wafer means a slice of AlN cut from a boule. Typically, a wafer has a thickness of between 0.1 mm to 1 mm and a diameter greater than 20 mm. However, wafers thinner than 0.1 mm, while fragile, may be technologically useful for some specialized applications (for instance, in an application where optical transmission through the wafer is critical).

High quality bulk single crystal AlN having low planar defect densities, and methods for formation thereof, are disclosed herein. Referring again to FIG. 4, each planar defect may create over $10^4$ dislocations/cm$^2$ in its wake. Thus, to prepare AlN wafers (which are thin slabs, typically 0.1 to 1 mm thick, cut from the bulk crystal) with threading dislocation densities (TDD) below $10^6$/cm$^2$, the areal planar defect density (defined as the number of planar defects that have passed through a unit area in the bulk crystal) is generally kept below 100/cm$^2$ or below 1/cm$^2$ if the TDD is to be kept below $10^4$/cm$^2$. An areal planar defect density may be measured by counting all planar defects in a bulk single crystal and dividing by a cross-sectional area of the bulk single crystal disposed in a plane perpendicular to a growth direction thereof. Because the temperature gradient along the crystal height increases toward the seed, so one may generally expect that the density of planar defects would decrease toward the growth interface (crown).

Figure 1:
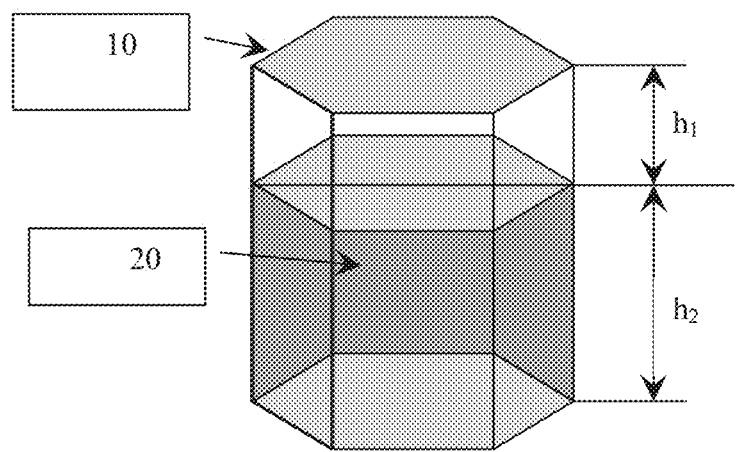
FIG. 1 is a schematic diagram showing an idealized planar defect that typically appears as a hexagonal void in an AlN crystal.
Figure 2A:
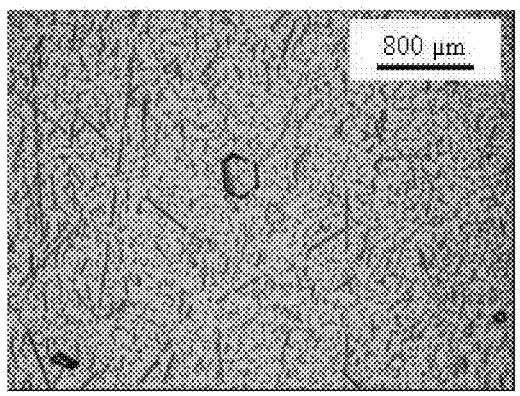
FIGS. 2A and 2B are optical micrographs of AlN single crystal sample containing planar defects: A) an optical image showing one planar defect, and B) image taken from the same location in birefringence contrast showing multiple planar defects just underneath the surface.
Figure 2B:
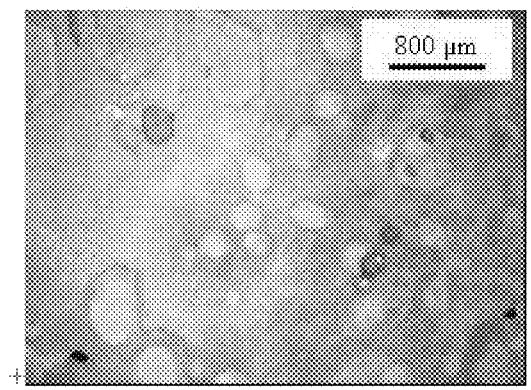
Figure 3A:
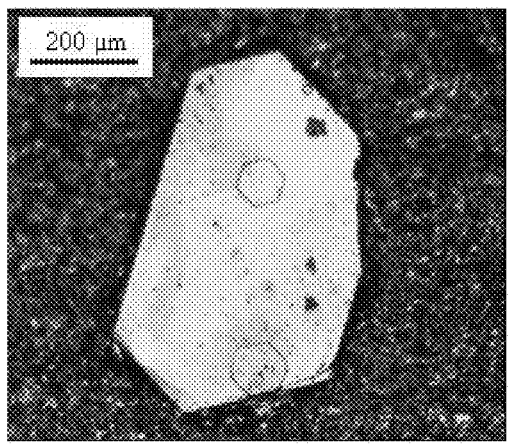
FIGS. 3A and 3B are micrographs demonstrating growth features inside planar defects, that are due to the movement of the planar defects during the crystal growth, with FIG. 3A being an optical micrograph, and 3B being a micrograph taken in Nomarski Differential Image Contrast (NDIC)
Figure 3B:
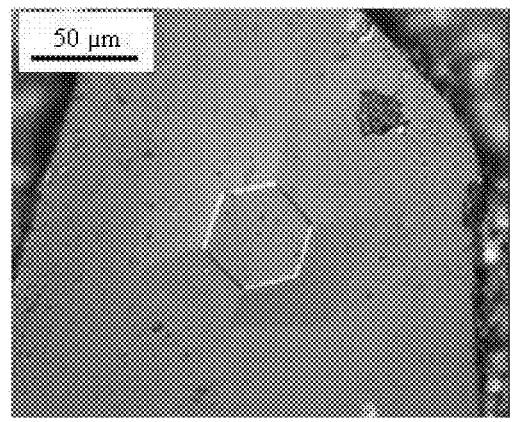
Figure 4:
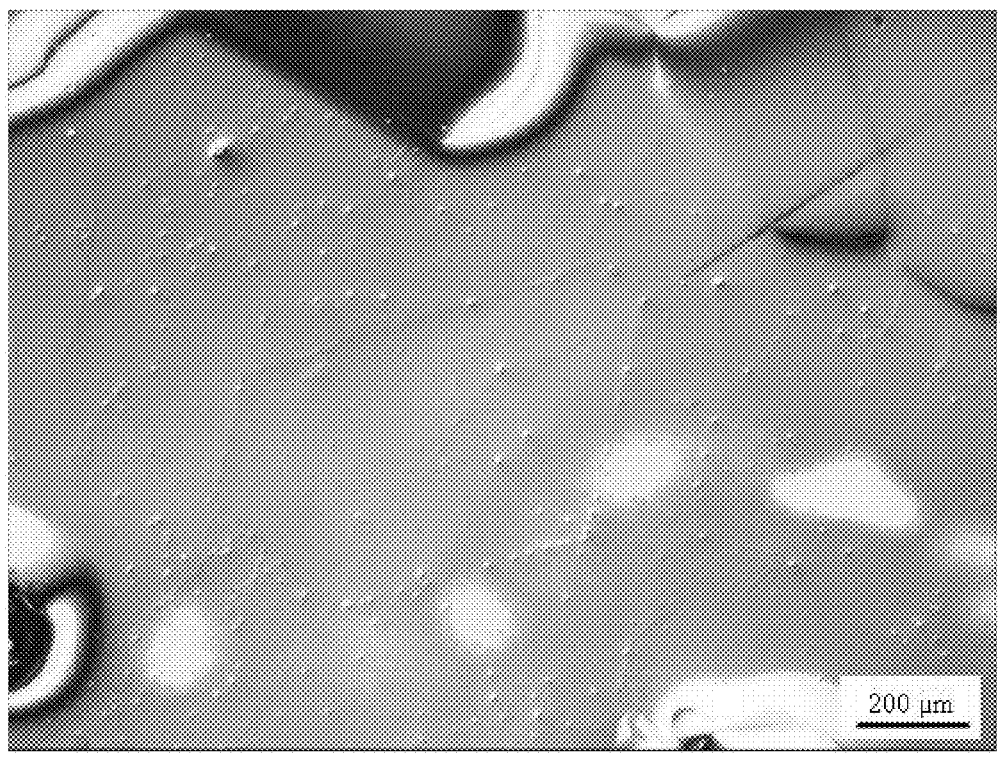
FIG. 4 is an NDIC micrograph of the planar defect wake and grain boundaries marked by an etch pit associated with dislocations.
Figure 5A:
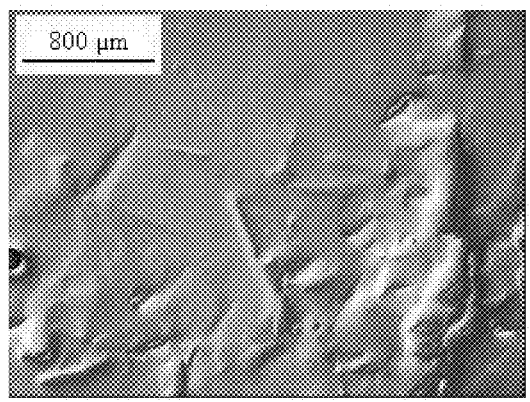
FIGS. 5A and 5B are micrographs illustrating the effect of the low-angle grain boundaries due to planar defects on the surface finish, with FIG. 5A taken after the CMP process, and 5B being a birefringence contrast image from the same location showing planar defects.
Figure 5B:
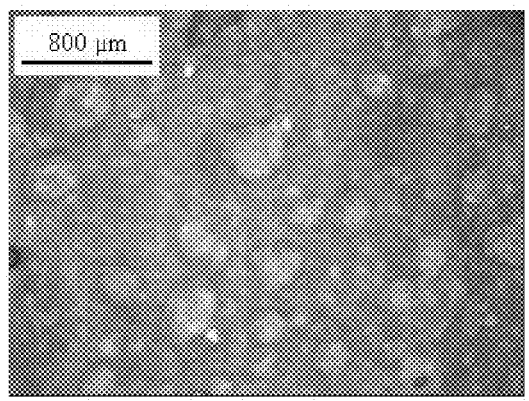
Figure 8A:
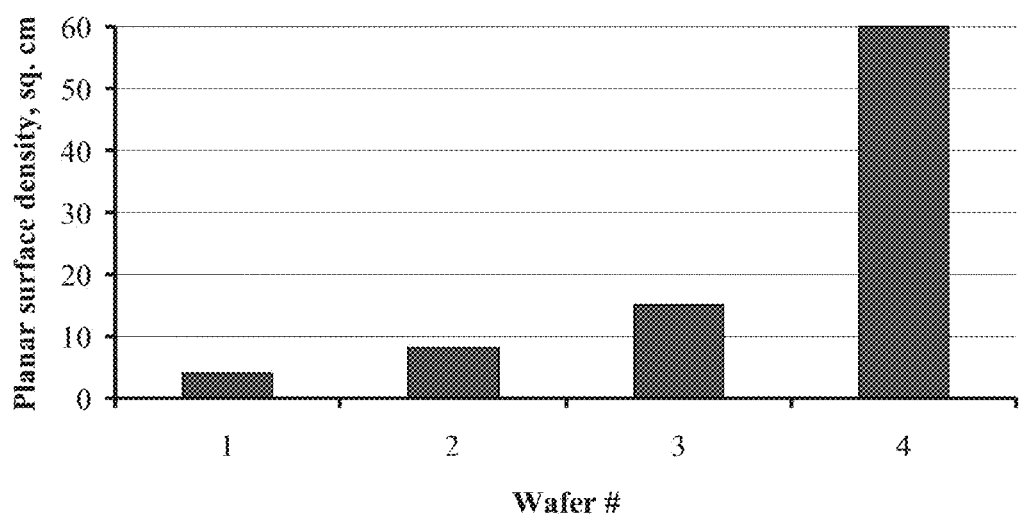
FIG. 8A is a graph illustrating the axial distribution (along the growth axis) of the density of planar defects intersecting the surface of a slice through the boule: wafer #1 is closest to the growth interface while wafer #4 is closest to the seed.

An illustration of this effect in AlN boules is shown in FIG. 8A, that shows the axial distribution (along the growth axis) of the density of planar defects that intersect the surface of the wafer, with wafer #1 being closest to the growth interface (crown) while wafer #4 is closest to the seed. The planar defects that intersect the surface of wafer #1 have passed through the region of the boule represented by wafer #4, which may be observed by etching their trails as shown in FIG. 4. Since it may be difficult to see all the planar defects in a thick boule, the areal density may be measured by cutting a thin slice (0.1 to 0.8 mm thick) from the boule perpendicular to the growth direction and polishing both surfaces of the slice with any anisotropic etch. The areal planar defect density may then be estimated by totaling the number of planar defects observed in the slice (both on the surface and under the surface) and the number of planar defect trails that are observed on the surface of the slice due to the preferential etching of defects, and then dividing by the area of the slice. As FIG. 8A shows, the areal density of planar defects measured in a slice near the original seed crystal will generally be higher than the areal density measured near the crown. Thus, to get the true areal planar defect density (and, thus, determine the number of low defect wafers that can be sliced from the boule) a slice from the boule is preferably selected from near the seed side of the boule. The areal densities of planar defects in wafers or seed plates sliced from a boule may be measured in the same way. High-resolution x-ray diffraction (XRD) rocking curves are a commonly used indication of the crystal quality and may be used to estimate the dislocation density. See Lee et al., "Effect of threading dislocations on the Bragg peakwidths of GaN, AlGaN, and AlN heterolayers," Appl. Phys. Lett. 86, 241904 (2005), incorporated by reference in its entirety. Based on this paper, it can be estimated that to obtain less than 50 arcsec full width at half maximum (FWHM) for a triple-crystal x-ray rocking curve of the (0002) reflection (for a c-face wafer), the areal planar defect density is preferably below 100/cm$^2$.

The yield from a boule (the number of wafers that can be sliced from the boule that meet the size and defect specification) may be increased by reducing the areal density of planar defects in the boule and by increasing the length of the boule. Preferably, a technologically useful boule yields at least 5 wafers that meet the size and defect specifications.

1. Preparation of the Seed Crystal

Figure 7:
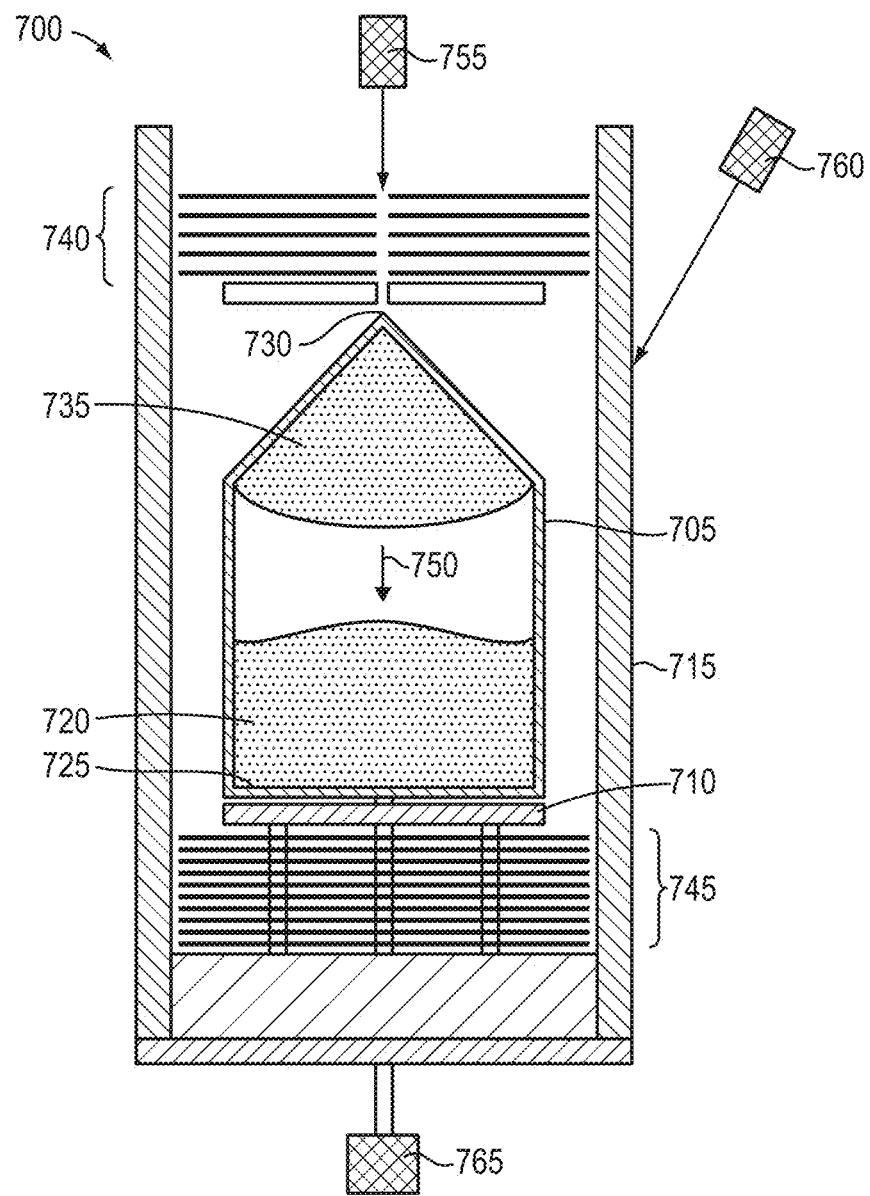
FIG. 7 is a schematic cross-section of a crystal-growth apparatus in accordance with the prior art in which radial thermal gradients are minimized or eliminated.

In the implementations discussed below, a high quality AlN seed crystal is prepared. The AlN seed crystal is preferably cut from a single-crystal boule grown as described herein (i.e., a portion or all of a resultant boule is used to form seed plates for subsequent crystal growth). Typically the seed crystals are cut as round plates of about 2 inches (50-60 mm) in diameter and having a thickness ranging from 0.2 up to 5.0 mm. However, smaller area seeds may also be prepared to be able to select seeds formed from very high quality regions of a boule of nonuniform quality or because a different crystal orientation is desired. These smaller diameter seeds may be mined from AlN crystal boules grown as described herein. Seed plates or smaller area seed crystals may also be prepared by slicing AlN boules fabricated by other techniques, such as the technique described in the '660 application where a high quality encased AlN seed crystal, formed by self nucleation, is used to seed the AlN crystal growth and the crystal growth crucible is arranged so as to expand the diameter of the resultant AlN boule up to 2 inches in diameter, as shown in FIG. 7 of that application. In all cases, it is important that high quality, nearly defect free seeds be selected, because defects in the seed crystal(s) may be duplicated in the AlN boule to be produced. In particular, the areal density of planar defects in the seed crystals is preferably below 100 cm$^{-2}$ and, even more preferably, below 1 cm$^{-2}$. If multiple small area seeds are to be used simultaneously, the orientation of each seed is preferably carefully controlled so that the seeds can be matched when they are mounted on the seed holder.

The orientation of the seed crystal plate (or of the smaller seed crystals) is typically with the c-axis parallel to the surface normal of the plate (a so-called c-axis seed plate), but other orientations and sizes are suitable as well. The surface of the AlN seed crystal that will face the seed holder assembly (the seed back side) is preferably smooth and flat with a total thickness variance (TTV) of less than 5 µm and preferably less than 1 µm so that gaps between the seed crystal and the seed holder assembly are reduced. A "smooth surface," as used herein, is a surface that has no scratches visible when viewed with an optical microscope under 200× magnification and that the root mean square (RMS) roughness measured with an atomic force microscope (AFM) is less than 1 nm in a 10×10 µm square area. Optical measurement techniques are effective for measuring the TTV.

The top surface of the AlN seed crystal (which will serve as the nucleation site of the AlN crystal boule) is preferably smooth. In addition, any crystal damage in the top surface of the AlN seed crystal that may have resulted from cutting or polishing the seed crystal is preferably removed prior to attaching the seed crystal to the seed holder. This subsurface damage (SSD) layer may be removed in accordance with methods described in U.S. Ser. No. 11/363,816 (referred to hereinafter as the "'816 application") and Ser. No. 11/448,595 (referred to hereinafter as the "'595 application"), both of which are incorporated herein by reference in their entireties. An exemplary method includes performing a CMP step by applying an abrasive suspension in a solution consisting essentially of a hydroxide. Another exemplary method is a CMP process that includes polishing a substrate using a slurry including an abrasive suspension in a solution capable of modifying the surface material of the substrate and creating a finished surface suitable for epitaxial growth. The active solution chemically modifies the surface of the substrate, forming a compound softer than the underlying substrate material. The abrasive is selected to be harder than the newly created compound, but softer than the substrate material, so that it polishes away the newly formed layer, while leaving the native substrate surface pristine and highly polished.

The specific recipe for SSD removal depends on the seed orientation. Removal of the SSD layer is important as it preferentially thermally etches, leaving void and defect spaces as well as irregular topography at the interface between the seed crystal and the resulting AlN boule that may compromise crystal growth and may result in planar defects. In particular, improvements in polishing of the seed crystal may improve the quality of the boule growth by reducing defects during thermal cycling. A suitable seed will have planar and/or extended voids of less than 1 per square centimeter intersecting either surface of the seed, less than one scratch of 10 nm depth within a 10×10 µm square AFM scan and less than one crack per cm$^2$.

Other defects that are preferably avoided include pits, grain boundaries (including polarity inversions) and cracks. In addition, surface contamination due to, for instance, polishing, handling, and oxidation, is undesirable. Void formation from the inclusion of scratched material is a risk. Areas with SSD are more likely to thermally etch during the seed mounting heating cycle. Thermal etching of the AlN seed crystal or backing material may create a void space. In addition, SSD represents damaged crystal lattice within the seed crystal. Defective crystal lattice within the seed crystal is generally replicated within the grown boule and may lead to the creation lower quality wafers that are cut from that boule. Thermal etching of the seed crystal may be mitigated by using a lower mounting temperature (lower mounting temperature may reduce thermal etching) or by gas species/pressure choices (high pressure N$_2$/argon/xenon, etc. may suppress thermal etching) but may leave SSD that will be replicated in the seeded growth.

Voids present in the seed material may create voids in the grown boule. Voids intersecting the back surface of the seed may lead to seed mounting difficulties. Voids intersecting either the seed holder or growth interface surface of the seed may present contamination issues (trapped material). Therefore, seeds for seeded growth desirably are either cut from boules that have been grown by these void-free methods or cut from AlN boules generated by self-nucleation techniques described in the '660 application.

In particular, as discussed in the '660 application, two conditions may be considered to employ self-nucleation in the preparation of AlN boules. First, there is a nucleation barrier to the growth of AlN on tungsten. That is, the vapor above a tungsten crucible tends to be supersaturated unless AlN nuclei are available for growth. To take advantage of this, a seeded region may take up some part of the full diameter seed mounting plate that is surrounded by an unseeded, bare region. Since adsorption of aluminum and nitrogen from the vapor onto the seed is favored over deposition onto the bare crucible wall, the seed is favored to expand laterally in favor of creating new self-seeded critical nuclei next to the seed. Under properly controlled conditions this process can be used to increase the seeded area per growth cycle. Secondly, the process of crystal growth requires heat extraction which is controlled by arrangements of insulators/heaters in the system. Properly arranging insulation so that the seed is the coolest part of the upper crucible and cooler than the source during growth is important to the process. Further tailoring this insulation when using a small seed to be expanded during the growth aids in expansion of the seed by making the seed cooler than the unseeded lateral region. This thermal arrangement makes self-seeded nucleations neighboring the seed less favored by limiting heat extraction. As the crystal grows at high temperature and with sufficient source material, given sufficient time to reach an equilibrium point during the growth run the interface of the crystal will follow the isotherms of the system (insulation/heaters, etc.). The proper interface shape to favor seed expansion is slightly convex in the growth direction; the curvature of the gradient aids expansion.

Residual SSD may be identified and other defects such as threading dislocations (TDD) may be revealed with a defect etch using a KOH vapor/solution or with a KOH-enhanced CMP, as described in Bondokov et al. in "Fabrication and Characterization of 2-inch Diameter AlN Single-Crystal Wafers Cut From Bulk Crystals" [Mater. Res. Soc. Symp. Proc. Vol. 955 (Materials Research Society, Pittsburgh, 2007) p. 0955-103-08]. The density of the pits measured in these defect etches is referred to as etch pit density (EPD). For seeded growth, it is generally desirable to start with seeds that have less than $10^4$ EDP. It is possible to improve grown boule over seed quality, but it is preferable to start with high quality seeds. It is also important to avoid cracking the seed.

2. Detailed Example of a Seed Crystal Preparation

The procedure used to prepare the seed crystal surface depends on its crystallographic orientation, as described in the '816 application and '595 application. Briefly, as described in those applications, crystallographic orientation affects mechanical preparation of a substrate surface prior to CMP processing; substantial differences exist for optimal substrate preparation. For example, in the case of an AlN substrate, the Al-terminated c-face is not reactive with water, but the N-terminated c-face is reactive with water, along with non-polar faces. During wet lapping and polishing, the Al-polarity face tends to chip under the same conditions that are well-suited to mechanically polish the non-Al-polarity faces or Al-polarity faces where the c-axis is oriented 20 degrees or more away from the surface normal of the substrate.

Here, we describe an exemplary process for preparing a c-axis seed plate where the nitrogen-polarity face (N-face) will be attached to the seed holder assembly and the aluminum-polarity face (Al-face) will be used to nucleate the AlN boule. After an appropriately oriented seed plate is cut from an AlN boule using a diamond wire saw (the seed plate is cut such that the c-axis is within 5° of the surface normal), the surfaces are ground flat and then diamond slurries (with progressively decreasing diamond size) are used successively to further mechanically polish both surfaces of the seed plate. More specifically, the N-face of the as-sliced AlN wafers undergoes grinding (with 600 diamond grit), lapping (6 µm diamond slurry), and fine mechanical polishing with 1 µm diamond slurry. Then, the wafer is flipped over and the Al-face undergoes grinding (with 600 and 1800 diamond grit), lapping (6 µm and 3 µm diamond slurries), and fine mechanical polishing with 1 µm diamond slurry followed by the CMP, as described in the '816 application where a high pH silica suspension in a KOH solution is used to leave an Al-polarity, c-face surface that is free of SSD.

These mechanical polishing steps may be followed by a CMP step on the N-face of the seed crystal (which is the back surface that will be mounted facing the seed holder assembly in this example). A suitable slurry is a 1 µm $Al_2O_3$ slurry with active chemical solution (the slurry is made of 100 grams of 1 µm $Al_2O_3$ grit per 1 liter of solution composed of 0.5M KOH in distilled water (1 liter) with an additional 50 mL of ethylene glycol). The slurry is used on a soft composite iron polishing deck such as the AXOS from Lapmaster, Inc.), leaving the surface highly reflective to the eye and free of defects such as scratches or pits or open cracks. The grit choice and active chemical reaction between the AlN and the strong base (KOH) are important for producing a surface with low defect densities. A preferred surface has less than 1 scratch deeper than 10 nm per 10 square µm scan with an AFM and the RMS roughness measured with an AFM is less than 1 nm in a 10×10 µm area. In addition, the back side of the seed crystal surface preferably has a TTV of less than 5 µm and more preferably less than 1 µm. This is important because surface topography, even at a microscopic level, may result in planar defects forming in the seed crystal; these defects may propagate into the crystal boule during subsequent growth. The flatness of the polished surfaces is checked using a suitable optical flat and monochromatic light source (sodium lamp at 590 nm).

The Al-face is then subjected to a final CMP step after the 1 µm diamond polishing step using a silica suspension from Cabot Industries (Cabot 43). Additional techniques for preparing the surface of the seed crystals are described in the '816 application and the '595 application. For example, as noted above, the CMP process may include polishing a substrate using a slurry including an abrasive suspension in a solution capable of modifying the surface material of the substrate and creating a finished surface suitable for epitaxial growth. The active solution may modify the surface of the substrate, forming a compound that is softer than the underlying substrate material. The abrasive may be selected to be harder than the newly created compound, but softer than the substrate material, so that it polishes away the newly formed layer, while leaving the native substrate surface pristine and highly polished. In some CMP processes, the slurry may include an abrasive suspension in a solution consisting essentially of a hydroxide.

The seed crystal is now ready for mounting on one of the seed mounting assemblies described below and is preferably carefully stored in a nitrogen atmosphere glove box to avoid any contamination prior to growth.

3. Seed Holder Plates

Different structures have been developed for the seed holder plate. The preferred approach depends on the particular circumstances used for crystal growth.

3.1. Textured AlN Deposited on a Backing Plate

Figure 8B:
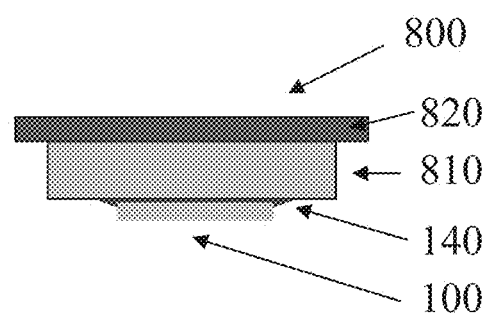
FIG. 8B is a schematic diagram illustrating the bonding of an AlN seed to a seed holder, (which, in a preferred implementation, includes, consists essentially of, or consists of an AlN foundation on a W backing plate)

Referring to FIG. 8B, in an embodiment, a seed holder 800 may include a relatively thick, highly textured AlN layer, i.e., foundation 810, deposited on a metal backing plate 820, e.g., W foil. The holder 800 is sized and shaped to receive an AlN seed therein. Preparation of a preferred embodiment may include one or more of the following three features:

a.) The use of a seed holder including an AlN foundation bonded to an appropriate backing plate (in a preferred embodiment, this backing plate is W foil);

b.) Appropriately conditioning the backing plate so that it is nearly impervious to Al diffusion through the plate; and/or c.) Using Al foil to form an adhesive 140 to bond the seed to the AlN ceramic or seed plate by heating the seed plate/Al foil/AlN seed crystal to high temperature rapidly enough so that the Al first melts and uniformly wets the AlN with a very thin layer of Al before converting into AlN.

In an embodiment, the W foil has a thickness of 20 mils to 5 mils (510 to 130 µm). A thinner W foil may be desirable to reduce the stress that the seed plate will apply to the seed crystal and the resulting boule due to the thermal expansion mismatch between the AlN and seed mounting W plate. The thickness of foil used for the mounting plate may be chosen such that the specific vendor/lot of W-foil provides a relatively impervious barrier to aluminum and/or nitrogen. This W-backing or barrier layer is preferably made from high density material (for tungsten>98% theoretical density) and may be made of multiple layers of grains allowing grain swelling to close fast diffusion paths between grain boundaries. The latter approach has also been described in U.S. patent application Ser. No. 11/728,027 (referred to hereinafter as the "'027 application"), incorporated herein by reference in its entirety. As discussed therein, machining of powder metallurgy bars including tungsten grains having substantially no columnar grain structure is an exemplary method of forming multilayered and/or three-dimensional nominally random tungsten grain structures that can help prevent permeation of aluminum through the tungsten material. In addition, this W backing plate may be made from single crystal tungsten that may not have any grain boundary diffusion.

The W foil is preferably cleaned and conditioned with aluminum prior to crystal growth. The foil may be further conditioned by applying additives such as Pt, V, Pd, Mo, Re, Hf, or Ta. Thicker layers of tungsten may be used to limit Al diffusion through the backing plate but they will suffer from increased thermal expansion mismatch between the materials leading to higher cracking densities in the grown AlN crystals.

The polycrystalline W foil is preferably made of layers of grains. These stacked and compressed pure W-grains contain path ways between the grains (where the grains meet neighboring grains) that allow diffusion paths between the grains. Loss of aluminum is primarily through these grain boundaries and leads to voids (planar or extended) in the AlN. In time, as these W grains absorb Al atoms through diffusion into the W grains, the W grains will swell as much as 5%, as Al is a substitutional impurity in W and has approximately a 5% solubility. As detailed in the '027 application, these swollen grains will decrease the grain boundary diffusion rate. The Al-conditioning may be achieved at growth temperature by processing similarly to the described AlN-foundation process. Rather than using Al to condition the W foil, other materials such as Pt, V, Pd, Mo, Re, Hf, or Ta may be used to decrease the amount of Al lost through grain boundaries by swelling, filling or decreasing the grain boundary density in the W backing plate.

In the cases of Pt, V, or Pd, the elements may be applied (painted, sputtered, plated or added as foils) to the W foil and run through a heating cycle, preferably above the melting point of the added material but below the melting point of the tungsten, to allow the added element to melt, leading to reaction with the W grains. This tends to cause the W grains to swell and to decrease both the time and Al required to further swell the grains and reduce Al losses through grain boundary diffusion.

In the cases of Mo and Re, the elements may be mixed with the W to form an alloy. These alloys have a lower eutectic point with the Al present under growth conditions. This means that backing material composed of these alloys may not be suitable at as high a growth temperature as pure tungsten. The lower eutectic point means that exaggerated grain growth tends to be faster than pure W with the same Al exposure conditions. While care must be taken to ensure that there are enough layers of grains in these alloy foils, the surface layers of grains will quickly swell on exposure to Al vapor, which will prevent further Al diffusion along the their grain boundaries. An additional advantage of Mo and Re alloys with tungsten is that these alloys may have a smaller thermal expansion mismatch with AlN, which will improve the cracking yield (i.e., fewer boules will be cracked).

In the cases of Hf and Ta, the applied layers on the W-foil may be reacted to form additional film or barrier layers on the W foil which will help to fill the grain boundaries in the W foil. The Hf or Ta can be applied to the W-foil surface by adding powder, foil, sputtering or plating. The pure element spread over the polycrystalline W foil can then be reacted with nitrogen or carbon to form HfN, HfC, TaC or TaN which will aid in sealing grain boundaries and will reduce the grain boundary diffusion rate through the W foil. These nitride or carbide compounds could be applied directly as well provided they could be applied in continuous layers forming a minimum of additional pathways or grain boundaries through the layer.

Figure 9:
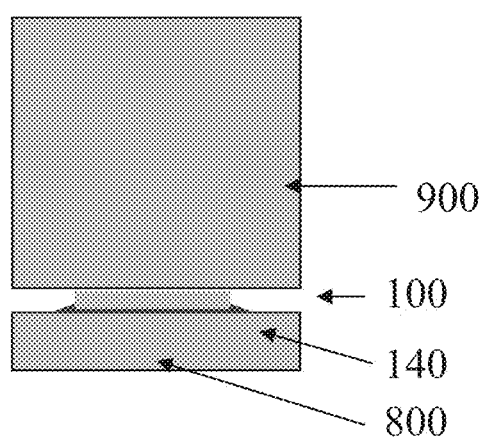
FIG. 9 is a schematic diagram illustrating the technique for bonding an AlN seed crystal to a seed holder, which, in a preferred implementation, uses Al-foil nitridation.

Referring to FIG. 9, a single-crystal seed 100 is attached to a seed holder 800 using a weight 900. The single-crystal seed 100 attached to the seed holder 800 by, e.g., adhesive 140. The important elements of this approach are: (i) that the AlN foundation, if properly formed, provides a nearly perfect thermal expansion match to the growing AlN boule as well as an excellent chemical match; (ii) the backing plate, when properly conditioned, provides a nearly impervious barrier to Al diffusion; and (iii) the rapid thermal processing of the Al foil along with excellent polishing of the AlN seed and the AlN foundation, provides a tight and dense bond between the foundation and the seed that will help prevent planar defects from forming.

4. Preferred Implementations

In a preferred embodiment, a polycrystalline AlN foundation is produced by the sublimation-recondensation technique described in the '660 application, in which a relatively thick (3 to 5 mm) layer of AlN material is deposited directly onto a metal foil or plate. The process includes sublimation, wherein the source vapor is produced at least in part when crystalline solids of AlN or other solids or liquids containing AlN, Al, or N sublime preferentially. The source vapor recondenses on a growing seed crystal. It may be desirable to have the thickness of the AlN deposit be more than 10 times the thickness of the metal plate so that the relative stiffness of the AlN layer substantially exceeds that of the metal plate. In this manner, the majority of the strain from any thermal expansion mismatch between the metal plate and the AlN foundation plus seed crystal (plus crystal boule after growth) may be taken up by the metal plate. It may be desirable to not have the thickness of the foundation layer be too large, because a greater thickness may limit the size of the eventual crystal boule to be grown. For this reason, the thickness is preferably limited to less than 20 mm We have found that deposition of the AlN under typical growth conditions described in the '660 application can result in a highly textured AlN film. In this context, a textured film means that almost all of the AlN grows in the form of grains having a c-axis (the [0001] direction using standard notation for hexagonal crystals) oriented parallel to the surface normal of the growing film. The diameter of the grains in the plane perpendicular to the growth direction (i.e., perpendicular to the [0001] crystallographic direction) is typically 0.1 to ~2 mm in size. An advantage of this highly textured film is its beneficial impact, derived from the fact that AlN has various thermal expansion coefficients that depend on the crystallographic direction. A polycrystalline film where the individual grains were randomly oriented may crack as it is cycled from the growth temperature of approximately 2200° C. to room temperature.

While the AlN is being deposited on the W foil, the surface of the W foil may become saturated with Al which, we have observed, will greatly reduce further diffusion of Al through the foil. This phenomenon is described in '027 application, where it is noted that the penetration rate of aluminum along grain boundaries is reduced after the tungsten grains have swelled due to uptake of Al by bulk in-diffusion. It may be desirable to form the polycrystalline W foil so that it contains multiple layers of W grains. We have found that W foil that is 0.020 to 0.005 inch thick (e.g., material supplied by Schwarzkopf, H C Starck, H Cross) is satisfactory for this purpose. Other metal foils or plates are also suitable; these include Hf, HfN, HfC, W—Re(<25%), W—Mo(<10%), pyrolitic-BN (also called CVD-BN), Ta, TaC, TaN, Ta$_2$N, carbon (vitreous, glassy, CVD, or POCO) and carbon coated with Ta/TaC, Hf/HfC and BN. We have also found it helpful (depending on the grain structure of the foil) to precondition the W foil by exposing it to Al vapor and letting the surface layer saturate with Al prior to significant deposition of the AlN layer on top of the foil.

Following growth and cool down of the polycrystalline AlN layer on the backing material (or as-grown foundation), the foundation may be inspected to determine the suitability of the as-grown foundation for further use in seed mounting. In some embodiments, suitable AlN foundations exhibit no or low cracking (<1 crack per square cm), no or low planar voiding (<1 planar intersecting the surface per square cm), and no or low areas of thin AlN deposition (sufficient grown thickness to polishing to specification). Inclusion of cracks, voids or thin layers behind the seed mount area may create void space behind the seed crystal. This void space may migrate, as described previously, to deteriorate the seed crystal and grown AlN boule.

In the described configuration, the AlN foundation layer may act to reduce the forces from thermal expansion mismatch on the grown boule by matching the thermal contraction of the grown AlN boule. The holder plate (backing layer of W-foil) acts as the layer that is relatively impervious to aluminum and/or nitrogen barrier layer preventing migration of the crystal material leading to void formation.

After the AlN layer is deposited as described above, it is preferably polished to a smooth and flat surface. As mentioned above, a "smooth surface" in this context means that there are no visible scratches in an optical microscope (200× magnification) and that the root mean square (RMS) roughness measured with an atomic force microscope (AFM) is less than 1 nm in a 10×10 μm area. This is important as surface topography, even at a microscopic level, may result in planar defects forming in the seed crystal; these defects may propagate into the crystal boule during subsequent growth. The flatness of the polished foundation surface may be checked using a suitable optical flat and monochromatic light source (sodium lamp at 590 nm is typical). The foundation surface is preferably flat across the seed area to better than 5 μm and preferably better than 1 μm. The as-grown AlN foundation layer on the W seed backing foil is polished in the manner of a fine mechanical preparation of a single-crystal AlN substrate, e.g., as described in '816 application. In an exemplary CMP process, substrate may be polished with a slurry including an abrasive suspension in a solution, such that the slurry is capable of etching the substrate surface and creating a finished surface suitable for epitaxial growth. A silica suspension in a hydroxide solution may be used, e.g., the KOH-based CMP slurry known in the art as SS25 (Semi-Sperse 25) available from Cabot Microelectronics or the Syton slurry available from Monsanto. The W foil backing side of the AlN/W foundation (as grown) may be mounted to a polishing fixture using a suitable mounting adhesive (e.g., Veltech's Valtron—AD4010-A/AD4015-B—50 CC thermal epoxy). The rough shape of the composite may be leveled by polishing the AlN layer using a rough mechanical step. A suitable approach is to use a 15 μm diamond slurry on a steel polishing deck (e.g., a Lapmaster 12" or an Engis LM15 with a regular steel deck). This rough mechanical step may be followed by a fine mechanical process with 1 μm Al$_2$O$_3$ slurry in a KOH solution (the slurry is made of 100 grams of 1 μm Al$_2$O$_3$ grit per 1 liter of solution which is composed of 0.5M KOH in distilled water (1 liter) with an additional 50 mL of ethylene glycol). The composite is polished with this slurry on a soft composite iron polishing deck such as the AXOS from Lapmaster, Inc.), leaving the surface highly reflective to the eye and free of defects such as scratches or pits or open cracks. The grit choice and active chemical reaction between the AlN and the strong base (KOH) is important to produce a surface with low defects. The preferred surface has less than 1 scratch deeper than 10 nm per square 10 μm scan (AFM) and TTV of less than 5 μm across the seeded area. In addition to providing this flat, scratch-free surface, the chemical reactivity of the solution and low hardness (with respect to AlN) of the grit and deck material provides sufficiently low SSD to avoid thermal etching the AlN foundation.

Following a suitable polishing process, the foundation is chemically cleaned of polishing residues prior to the described seed-mounting stages involving the foil and seed.

4.1. AlN-to-AlN Bonding Using Al Foil Nitridation

The AlN seed is now bonded to the AlN foundation using Al foil nitridation. The Al foil is placed between the seed and the foundation, and is heated up to temperatures sufficient to nitride the whole Al foil and thus produce a thin AlN bonding film between the AlN seed and AlN foundation. In other words, the Al foil is interposed between the seed and the foundation, and melted to uniformly wet the foundation with a layer of Al. The Al foil nitridation has the advantages of cleanliness and producing a microscopically conformal coverage of the seed backside, resulting in low planar-defect densities. The density and chemical stability of any backing material used to protect the seeds are important. If the backing material is not chemically stable (e.g., against Al vapor), then the resulting reaction between the Al vapor and the backing material may result in decomposition and thus voiding. If the backing material is not dense enough, the Al vapor can sublime through it, leaving behind extended voids and/or planar defects. If the backing material has a high vapor pressure at AlN crystal growth conditions, then it will migrate allowing void formation and will possibly become a boule contaminant. A schematic diagram of this structure is shown in FIG. 8B.

AlN seeds are known to form oxides and hydroxides during exposure to air, moisture and during chemical cleaning (hydrous and anhydrous chemicals contain enough water to react given AlN properties). As such, the prepared and cleaned seed surfaces may have some reproducible layer of oxides or hydroxides present during seed mounting. One advantage of using a liquid flux (the aluminum metal is melted and remains a liquid before forming a nitride and becoming a solid during the described process) is that the liquid will dissolve the seed surface oxide prior to reaction and convert the oxide into a more stable form and/or distribution. A layer of oxide and/or hydride on the seed surface may have a high vapor pressure under growth conditions and may lead to void formation. The more chemically reactive side of the MN c-axis wafer (the N-face) will have hydroxide formation that may be >10 nm in thickness.

The starting materials for an exemplary process are a polished AlN foundation seed holder, polished AlN seed crystal, and Al foil (10 mil thick from Alfa Aesar). First the materials are cleaned to produce reproducible and clean surfaces. The AlN foundation seed holder, prepared as described above, is treated as follows:

1. HCl:$H_2O$ [1:1] boil to remove polishing residues (20 min)
2. Distilled water rinse
3. Room temperature HF (49% solution) dip (15 min)
4. Anhydrous methanol rinse 3 times
5. Store under anhydrous methanol while assembling seed mount.
6. Dry carefully to avoid solvent stains upon removal from the anhydrous methanol.

The AlN seed crystal (after preparation as described above) is treated as follows:

1. HCl boil to remove remaining epoxy residues from boule processing (20 min)
2. Room temperature HF (49% solution) soak to remove $SiO_2$ and polishing residues (15 min) and surface oxide/hydroxide layers.
3. Anhydrous methanol rinse 3 times
4. Store under anhydrous methanol while assembling seed mount
5. Dry carefully to avoid solvent stains upon removal from the anhydrous methanol.

The Al foil is treated as follows (Al-foil: 10 μm thick, 99.9% purity foil provided by Alfa Aesar is preferred embodiment):

1. Cut to square sufficient to cover the seed area
2. Drip (1 min) in HF:$HNO_3$ solution (RT) for 1 min—removes oil and oxides
3. Anhydrous methanol rinse 3 times
4. Store under methanol while assembling seed mount
5. Dry carefully to avoid solvent stains upon removal from the anhydrous methanol.

With cleaned components:

1. Remove foundation from anhydrous methanol
2. Remove Al-foil from anhydrous methanol
3. Place foil dull side down and smooth side up onto the foundation
4. Smooth any air bubbles from behind the foil so that the thin/soft foil is void free on the foundation.
5. Remove the seed from the anhydrous methanol
6. Place seed (polarity determined) onto the foil
7. Trim excess foil from around the seed with a clean razor blade.

The seed, foil, and foundation are stacked into the furnace (inverted from the orientation shown in FIG. 8B to obtain the orientation shown in FIG. 9, so that gravity holds the seed and foil down on the foundation). Clean W weights 900 are then stacked on the seed to ensure that, during the melt phase, the seed is pressed toward the mount surface to reduce gaps. In an exemplary embodiment, about 0.6 kg of W mass per 2" wafer. The W weights are cleaned prior to use by heating in a furnace in a reducing atmosphere (typically forming gas is used with 3% hydrogen) to a temperature higher than the seed-mounting temperature for several hours and polished flat by mechanical polishing processes similar to the foundation and seed process/equipment.

Once the stack of weights, seed, foil, and foundation are positioned in the furnace, the station is evacuated to base pressures<$10^4$ mbar, preferably <$10^{-6}$ mbar and refilled with clean gas (filtered UHP grade forming gas (3% $H_2$ and 97% $N_2$).—lower than 1 ppm impurity of moisture, oxygen, hydrocarbons). Preferably, a station is used that is capable of high purity gas flow through the reaction zone where the seed is mounted. The flow gas tends to act as a curtain of clean gas, keeping chamber contamination away from the seed mount area. Contamination of the seed mount process may lead to the formation of oxides, carbides, materials other than pure AlN, and pure seed backing material may introduce unstable species that may migrate during crystal growth, leaving space that may allow void formation. Seed mount or bonding contamination (oxide formation) may lead to lower thermal conductivity regions behind/around the seed. Preserving consistent and high quality thermal contact around the seed and to the seed backing is important for maintaining good seeded growth. Oxides and other impurities tend to have a higher vapor species during crystal growth leading to migration/sublimation of the contaminant causing void spaces.

As mentioned above, gas flow is one way to improve the purity of the seed mount. A second way is to introduce a getter, with current best practice using both gas flow and getter materials. The preferred gettering materials are yttrium metal and hafnium metal. These act to getter the local atmosphere of contamination around the seed during mounting. The yttrium metal melts at 1522° C. (during ramp up of the Al-foil seed mounting process) and spreads to getter a wide surface area. Using a thin foil of the material tends to be most effective (e.g., Alfa Aesar, 0.1 mm thick, 99.999% purity Y-foil). Furthermore, yttrium oxide is stable under typical AlN growth conditions, meaning that it will provide only a low vapor pressure of oxide contamination back into the crystal growth environment if this getter from the seed mount remains during the growth. Hafnium-metal getter will not melt (melting point>2200° C.) under the described seed mount conditions but tends to surface react with both the oxide and the nitrogen. Therefore, the powder form of hafnium is preferred for this application (e.g., Alfa Aesar, −325 mesh, 99.9% metal basis purity). Each of these getters can be cleaned prior to use or purchased in sufficient purity to be used for the described application (99.9% or purer is current practice).

In each case, getter materials are placed around the periphery of the seed mounting area at the edges of the seed holder to avoid impurities from entering the seed bonding reaction zone.

In the case of hafnium powder, the hafnium will readily nitride under the described process. The HfN layer created in at the powder level or at higher temperatures (when the Hf melts and spreads at 2205° C.) forming a HfN layer. It has been observed that the HfN layer acts to prevent W-components from sticking together, even following long heating cycles with Al-vapor present. This property allows surfaces to be prepared that will not stick together, despite being well polished and very clean in the hot/reducing atmosphere.

After these steps, the seed mounting setup is ready for the heating cycle. In a preferred embodiment, the seed-mount stack is rapidly heated (<5 minutes) to approximately 1600° C. and ramped in 30 minutes to 1650° C. The purpose of this is to quickly melt the Al foil and to allow the Al liquid to readily flow with low surface tension, allowing the Al melt to readily wet the AlN seed crystal and the AlN foundation uniformly, i.e., melting the Al foil to uniformly wet the foundation with a layer of Al. A high density AlN between the original seed crystal and the AlN foundation is formed. Allowing the heat-up cycle to remain at low temperatures (below about 1100° C.) for too long may permit the liquid Al to bead up and form a porous AlN ceramic when the Al starts to nitride, thereby creating void spaces behind the seed. Once at 1650° C., the temperature is held for >1 hour to allow the Al-melt to fully nitride, forming a high-density AlN ceramic that is bonded to the seed and to the AlN foundation. Following the >1 hour soak at 1650° C., the station is ramped to room temperature in an additional 2 hours.

Figure 10:
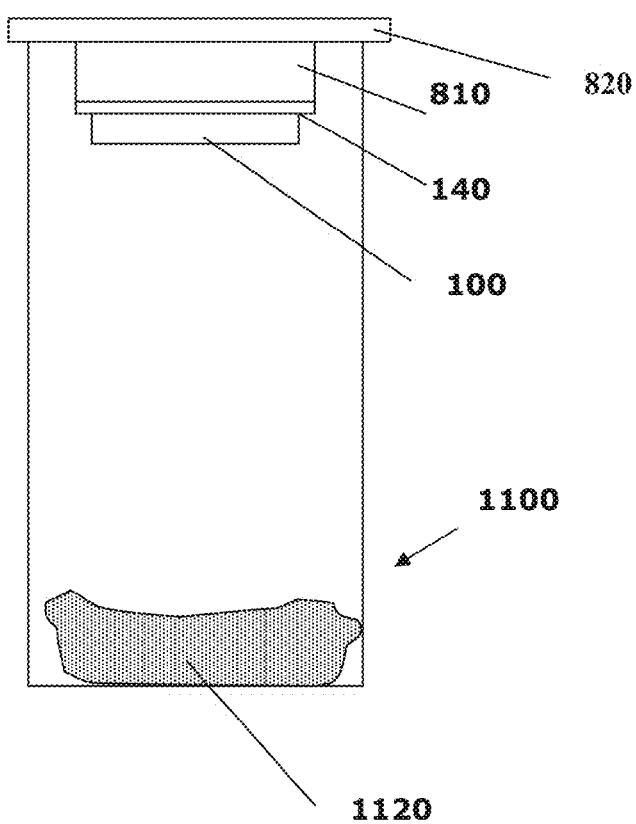
FIG. 10 is a schematic diagram illustrating an assembled crystal growth crucible.

Following this heat cycle/nitride mounting, remaining getter materials and seed mounting weight 900 are removed from the assembled seed-seed holder. The seed and seed holder assembly is now ready to be inverted as shown in FIG. 8B and assembled for the crystal growth cycle. The crystal growth crucible is assembled as shown in FIG. 10. In particular, AlN seed 100 and seed holder assembly (including adhesive 140, foundation 810, and backing plate 820) are assembled as shown in a crystal growth crucible 1100. The AlN seeded bulk crystal growth may be carried out in a tungsten crucible 1100 using a high-purity AlN source 1120. The AlN seed 100 is mounted onto the seed holder assembly as described above.

Single-crystal aluminum nitride is formed by depositing aluminum and nitrogen onto the AlN seed 100 under conditions suitable for growing single-crystal AlN originating at the seed. For example, growth may be initiated by heating the crucible with the seed mount and source material to a maximum temperature of approximately 2300° C. and with a gradient of less than 50° C./cm as measured radially and a vertical gradient greater than 1° C./cm but less than 50° C./cm. During the initial ramp-up to the growth temperature, it may be desirable to position the seed crystal and the source material such that they are at approximately the same temperature (the seed equilibrium position) so that any impurities on the surface of the seed crystal are evaporated away prior to growth. Once the growth temperature is achieved, it may be desirable to either move the crucible assembly so that the seed is temporarily hotter than the source material, or to temporarily reduce the nitrogen partial pressure prior to initiating growth on the seed crystal in order to evaporate part of the surface of the seed crystal. The partial pressure of nitrogen in the furnace may be reduced either by reducing the total pressure of gas in the furnace or by adding an inert gas, such as Ar, to the furnace while keeping the total pressure in the furnace constant.

The bulk single crystal of AlN formed by this method may have a diameter greater than 20 mm, a thickness greater than 0.1 mm, and an areal defect density $\leq 100$ cm$^{-2}$. The method may enable the formation of bulk single crystal AlN in the form of a boule having a diameter greater than 20 mm, a thickness greater than 5 mm, and an areal density of threading dislocations $\leq 10^6$ cm$^{-2}$—or even $\leq 10^4$ cm$^{-2}$—in each cross section of the bulk single crystal disposed in a plane perpendicular to a growth direction of the crystal. A boule may include a bulk single crystal of AlN having a sufficient thickness to enable the formation of at least five wafers therefrom, each wafer having a thickness of at least 0.1 mm, a diameter of at least 20 mm, and a threading dislocation density $\leq 10^6$ cm$^{-2}$, preferably $\leq 10^4$ cm$^{-2}$.

A boule formed by methods described herein may be a substantially cylindrical bulk single crystal of AlN having a diameter of at least 20 mm and having a sufficient thickness to enable the formation of at least five wafers therefrom, each wafer having a thickness of at least 0.1 mm, a diameter of at least 20 mm, and a triple-crystal X-ray rocking curve of less than 50 arcsec FWHM for a (0002) reflection, with each wafer having substantially the same diameter as each of the other wafers.

4.2 Multiple Seed Mounting

It may be desirable to mount several seeds on the AlN ceramic simultaneously. For instance, it may be difficult to obtain seed crystals large enough, with sufficiently high quality, to cover the entire area of the AlN ceramic. In this case, it may be desirable to use multiple seeds that may be mounted on the AlN ceramic simultaneously. This may be accomplished by preparing seed crystals as described above, all with the same orientation. The seed crystals may then be mounted on the AlN ceramic on the metal backing plate as described above (or other seed holder assemblies as described below) with careful attention to aligning their azimuthal axis. In the case of smaller seeds, it is possible to expand a seed within a growth run using thermal gradients. The laterally expanded seed crystal generally avoids the seed mounting source of planar voids but may still require a low porosity seed backing barrier to avoid through voiding formation of planar defects within the grown boule. In addition, it may be possible to arrange a patch work or mosaic of small seeds accurately enough so that the resulting large diameter boule is grown with suitable orientation between the smaller seeded regions to produce a congruent 2" wafer. For c-axis AlN seeded growth, the alignment of the seeds is preferably accomplished by preparing the seed crystals with m-plane cleaved edges. The AlN cleaves on the m-plane to produce very straight edges perpendicular to the c-axis. Thus, the seeds may be well oriented with respect to each other by aligning the flat m-plane cleaves against the neighboring seed sections. From a small seed mosaic approach, a fraction of the 2" wafer usable area may easily be produced, but it may also be possible to seed the entire 2" area by this method. A particularly important example of using more than one seed crystal is when a 2" seed crystal is cracked and this seed crystal is mounted with the two halves aligned precisely for boule growth. By using this m-plane cleave face alignment approach to c-axis seeded growth it is possible to achieve <0.5 deg m-plane and c-axis crystallographic alignment. Because of the difficulty in obtaining seed crystals that are all exactly aligned and the difficulty in avoiding some error in the aligning of the azimuthal axes, this approach typically produces a higher defect density than a single seed crystal. However, this approach may be used to obtain larger AlN crystal boules with smaller seed sizes.

4.3 Additional Approaches that May be Used to Supplement the Preferred Implementations

4.3.1 Protection of the AlN Seed Using Relatively Impervious Films

The back of the AlN seed may be protected by depositing a high-temperature, relatively impervious material like W. This barrier layer can be deposited by sputtering, CVD, ion deposition or plating (for conductive substrates). Plating may be used to initiate or thicken the deposited layer of seed back sealant once initial deposition has been performed. For instance, the back of the AlN seed can be protected using W film sputtered onto the back of the AlN seed and then mounted to the seed holder using any of the techniques described above. The back of the AlN seed may also be protected by attaching it (with an adhesive such AlN which is formed by nitriding a thin foil of Al as was described above) to W foil. The W foil may be single crystal to reduce Al diffusion. The density of the planar defects is then reduced significantly. Other materials expected to possess suitable properties to be used as relatively impervious barriers include: Hf, HfN, HfC, W—Re(<25%), W—Mo (<10%), pyrolitic-BN (also called CVD-BN), Ta, TaC, TaN, $Ta_2N$, Carbon (vitreous, glassy, CVD, POCO) and carbon coated with Ta/TaC, Hf/HfC and BN. The key attributes of a suitable material to be deposited on the back surface include:

a. Temperature stability (>2100° C.)

b. Chemically stable in growth environment (Al-vapor, $N_2$, $H_2$)—vapor pressures<1 mbar at temperatures>2100° C. in $N_2$, $N_2$—$H_2$(<10%), Ar, around 1 atm pressure.

c. Low diffusivity of Al through the backing material by being physically impervious to gas flow (generally this means that the material is dense without voids) and having a small diffusion constant for Al. Since diffusion along grain boundaries is generally much higher than diffusion through grain boundaries, it may be desirable to have the grains swell so as to become more dense as Al diffuses into the material ("self-sealing" grain swelling as described in the '027 application.)

The material may, for example, be exposed to Al vapor prior to use as a seed holder plate to limit Al diffusivity through grain swelling in the plate. At typical growth temperatures, the vapor pressure in the growth atmosphere is about 0.1 bar Al-vapor and the equilibrium (atom-wt-%) Al level in W has been measured to be ~5%, so the preferred backing will have no voids, will not evaporate or migrate during the run, and will have its surface pre-saturated with the equilibrium Al-content for that material at the anticipated growth temperature.

4.3.2. Growth of Bulk AlN Single-Crystals Along Off-Axis Directions

The AlN bulk crystal may be grown parallel to directions at least 15±5° off-axis. The off-axis growth include crystal growth with interface parallel to non-polar $\{1\bar{1}00\}$ and semi-polar planes $\{10\bar{1}1\}$, $\{1\bar{1}02\}$, and $(10\bar{1}3)$. In the case of non-polar growth, the growth rate of the crystallographic planes differs from the growth rate of the same planes when crystal is grown on-axis or slightly off-axis. Therefore, even though the back surface of the seed may not be perfectly protected, planar-defect formation may be resolved into generation of other defects, e.g., stacking faults, twinning, etc., to reduce its impact.

4.3.3 Protection of the Back of the Backing Plate (Outer Sealing)

In addition to mounting the AlN seed onto the seed holder as described above, the outside of the seed holder (i.e., backing plate 820 in FIG. 8B), that forms the crucible lid—i.e., the side outside the crucible—may be protected to inhibit the transport of Al through the crucible lid. For purposes herein, high-temperature carbon-based adhesives, paints, or coatings may be applied. Typically these materials are applied by brushing or spraying and then thermally cycled to improve their density and structure, but they may be sputtered or electro-plated as well. For instance, if a thin (<0.005 inch) W foil is used as a crucible lid and with the AlN seed mounted on one side, then the other side of the W foil may be protected in this fashion. The advantage of protecting the outer side of the foil is that a much wider range of high-temperature materials (coating, paints, etc.) may be used as the protective layer, since there is a lower risk of interaction between Al vapor and the protective material. This approach also allows thinner metal lids to be used, which is advantageous in reducing stress on the crystal due to thermal-expansion mismatch between the lid material and AlN.

4.3.4 Seed Bond Curing in Multiple Gas Species Flow

As mentioned above, within at typical Al-foil seed mounting process, the liquid Al-foil cleans the seed surface of oxides and reacts to form $Al_2O_3$. To move to fewer voids and better quality growth, it may be necessary to more fully remove this seed oxide layer. Extending the time that the Al-foil melt is allowed to react with this oxide layer is one method for doing this. The longer Al-melt phase may be achieved by reducing the amount of nitrogen available to react with the molten Al-metal forming solid nitride. This can be performed under an argon atmosphere during heat up to suitable reaction temperature (1000 to 1800° C. depending on desired removal rate/species) and holding for sufficient time to remove oxide and hydroxide layers from the seed. Subsequently, nitrogen may be added to the flow past the seed mount zone. The nitrogen may then react with the free Al-melt and form a nitride seed adhesive.

During this molten Al phase, it is possible that the seed holder (when made of W alone) will be a diffusion membrane for the oxide species. This mechanism would allow the getter of the oxide from the seed to be achieved by the Al-metal, the metal to be cleaned by the W-layer and then pure, high density AlN to be nitrided from the Al-melt forming a high quality seed adhesive.

4.3.5 Seed Bonding Directly to a Seed Plate without the AlN Layer

Rather than using a combination of an AlN ceramic layer and a backing plate, it may also be possible to bond the seed directly to an appropriate seed plate without the intermediary AlN ceramic layer. This may provide the advantage of eliminating the potential for defects in the AlN ceramic layer to migrate into the growing AlN boule. However, the backing plate is carefully chosen so as to not introduce too much stress onto the seed crystal and AlN boule due to thermal expansion mismatch between the seed plate and AlN. This can be accomplished either by using very thin plates that will easily deform in response to stress from the AlN crystal (yet still be relatively impervious to Al transport through the plate) or by using plates that relatively closely match the thermal expansion of AlN from room temperature up to the growth temperature of ~2200° C. Alternatively, the AlN seed crystal may be mounted on the backing plate, which may then be mounted on a textured AlN ceramic. This last approach is attractive because the seed backing plate used may provide a relatively impervious barrier to Al diffusion and prevent defects from the AlN ceramic from diffusing into the growing crystal. However, the AlN ceramic may provide the mechanical strength to hold the growing crystal boule.

Possible choices include:

i. W-foil ii. W—Re foil iii. W—Mo foil iv. W-foil treated with Pt, V, Y, carbon v. Single crystal-W backing vi. HfC—liquid phase sintered vii. TaC coated Ta viii. TaC coated pBN ix. TaC coated W-foil
x. HfN coated W-foil
xi. HfC (hafnium carbide)
xii. HfC coated W
xiii. BN coated graphite Even though the W has a thermal expansion coefficient different from that of AlN, thin W-foil and thin single crystal-W may mechanically deform much more readily than an AlN boule of suitable thickness so as to reduce stresses on the crystal due to the thermal expansion mismatch. Alloys of W/Re and W/Mo may be selected such that the total thermal expansion of the seed holder and AlN will be zero from growth temperature down to room temperature. Combinations of these materials (all) and treatments with elements such as Pt, V, Y, carbon may be used to change the grain growth behavior of the backing material to reduce the time dependent grain growth of the material upon exposure to Al and high temperature gradients.

A similar polishing preparation process to what was described above for the AlN ceramic foundation is also suitable for direct foil mounting (without AlN foundation). To improve the surface finish further in the cases of metal backing it is generally desirable to follow the 1 μm $Al_2O_3$ deck step with a 1200-grit pad step that produces a mirror finish on the softer metal materials while maintaining flatness and low scratching.

Figure 6:
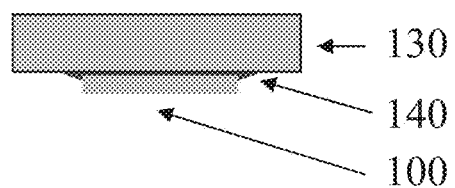
FIG. 6 is a schematic diagram of an AlN seed mounting technique using high temperature AlN ceramic-based adhesive.

The furnace operation for this seed mounting process is schematically described below. The adhesive layer is place on the prepared seed holder and the seed onto the adhesive layer. For use of the Al-foil based seed mounting adhesive, the seed holder from FIG. 6 is assembled while inverted within a station capable of reaching at least 1650° C. For materials other than Al-foil, a separate heating cycle is described later, however, the same considerations apply to maintaining high quality seeded growth results.

A suitable mass is placed on top of the seed/adhesive/seed holder assembly. In an embodiment, one may use a polished (flat) tungsten right cylinder that has been carefully outgassed of contamination by repeated heating cycles under forming gas flow. The block presses on the polished (flat) seed face with a pressure greater than 150 grams per centimeter squared area. In this case, this may be sufficient to hold a flat, stress relived seed closely against the seed holder. More pressure per area will help to improve imperfect seed/seed-holder flatness by deformation of the materials up to the point where the mass loading may cause seed/seed-holder fracture by exceeding the critical resolved sheer stress (CRSS) at room or higher temperatures.

Prior to seed assembly, the seed and seed holder are typically checked for suitable flatness using optical flatness measurement techniques such as an optical flat and a monochromatic light source (435 nm sodium lamp). Gaps between the mating surfaces are preferably less than 5 μm, preferably less, with part shapes being regular (avoid cupped or boxed pieces with deformation better than 5 μm preferred).

4.3.6 Other Possible Seed Mounting Adhesives

Instead of an AlN ceramic-based adhesive, it is possible to use any other high-temperature adhesive, e.g., carbon-based adhesives or even water-based carbon paints such as Aquadag E, molybdenum-dag, (such as from Aremco Products, Inc.) molybdenum-powder or foil, molybdenum sputter or plated coatings, similar to each of the molybdenum forms including base elements aluminum, rhenium, vanadium, yttrium Other glues, such as boron nitride-, zirconia-, yttrium oxide-, and aluminum oxide-based glues that have a variety of high temperature stabilities/suitability at AlN growth conditions may also be used.

The carbon-based approaches have been successful for seeding SiC crystal growth. However, they have not proven successful for AlN crystal growth because Al vapor attacks the graphite forming aluminum carbide ($Al_4C_3$).

4.3.7 Using a Liquid or Break-Away Seed Mounting

As discussed above, one of the difficulties of growing bulk AlN from seed crystals mounted on seed holders that are nearly impervious to Al transport is the strain caused by the thermal expansion mismatch between the seed crystal and the seed holder plate. Stress from thermal expansion mismatch can be avoided by using a liquid or nearly liquid film to hold the seed to the seed holder plate. Metal gallium (Ga) may be substituted for one of the solid glues described above and will melt at 30° C. At high temperatures (>1,000° C.), the nitrides of Ga are not stable so the Ga will remain liquid between the AlN seed and the seed holder plate and thus will not be able to transmit any shear stress (due to thermal expansion mismatch) to the growing AlN boule. However, the liquid Ga typically forms a nitride as the crystal is cooled to room temperature. This may be avoided by using a backing plate from which the GaN will break away as it cools or by replacing the nitrogen gas in the growth chamber with an inert gas (such as Ar) so that the Ga will not be exposed to enough nitrogen to form a solid nitride bond both the seed crystal and the seed holder plate. Of course, this approach may not provide any mechanical strength to hold the seed crystal, so it is preferably used by mounting the seed crystal at the bottom of the growth crucible.

The relatively high vapor pressure of the Ga may cause contamination of the growing AlN crystal boule. This may be overcome by using a eutectic of gold and germanium. The $Au_xGe_{1-x}$ has a eutectic at x=0.72 which melts at 361° C. Again, this material does not have any stable nitrides at the AlN growth temperature and, thus, will remain liquid. In addition, its vapor pressure will be approximately 30 times lower than that of Ga at the same temperature.

4.3.8 Seed Mounting without a Holder Plate

A large, low defect seed crystal may also be mounted by coating its back surface with a nearly impervious coating and using the seed crystal itself to seal the crystal growth crucible. By making this coating thin, mechanical stresses from the thermal expansion mismatch between the coating and the AlN seed crystal will be minimized. In the preferred embodiment of this approach, the seed crystal is first coated in DAG and then baked at 150° C. to provide a carbon coating around the entire seed (alternative carbon coating schemes may also be used). The carbon coated AlN seed crystal then has a thin layer of pyrolytic BN deposited on it (this layer is preferably approximately 100 μm thick). After this preparation, the front surface of the AlN seed crystal is polished as described above in the section on seed crystal preparation, so that the front surface has substantially all of the BN and graphite removed, and is smooth and relatively defect-free as described in that section. This integrated seed crystal and seed holder assembly will then be mounted directly as the lid for the AlN crystal growth crucible.

5. Additional Thermal Gradient Approaches

Figure 11:
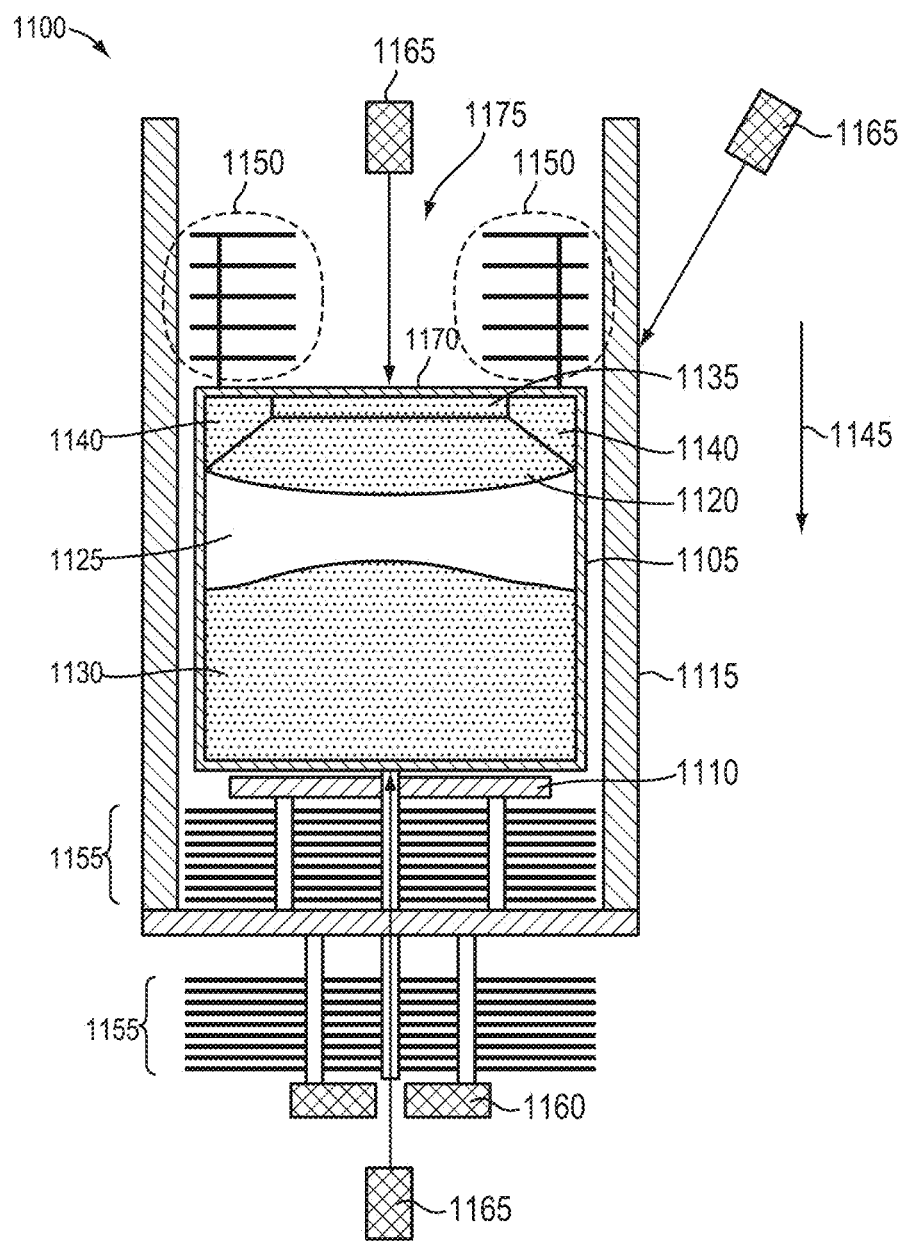
FIG. 11 is a schematic cross-section of a crystal-growth apparatus in accordance with various embodiments of the invention in which radial thermal gradients are generated and/or controlled.

FIG. 11 depicts a crystal-growth apparatus 1100 suitable for the growth of single-crystal semiconductor materials (e.g., AlN, $Al_xGa_{1-x}N$, $B_xAl_{1-x}N$, and/or $B_xGa_yAl_{1-x-y}N$) in accordance with various embodiments of the present invention. As shown, apparatus 1100 includes a crucible 1105 positioned on top of a crucible stand 1110 within a susceptor 1115. Both the crucible 1105 and the susceptor 1115 may have any suitable geometric shape, e.g., cylindrical. During a typical growth process, the semiconductor crystal 1120 is formed by condensation of a vapor 1125 that includes or consists essentially of the elemental and/or compound precursors of the semiconductor crystal 1120. For example, for a semiconductor crystal 1120 including or consisting essentially of AlN, vapor 1125 may include or consist essentially of Al and N atoms and/or $N_2$ molecules. In preferred embodiments, the vapor 1125 arises from the sublimation of a source material 1130, which may include or consist essentially of the same material as semiconductor crystal 1120, only in polycrystalline form. Source material 1130 may be substantially undoped or doped with one or more dopants, and use of a doped source material 1130 typically results in semiconductor crystal 1120 incorporating the dopant(s) present in source material 1130. The semiconductor crystal 1120 may form on and extend from a seed crystal 1135. (Alternatively, the semiconductor crystal 1120 may nucleate upon and extend from a portion of the crucible 1105 itself, in the manner depicted in FIG. 7.) The seed crystal 1135 may be a single crystal (e.g., a polished wafer) including or consisting essentially of the same material as semiconductor crystal 1120 or may be a different material.

The crucible 1105 may include or consist essentially of one or more refractory materials, such as tungsten, rhenium, and/or tantalum nitride. As described in the '135 patent and the '153 patent, the crucible 1105 may have one or more surfaces (e.g., walls) configured to selectively permit the diffusion of nitrogen therethrough and selectively prevent the diffusion of aluminum therethrough.

As shown in FIG. 11, during formation of the semiconductor crystal 1120, a polycrystalline material 1140 may form at one or more locations within the crucible 1105 not covered by the seed crystal 1135. However, the diameter (or other radial dimension) of the semiconductor crystal 1120 may expand, i.e., increase, during formation of the semiconductor crystal 1120, thereby occluding the regions of polycrystalline material 1140 from impinging vapor 1125 and substantially limiting or even eliminating their growth. As shown in FIG. 11, the diameter of the semiconductor crystal 1120 may expand to (or even start out at, in embodiments utilizing larger seed crystals 1135) be substantially equal to the inner diameter of the crucible 1105 (in which case no further lateral expansion of the semiconductor crystal 1120 may occur).

The growth of the semiconductor crystal 1120 along a growth direction 1145 typically proceeds due to a relatively large axial thermal gradient (e.g., ranging from approximately 5° C./cm to approximately 100° C./cm) formed within the crucible 1105. A heating apparatus (not shown in FIG. 11 for clarity), e.g., an RF heater, one or more heating coils, and/or other heating elements or furnaces, heats the susceptor 1115 (and hence the crucible 1105) to an elevated temperature typically ranging between approximately 1800° C. and approximately 2300° C. The apparatus 1100 features one or more sets of top thermal shields 1150, as well as one or more sets of bottom axial thermal shields 1155, arranged to create the large axial thermal gradient (by, e.g., better insulating the bottom end of crucible 1105 and the source material 1130 from heat loss than the top end of crucible 1105 and the growing semiconductor crystal 1120). During the growth process, the susceptor 1115 (and hence the crucible 1105) may be translated within the heating zone created by the heating apparatus via a drive mechanism 1160 in order to maintain the axial thermal gradient near the surface of the growing semiconductor crystal 1120. One or more pyrometers 1165 (or other characterization devices and/or sensors) may be utilized to monitor the temperature at one or more locations within susceptor 1115. The top thermal shields 1150 and/or the bottom thermal shields 1155 may include or consist of one or more refractory materials (e.g., tungsten), and are preferably quite thin (e.g., between approximately 0.125 mm and 0.5 mm thick).

As mentioned above, the maximum mass transfer from source material 1130 and/or vapor 1125 (and therefore growth rate of semiconductor crystal 1120) is typically achieved by maximizing the axial thermal gradient within the crucible 1105 (i.e., maximizing the temperature difference between the source material 1130 and the growing crystal 1120 so that the growing crystal 1120 has greater supersaturation). In preferred embodiments, the onset of crystal-quality deterioration (e.g., increased dislocation density, formation of grain boundaries, and/or polycrystalline growth) sets the approximate upper limit of the supersaturation at a given growth temperature. For typical growth temperatures (e.g., between approximately 2125° C. and approximately 2275° C.), this upper limit of the axial temperature gradient is generally approximately 100° C./cm (although this maximum may depend at least in part on the dimensions and/or shape of the growth chamber, and may thus be larger for some systems). However, as the cross-sectional area of the semiconductor crystal 1120 increases (and/or for larger-area seed crystals 1135), the probability of parasitic nucleation (on the seed crystal 1135 or in other locations) increases. Each parasitic nucleation event may lead to formation of an additional growth center and result in grain or sub-grain formation (and thus low-quality and/or polycrystalline material). Minimizing the probability of parasitic nucleation is preferably achieved by providing a non-zero radial thermal gradient in a direction substantially perpendicular to the growth direction 1145 that promotes lateral growth. Formation of the radial thermal gradient also enables growth of larger, high-quality crystals at high growth rates, as previously mentioned.

In accordance with various embodiments of the invention, the top thermal shields 1150 are also arranged to form the non-zero radial thermal gradient within crucible 1105. The radial thermal gradient is preferably larger than 4° C./cm, e.g., ranging between 4° C./cm and 85° C./cm (although, as described above relative to the axial thermal gradient, these values may depend on the specific dimensions and/or shape of the crucible). In preferred embodiments, the axial and radial temperature gradients are balanced. The radial and axial thermal gradients are balanced when the magnitudes of the gradients are within their upper limits (as detailed below). Preferably, the ratio between the axial and radial gradients (the thermal gradient ratio) is less than 10, less than 5.5, or even less than 3 at any given point inside the crucible 1105. The thermal gradient ratio is also preferably greater than 1.2, e.g., ranging from 1.2 to 5.5. The maximum (i.e., upper limit) radial temperature gradient is a function of the growth temperature and is preferably defined by the onset of cracking and/or increased dislocation density (and/or grain-boundary formation) in semiconductor crystal 1120. At the growth temperature, dislocation arrays, or even grain boundaries, may form at elevated radial thermal gradients. Such defects usually exhibit center-symmetric patterns. The minimum (i.e., lower limit) of the radial thermal gradient is preferably set by complete lack of lateral growth of the semiconductor crystal 1120 perpendicular to the growth direction 1145.

As noted above, after the semiconductor crystal 1120 has laterally expanded to the inner dimension of the crucible 1105 the expansion generally ceases. However, preferred embodiments of the invention maintain a non-zero radial thermal gradient (which may be different from the radial thermal gradient during the expansion of the semiconductor crystal 1120) even after the lateral expansion of semiconductor crystal 1120 has ceased in order to maintain high crystalline quality. The non-zero positive (as defined herein) radial thermal gradient generally results in semiconductor crystal 1120 having a convex surface during growth (e.g., as shown in FIG. 11). Lateral growth of semiconductor crystal 1120 promotes growth-center coalescence, and preferably growth initiates and proceeds from only one growth center. Even in such a case, there is preferably some non-zero magnitude of the radial gradient to prevent formation of additional growth centers. Examples of balanced axial and radial thermal gradients for growth of semiconductor crystal having a diameter of approximately two inches are set forth in the table below.

| Growth temperature (° C.) | Thermal gradient upper limit (° C./cm) | | Axial/Radial ratio |
|---|---|---|---|
| | Axial | Radial | |
| 1800 | 25 | 12 | 2.1 |
| 2250 | 105 | 45 | 2.3 |

In preferred embodiments, the crucible 1105 has a lid 1170 with sufficient radiation transparency to enable at least partial control of the thermal profile within the crucible 1105 via the arrangement of the top thermal shields 1150. Furthermore, in embodiments featuring a seed crystal 1135, the seed crystal 1135 is typically mounted on the lid 1170 prior to the growth of semiconductor crystal 1120. The lid 1170 is typically mechanically stable at the growth temperature (e.g., up to approximately 2300° C.) and preferably substantially prevents diffusion of Al-containing vapor therethrough. Lid 1170 generally includes or consists essentially of one or more refractory materials (e.g., tungsten, rhenium, and/or tantalum nitride), and is preferably fairly thin (e.g., less than approximately 0.5 mm thick).

The arrangement of the top thermal shields 1150 provides control of the radial thermal profile, and hence provide the radial gradient preferred to maintain high crystal quality at high growth rates and to form and maintain the desired thermal gradient ratio. Simultaneously, the shield arrangements provide the necessary heat transfer to ensure the maximum growth rate. The balance between the axial and radial thermal gradients may be achieved by providing certain opening arrangements of the shields. As shown in FIG. 11, each of the top thermal shields typically has an opening 1175 therethrough. The opening 1175 normally echoes the geometry and/or symmetry of the crucible 1105 (e.g., the opening 1175 may be substantially circular for a cylindrical crucible 1105). The size of each opening 1175 may be varied; typically, the size(s) range from a minimum of 10 mm to a maximum of approximately 5 mm (or even 2 mm) less than the diameter of the crucible 1105.

For example, in a preferred embodiment, five thermal shields 1150, each having a diameter of 68.5 mm and an opening size (diameter) of 45 mm, are used. The thickness of each of the thermal shields 1150 is 0.125 mm, and the thermal shields 1150 are spaced approximately 7 mm from each other. At a typical growth temperature of 2065° C., this shield arrangement results in a radial thermal gradient (measured from the center of the semiconductor crystal to the inner edge of the crucible) of 27° C./cm.

As shown in FIG. 11, the top thermal shields 1150 may have openings 1175 larger than any such opening present in the bottom thermal shields 1155, and/or the top thermal shields 1150 may be stacked with one or more spacings between shields that are larger than that between the various bottom thermal shields 1155. The spacings may range between approximately 1 mm and approximately 20 mm, and preferably between approximately 7 mm and approximately 20 mm. Also as shown, the openings 1175 in the top thermal shields 1150 may all be substantially equal to each other. Depending upon the desired growth conditions (e.g., pressure, temperature, crucible dimensions, distance between the seed crystal and the source material, etc.), the number of top thermal shields 1150, the spacing between shields 1150, and/or the size of the openings 1175 may be varied to form the desired radial thermal gradient and hence, the desired thermal gradient ratio. The radial thermal gradient may even be varied in real time during the growth of semiconductor crystal 1120, e.g., in response to feedback based on determination of the radial thermal gradient during growth. For example, the radial thermal gradient may be determined based on the temperatures of lid 1170 and one or more sides of crucible 1115 (e.g., measured by pyrometers 1165 as shown in FIG. 11).

Similarly, although each of the top thermal shields 1150 preferably has a thickness less than 0.5 mm, the thickness of one or more of the shields 1150 may be varied with respect to the others. For example, one or more top thermal shields 1150 may have a thickness of approximately 0.25 mm while one or more others have a thickness of approximately 0.125 mm. The thickness of the top thermal shields 1150 may even be varied as a function of distance away from the lid 1170 (i.e., either increasing or decreasing). Such thermal shields 1150 having different thicknesses may be utilized to adjust the thermal field above and within the crucible 1115. For example, a thicker shield may be used to block more radiative heat flow but will typically have higher thermal impact at temperatures where the heat flux is dominated by the thermal conductivity (lower temperatures, e.g. <1500°-1800°). Therefore, the resultant radial thermal gradient may vary as a function of growth temperature, even with the same arrangement of the same top thermal shields 1150.

Figure 12A:
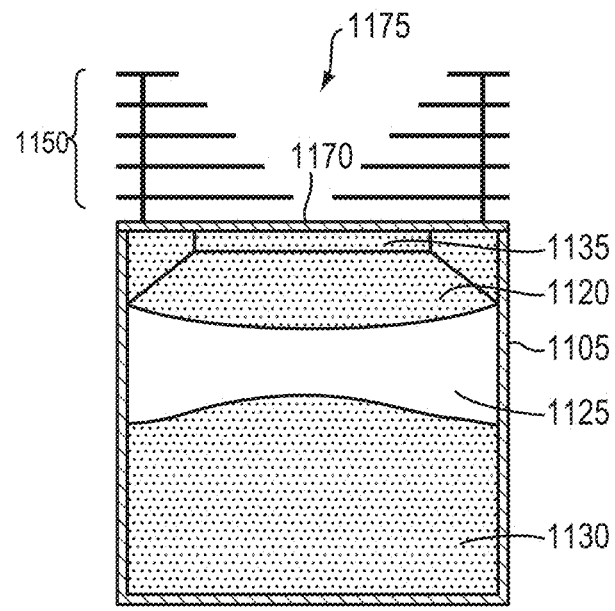
FIGS. 12A and 12B are schematic cross-sections of portions of the crystal-growth apparatus of FIG. 11 with alternate arrangements of top thermal shields, in accordance with various embodiments of the invention.
Figure 12B:
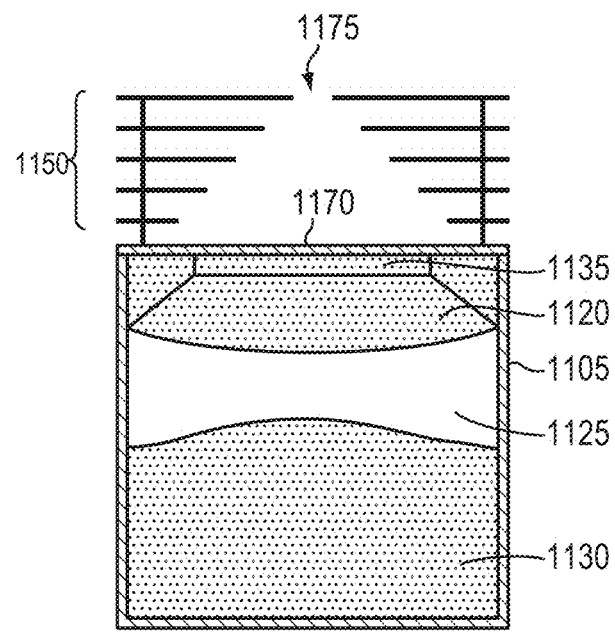

FIGS. 12A and 12B depict alternative arrangements of the top thermal shields 1150 for producing a radial thermal gradient within crucible 1105. Specifically, the openings 1175 in the top thermal shields 1150 can be varied as a function of distance away from the lid 1170. As shown in FIG. 12A, the top thermal shields 1150 may be arranged such that their openings 1175 increase in size with increasing distance from lid 1170. FIG. 12B depicts an alternate arrangement in which the top thermal shields are arranged such that their openings 1175 decrease in size with increasing distance from lid 1170. Of course, either of the arrangements of FIGS. 12A and 12B may be combined with any of the other arrangement variations described previously. In some embodiments, the arrangement of FIG. 12A is preferred, as it increases the probability of forming and maintaining a single growth center (where the narrowest opening is located) at the initial stages of growth.

Having described the principles and apparatus of various embodiments of the present invention, the method of operation, i.e., a growth process for AlN using the system described above is now described in conjunction with FIG. 13. As listed therein, in some embodiments, crystal growth initially involves evacuating the susceptor 1115 (step 1300), e.g., to pressures on the order of about 0.01 mbar (1 Pa) using a vacuum pump. The susceptor 1115 is then refilled with an inert gas or a gas including or consisting essentially of nitrogen (step 1305). These steps are preferably repeated one or more times to minimize oxygen and moisture contamination (step 1310). Steps 1300-1310 may be performed by evacuating and refilling a process chamber (not shown in FIG. 11) that houses the susceptor 1115 and various other portions of apparatus 1100, and references to the "chamber" below may refer to such a chamber or to the susceptor 1115. The chamber is then pressurized to about 1 bar (100 kPa) with nitrogen gas which is preferably mixed with a small amount of hydrogen (step 1315). For example, a gas including or consisting essentially of about 95-100% $N_2$ and 0-5% $H_2$ is suitable in many embodiments. In particular embodiments, a commercially-available mixture of about 3% $H_2$ and 97% $N_2$ is employed. Polycrystalline AlN source material 1130 is placed at a proximal end of the crucible 1105 (step 1320). The crucible 1105 may then be evacuated and sealed, or may be provided with selective openings as described hereinabove. The crucible 1105 is then disposed concentrically within the susceptor 1115 with its distal end opposite the source material 1130 (at which a seed crystal 1135 may be disposed) in the high-temperature region of the heating zone produced by the heating apparatus (e.g., a furnace (step 1325). The temperature is then increased to bring the distal end of the crucible 1105 to a temperature of approximately 1800° C., in particular embodiments, within about 15 minutes (step 1330). At the end of this temperature ramp, the gas pressure is set and maintained at a predetermined super-atmospheric pressure (step 1335), and the temperature is ramped to a final crystal-growth temperature (step 1340), e.g., in about 5 hours. As mentioned above, the final crystal-growth temperature may range between approximately 1800° C. and approximately 2300° C. During the temperature ramp, the pressure may be continuously adjusted, e.g., using a vent valve (not shown) to maintain it at that fixed super-atmospheric value (step 1345). One potential advantage of this ramping is the enhancement of the purity of the source material 1130 by permitting part of any oxygen still contained within it to diffuse out of the crucible 1105 (e.g., through the crucible walls). This diffusion occurs because the vapor pressure of the aluminum suboxides (such as $Al_2O$, AlO, etc.) generated due to the presence of oxygen in the source material 1130, is known to be higher than that of Al over AlN for the same temperature.

Once the growth temperature is reached, the drive mechanism 1160 is actuated to move the distal end of crucible 1105 towards the distal end of the chamber, and relative to the axial thermal gradient produced at least in part by the heating apparatus and the arrangement of the top and bottom thermal shields (step 1350). Preferably, the distal end of crucible 1105 is initially located within the highest-temperature region of the susceptor 1115 at the beginning of the growth run. As the crucible 1105 moves upwards the distal end of crucible 1105 becomes cooler than the source material 1130, which promotes effective mass transport from the source material 1130 to the colder region of the crucible 1105.

During the growth process, the pressure is preferably maintained at a constant predetermined value (step 1355). The most appropriate value for this pressure typically depends on the axial spacing between the source material 1130 and the (closest) surface of the growing crystal 1120, as well as the rate of nitrogen diffusion through the crucible walls or flow through other openings. It may also be appropriate to actively adjust the gas pressure over a relatively narrow range during crystal growth to compensate for any changes in the spacing between the surface of the sublimating source material 1130 and the growing crystal surface.

In particular embodiments, a pressure of about 18 psi has been used to demonstrate growth rates of 0.9 mm/hr with a separation between the source material 1130 and the surface of the crystal 1120 of approximately 2 cm, employing tungsten crucibles fabricated by either chemical vapor deposition or powder metallurgy technique (such as those described in commonly assigned U.S. Pat. No. 6,719,843, the entirety of which is incorporated by reference herein). The source-to-growing-crystal-surface distance may vary during the growth run if the area of the growing crystal surface is different from the surface area of the source material 1130 and the growth rate (i.e., axial rate of movement of the crucible through the temperature gradient) may be adjusted to account for any such change. However, typically the surface area of the source material 1130 and growing crystal surface will be kept nominally constant and approximately the same size so that the separation between the source and growing crystal surface will remain substantially constant during most of the growth.

Finally, the movement of crucible 1105 is stopped (step 1360) and a cooling ramp (step 1365) is established to bring the apparatus and the crystal 1120 to room temperature. Using pressures in the range 100 kPa to 150 kPa (1 atm to 1.5 atm), single-crystal boules have been grown at an axial pushing rate ranging between about 0.4 and 0.9 mm/h, for example, at the rate of 0.455 mm/h By adjusting the distance between the source material and the growing crystal surface, and by adjusting the axial and radial temperature gradients, other useful growth conditions may be obtained. Hence, skilled practitioners may usefully use various embodiments of the present invention with total chamber pressures from 50 kPa to 1 MPa (0.5 atm to 10 atm) and axial pushing/growth rates of 0.3 to about 3 mm/h, or even higher.

By slicing or cutting the bulk single crystals of embodiments of the present invention, crystalline substrates, e.g., of AlN, of desired thickness—for example, about 500 μm or 350 μm—may be produced. These substrates may then be prepared, typically by polishing, for high-quality epitaxial growth of appropriate layers of AlN, GaN, InN and/or their binary and tertiary alloys to form electronic and optoelectronic devices such as UV laser diodes and high-efficiency UV LEDs. The aforementioned nitride layers may be described by the chemical formula $Al_xGa_yIn_{1-x-y}N$, where $0 \leq x \leq 1$ and $0 \leq y \leq 1-x$.

In various embodiments, the surface preparation of crystals including or consisting essentially of AlN enables high-quality epitaxial growth of nitride layers on the AlN substrate. Surface damage is preferably carefully removed in order to obtain high-quality epitaxial layers needed for fabrication of high performance nitride semiconductor devices. One successful approach to remove surface damage from the AlN substrate is to employ a chemical-mechanical polishing (CMP) approach, e.g. as described in U.S. Pat. No. 7,037,838 (the '838 patent), incorporated herein by reference in its entirety. Through this approach, very high-quality epitaxial layers of $Al_xGa_yIn_{1-x-y}N$ with low dislocation densities may be produced using organometallic vapor phase epitaxy (OMVPE), particularly when x exceeds 0.5. Those skilled in the art will recognize that other epitaxial growth techniques such as molecular beam epitaxy (MBE) or hydride vapor phase epitaxy (HVPE) may also be successfully employed to produce high-quality epitaxial layers on the high-quality semiconductor crystals produced in accordance with embodiments of the present invention.

The growth of bulk single crystals has been described herein primarily as being implemented by what is commonly referred to as a "sublimation" or "sublimation-recondensation" technique wherein the source vapor is produced at least in part when, for production of AlN, crystalline solids of AlN or other solids or liquids containing AlN, Al or N sublime preferentially. However, the source vapor may be achieved in whole or in part by the injection of source gases or like techniques that some would refer to as "high-temperature CVD." Also, other terms are sometimes used to describe these and other techniques that are used to grow bulk single AlN crystals according to this invention. Therefore, the terms "depositing," "depositing vapor species," and like terms will sometimes be used herein to generally cover those techniques by which the crystal may be grown pursuant to embodiments of this invention.

Thus, the single-crystal semiconductors fabricated using the embodiments described hereinabove may be used to produce substrates by cutting a wafer or cylinder from the bulk single-crystal, preparing a surface on the wafer or cylinder in a known manner to be receptive to an epitaxial layer, and depositing an epitaxial layer on the surface using conventional deposition techniques.

In particular embodiments of the invention, large, e.g. greater than about 25 mm in diameter, single-crystal AlN wafers are produced from single-crystal AlN boules having a diameter exceeding the diameter of the final substrate, e.g., boules having a diameter greater than about 30 mm Using this approach, after growing the boule and orienting it, e.g. by employing x-ray Laue diffraction technique, to obtain a desirable crystallographic orientation for the wafer, the boule is mechanically ground down to a cylinder having a desirable diameter and then sliced into individual wafers, e.g., using a wire saw. In some versions of these embodiments, the boules are grown by, first, producing high-quality single-crystal seeds, and then using the seed crystals as nuclei to grow larger diameter single-crystal boules through a crystal-expansion growth run. Large-diameter slices from this second crystal growth process may then be utilized to grow large-diameter crystals without diameter expansion. In alternative versions, the crystal growth is self-seeded, i.e. the crystal is grown without employing single-crystal seeds.

In various embodiments, high-purity source material 1130 including or consisting essentially of AlN may be produced in a crucible 1105 (or other suitable container) by reacting high-purity Al (e.g. having 99.999% purity, available from Alpha Aesar of Ward Hill, Mass., USA) with high-purity $N_2$ gas (e.g. having 99.999% purity, available from Awesco of Albany, N.Y., USA). In a particular embodiment, pieces of high-purity AlN ceramic, e.g. weighing about 9 g or less, are placed in a bottom portion of the crucible and heated to about 2300° C. in a forming gas atmosphere in order to sublime the AlN and recondense it. As a result, the density of the resulting ceramic may be increased to approximately theoretical density by sublimation transport to decrease the surface area relative to the volume of the source material. The resulting AlN ceramic source material 1130 may have impurity concentration of less than about 500 ppm.

In growth processes in accordance with various embodiments of the invention, the crucible 1105 loaded with the source material 1130 may be assembled and/or disposed in the heating apparatus, e.g. high-pressure crystal growth furnace available from Arthur D. Little, Inc. Specifically, the crucible 1105 may be placed on crucible stand 1110 within the susceptor 1115. Both top thermal shields 1150 and bottom thermal shields 1155 may then be installed around the crucible 1105 with the susceptor 1115 around the crucible 1105 and thermal shields. The crucible 1105 is preferably positioned such that the lid 1170 and/or seed crystal 1135 is either below or above the location of the large axial thermal gradient formed by the thermal shields. In the first case (i.e. below the large axial gradient) the seed crystal 1135 is initially maintained at a higher temperature than the source material 1130 so that little or no nucleation occurs during a warm-up. If the seed crystal 1135 is above the large axial gradient the initial nucleation is generally controlled by modification of the temperature ramp-up profile.

The growth chamber is then closed and evacuated, as described above, to reduce trace atmosphere contamination of the nucleation process and the resulting single crystal. In various embodiments, following evacuation, e.g., to less than about 1 Pa employing a mechanical Welch pump with minimum pressure of about ~0.5 Pa, the chamber is filled with a forming gas blend of 3% $H_2$ and 97% $N_2$ to a pressure of about 100 kPa and then evacuated again to less than 10 mTorr. This refill and pump process may be carried out three times or more to reduce chamber contamination. Following the pump and refill processes, the chamber is filled with the forming gas to a pressure of, e.g., 117 kPa. High-purity grade gas, e.g., available from GTS-WELCO (99.999% certified), may be used to further ensure a clean growth chamber atmosphere.

During a ramp to the growth temperature, the pressure in the chamber increases until the target growth pressure of, e.g., 124 kPa is reached. After reaching the operating pressure, the chamber pressure may be periodically checked and incrementally adjusted by releasing gas from the chamber to a vent line in order to keep the chamber pressure between, e.g., 124 kPa and 125 kPa.

In some embodiments, the power supply for operating the growth apparatus 1100 is an RF oscillator with a maximum power output of 75 kW at 10 kHz. The growth temperature inside the heating apparatus may be increased in two ramp segments. For example, the first segment of the ramp may be linear for about 1.5 hours taking the top axial optical pyrometer temperature to about 1800° C. The second ramp segment may then be linear for approximately 3.5 hours taking the top axial temperature to about 2050° C. The chamber may then be maintained at growth temperature and pressure for a period of about 1 hour. Then, the crucible 1105 may be moved up by the drive apparatus at a rate of, for example, approximately 0.5 mm/hr. During the growth run, this push rate is held constant, such that the total travel is about 30 mm, producing a single-crystal AlN boule that reached about 35 mm in length and about 50 mm in diameter. Shorter or longer crystals may be produced by varying the travel distance (which is directly related to the push time). The cool-down from growth temperature can be done linearly for the period of time between approximately 1 and approximately 24 hours. Once the apparatus is at room temperature, the chamber may be pumped to less than 1 Pa and backfilled to atmospheric pressure with the forming gas, allowing the chamber to be opened and the growth crucible assembly removed from the heating apparatus for evaluation. The growth chamber may then be closed and evacuated as described above to reduce trace atmosphere contamination of the growth cell, nucleation process and resulting AlN single crystal.

In particular embodiments, following pump-down to less than 7 mPa, e.g., using a turbo pump with a minimum pressure of about 0.4 mPa, the chamber is filled with a forming gas blend of 3% $H_2$ and 97% $N_2$ to a pressure of about 122 kPa. Following the pump and refill process, the chamber is filled with the forming gas for the start of the growth process to a pressure of 117 kPa. As described above, a high-purity grade gas available from GTS-WELCO (99.999% certified) may be used to further ensure a clean growth chamber atmosphere.

During a ramp to the growth temperature, the pressure in the chamber increases until the target growth pressure is reached. After reaching the operating pressure, the chamber pressure may be periodically checked and incrementally adjusted by releasing gas from the chamber to a vent line in order to keep the chamber pressure between, e.g., 124 kPa and 125 kPa.

The growth temperature inside the heating apparatus and crucible may be increased in two segments. For example, in the first segment, the temperature is linearly increased from the room temperature to about 1800° C. in 1.5 hours. Then, the second ramp segment to the final growth temperature determined by the optical pyrometer, e.g. for 3.5 hours, may be initiated after operator inspection.

The chamber is then maintained at the growth temperature and pressure for a period of, for example, 1 hour. The drive apparatus 1160 then pushes the crucible 1105 up at a rate ranging from about 0.2 to 1.0 mm/hr, for example, at approximately 0.5 mm/hr. In a particular version, during the growth run, this push rate is held constant and the total travel is about 30 mm, producing a single crystal AlN boule that reached about 50 mm in diameter and 35 mm in length. Shorter or longer crystals may be produced by varying the distance the crucible 1105 is pushed or equivalently by varying the push time.

Following completion of the vertical travel, the vertical motion of the crucible 1105 is stopped and the pressure is increased to 157 kPa by adding more high-purity forming gas. The power to the heating apparatus is then linearly reduced to zero, for example, in 6 hours and the system is allowed to cool to room temperature. Following the cool down, the chamber is pumped to, e.g., less than about 1 mPa and backfilled to atmospheric pressure with forming gas. The chamber is then opened and the growth crucible 1105 removed for evaluation.

In various embodiments, after orienting the resulting single-crystal boule, e.g., by employing the x-ray Laue diffraction technique, the boule is encased in epoxy, e.g. VALTRON available from Valtech, and then ground down to a 25-mm diameter cylinder having its longitudinal axis oriented along the desired crystallographic direction. Once the oriented cylinder is produced, it is once again examined by the x-ray Laue diffraction technique to determine precise orientation (within +/−0.2°) and then sliced with a wire saw, e.g. the Model DT480 saw, for example, the one available from Diamond Wire Technologies, into a wafer. Those skilled in the art of semiconductor wafer preparation will readily recognize that there are many alternatives for slicing the crystal using diamond-coated ID and OD saws. The surface of the wafer is then prepared for epitaxial growth utilizing, for example, one or more techniques described in the '838 patent.

Seeded Growth Using Polished Semiconductor Wafers

In some embodiments, a piece of semiconductor material (e.g., including or consisting essentially of AlN) having a known crystallographic orientation is used as a seed from which bulk material may then be grown. In a particular embodiment, a polished AlN wafer sliced from a bulk crystal is employed as a seed, offering a number of benefits, including standardization and improved control over the growth direction.

In order to grow high-quality crystals, very high temperatures, for example exceeding 2100° C., are generally desirable. At the same time, as discussed above, high axial thermal gradients are needed to provide sufficient mass transport from the source material to the seed crystal. Additionally, non-zero radial thermal gradients, resulting in thermal gradient ratios less than 10 as detailed above, are preferably utilized to enable growth of larger crystals at faster rates while maintaining high crystalline quality. However, if not chosen properly, these growth conditions may result in evaporation of seed material or its total destruction and loss.

Preferably, the mounting technique employed in these embodiments to secure AlN seeds entails:

(1) employing a seed holder and/or adhesive compound that is sufficiently strong to secure the seed and the crystal being grown;

(2) protecting the opposite side of the seed during growth to avoid re-evaporation of the AlN, as this may result in formation of planar and/or extended void defects; and (3) avoiding contamination of the crystal and the crucible by the material chosen to protect the opposite side of the seed or as the adhesive.

In some embodiments, AlN seeded bulk-crystal growth is carried out in the crucible 1105 using a high-purity AlN source 1130. In some embodiments, the apparatus 1100 for growth of single-crystal AlN boules includes a crucible 1105 such as the one disclosed in U.S. Pat. No. 6,719,842 (the '842 patent), incorporated herein by reference in its entirety, consisting essentially of tungsten and fabricated by a CVD process. Multiple grain layers within the wall of the crucible may be obtained by interrupting the tungsten deposition several times before the final wall thickness is obtained. Other crucible materials may be used, such as tungsten-rhenium (W—Re) alloys; rhenium (Re); tantalum monocarbide (TaC); a mixture of $Ta_2C$ and TaC; a mixture of $Ta_2C$, TaC and Ta; tantalum nitride ($Ta_2N$); a mixture of Ta and $Ta_2N$; hafnium nitride (HfN); a mixture of Hf and HfN; a mixture of tungsten and tantalum (W—Ta); tungsten (W); and combinations thereof. The apparatus preferably houses an AlN source material 1130, for example, consisting essentially of high-purity AlN polycrystalline ceramic.

The tungsten crucible is placed into an inductively heated furnace, as described above, so that the temperature gradient between the source 1130 and the seed crystal 1135 drives vapor 1125 to move from the hotter high purity AlN ceramic source to the cooler seed crystal. The temperature at the seed interface and the temperature gradients are monitored and carefully adjusted, if necessary, in order to nucleate high-quality mono-crystalline material on the seed and not destroy the AlN seed. Skilled artisans will also readily recognize that while various embodiments of the present invention have been described herein as utilizing a seed crystal to promote crystal growth, the teachings herein may also be used for unseeded crystal growth, without departing from the scope and spirit of the present invention.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method for growing single-crystal aluminum nitride (AlN), the method comprising:
   mounting an AlN seed on a seed holder, thereby forming a seed-seed holder assembly;

disposing the seed-seed holder assembly within a crystal-growth crucible;

heating the crystal-growth crucible to apply thereto (i) a radial thermal gradient of less than 50° C./cm and (ii) a vertical thermal gradient greater than 1° C./cm and less than 50° C./cm; and depositing aluminum and nitrogen onto the AlN seed under conditions suitable for growing single-crystal AlN originating at the AlN seed.

2. The method of claim 1, further comprising disposing AlN source material within the crystal-growth crucible, the deposited aluminum and nitrogen evolving from the AlN source material during heating of the crystal-growth crucible.

3. The method of claim 2, wherein the AlN source material is polycrystalline.

4. The method of claim 1, wherein the seed-seed holder assembly is affixed to a lid of the crystal-growth crucible.

5. The method of claim 1, wherein mounting the AlN seed on the seed holder comprises disposing a foil between the AlN seed and the seed holder.

6. The method of claim 5, wherein the foil is substantially impervious to aluminum transport.

7. The method of claim 6, wherein the foil is substantially impervious to nitrogen.

8. The method of claim 5, wherein the foil is substantially impervious to nitrogen.

9. The method of claim 5, wherein the foil comprises tungsten.

10. The method of claim 5, wherein the foil is single-crystalline tungsten.

11. The method of claim 5, wherein the foil comprises aluminum.

12. The method of claim 1, wherein the seed holder is substantially impervious to aluminum transport.

13. The method of claim 1, further comprising disposing a barrier layer over at least a portion of a surface of the AlN seed.

14. The method of claim 13, wherein the barrier layer comprises at least one of tungsten, Hf, HfN, HfC, W—Re, W—Mo, BN, Ta, TaC, TaN, Ta$_2$N, or carbon.

15. The method of claim 13, wherein the barrier layer consists essentially of tungsten.

16. The method of claim 1, wherein the AlN seed is a wafer having a diameter of at least 20 mm.

17. The method of claim 1, wherein the grown single-crystal AlN has a diameter greater than 20 mm, a thickness greater than 0.1 mm, and an areal planar defect density $\leq 100$ cm$^{-2}$.

18. The method of claim 17, wherein the areal planar defect density is $\leq 1$ cm$^{-2}$.

19. The method of claim 1, further comprising minimizing or substantially eliminating any gap between the AlN seed and the seed holder by positioning a weight on the seed-seed holder assembly.

20. The method of claim 19, wherein the weight is positioned on the AlN seed.

21. The method of claim 19, wherein the weight comprises tungsten.

22. The method of claim 19, further comprising removing the weight from the seed-seed holder assembly prior to depositing aluminum and nitrogen onto the AlN seed.

23. The method of claim 1, wherein a ratio of the vertical thermal gradient to the radial thermal gradient is less than 10.

24. The method of claim 1, wherein a ratio of the vertical thermal gradient to the radial thermal gradient is less than 5.5.

25. The method of claim 1, wherein a ratio of the vertical thermal gradient to the radial thermal gradient is less than 3.

26. The method of claim 1, wherein a ratio of the vertical thermal gradient to the radial thermal gradient is greater than 1.2.

27. The method of claim 1, wherein the radial thermal gradient is larger than 4° C./cm.

28. The method of claim 1, wherein the vertical thermal gradient is larger than 5° C./cm.

29. The method of claim 1, wherein applying the radial thermal gradient comprises arranging a plurality of thermal shields outside the crystal-growth crucible.

30. The method of claim 29, wherein each of the thermal shields comprises a refractory material.

31. The method of claim 29, wherein each of the thermal shields comprises tungsten.

32. The method of claim 29, wherein each thermal shield defines an opening therethrough.

33. The method of claim 32, wherein the openings of the thermal shields are substantially equal in size to each other.

34. The method of claim 32, wherein the opening of each thermal shield ranges from approximately 10 mm to approximately 2 mm less than a dimension of the growth chamber substantially perpendicular to a growth direction along which the single-crystal AlN grows.

35. The method of claim 32, wherein the openings of at least two of the thermal shields are different in size.

36. The method of claim 32, wherein a first thermal shield having a first opening is disposed between the crucible and a second thermal shield, the second thermal shield having a second opening larger than the first opening.

37. The method of claim 29, wherein at least two of the thermal shields have different thicknesses.

38. The method of claim 29, wherein a thickness of each of the thermal shields ranges from approximately 0.125 mm to approximately 0.5 mm.

39. The method of claim 29, wherein the thermal shields are arranged with substantially equal spacings therebetween.

40. The method of claim 29, wherein spacings between at least two pairs of the thermal shields are different.

* * * * *